US012622166B2

(12) United States Patent
Rosenow et al.

(10) Patent No.: US 12,622,166 B2
(45) Date of Patent: May 5, 2026

(54) ORGANIC ELECTRONIC DEVICE COMPRISING AN ANODE LAYER, A CATHODE LAYER, AT LEAST ONE EMISSION LAYER (EML) AND AT LEAST ONE HOLE INJECTION LAYER (HIL)

(71) Applicant: Novaled GmbH, Dresden (DE)

(72) Inventors: Thomas Rosenow, Dresden (DE); Vygintas Jankus, Dresden (DE); Markus Hummert, Dresden (DE); Moo Jin Park, Dresden (DE); Vladimir Uvarov, Dresden (DE); Annette Steudel, Dresden (DE)

(73) Assignee: Novaled GmbH, Dresden (DE)

(*) Notice: Subject to any disclaimer, the term of this patent is extended or adjusted under 35 U.S.C. 154(b) by 951 days.

(21) Appl. No.: 17/795,919

(22) PCT Filed: Jan. 27, 2021

(86) PCT No.: PCT/EP2021/051885
§ 371 (c)(1),
(2) Date: Jul. 28, 2022

(87) PCT Pub. No.: WO2021/151959
PCT Pub. Date: Aug. 5, 2021

(65) Prior Publication Data

US 2023/0126203 A1 Apr. 27, 2023

(30) Foreign Application Priority Data

Jan. 28, 2020 (EP) .................................... 20154092

(51) Int. Cl.
*H01L 51/50* (2006.01)
*H10K 50/11* (2023.01)
(Continued)

(52) U.S. Cl.
CPC ........... *H10K 85/341* (2023.02); *H10K 50/11* (2023.02); *H10K 85/371* (2023.02); *H10K 50/17* (2023.02);
(Continued)

(58) Field of Classification Search
None
See application file for complete search history.

(56) References Cited

U.S. PATENT DOCUMENTS

2016/0336519 A1* 11/2016 Seo ...................... H10K 50/166
2018/0240995 A1* 8/2018 Hummert ............... H10K 50/17
2019/0198789 A1 6/2019 Kim et al.

FOREIGN PATENT DOCUMENTS

DE 102017111425 A1 11/2018
EP 3133663 A1 2/2017
(Continued)

OTHER PUBLICATIONS

International Search Report and Written Opinion issued in international application No. PCT/EP2021/051885, mailed Apr. 14, 2021, 9 pages.

(Continued)

*Primary Examiner* — Gregory D Clark
(74) *Attorney, Agent, or Firm* — Eversheds Sutherland (US) LLP

(57) ABSTRACT

The present invention relates to an organic electronic device comprising an anode layer, a cathode layer, at least one emission layer (EML) and at least one hole injection layer (HIL), wherein the hole injection layer is arranged between the anode layer and the at least one emission layer.

30 Claims, 2 Drawing Sheets

(51) Int. Cl.
*H10K 85/30* (2023.01)
*H10K 50/17* (2023.01)
*H10K 101/30* (2023.01)
*H10K 101/40* (2023.01)

(52) U.S. Cl.
CPC ..... *H10K 2101/30* (2023.02); *H10K 2101/40* (2023.02)

(56) References Cited

FOREIGN PATENT DOCUMENTS

| | | | |
|---|---|---|---|
| EP | 3133664 | A1 | 2/2017 |
| EP | 3591725 | A1 | 1/2020 |
| JP | 2014096572 | A | 5/2014 |

OTHER PUBLICATIONS

International Preliminary Report on Patentability issued in international application No. PCT/EP2021/051885, dated Jul. 28, 2022, 6 pages.
Chang, C.-H. et al., Aligned energy-level design for decreasing operation voltage of tandem white organic light-emitting diodes, Thin Solid Films 548 (2013) 389-397.
Sun, S.-S. et al., Introduction to Organic Electronic and Optoelectronic Materials and Devices, Taylor & Francis Group (2017), 367.

* cited by examiner

ORGANIC ELECTRONIC DEVICE COMPRISING AN ANODE LAYER, A CATHODE LAYER, AT LEAST ONE EMISSION LAYER (EML) AND AT LEAST ONE HOLE INJECTION LAYER (HIL)

CROSS REFERENCE TO RELATED APPLICATIONS

This application is a U.S. national phase application of PCT/EP2021/051885, filed Jan. 27, 2021, which claims priority to European Patent Application No. 20154092.9, filed Jan. 28, 2020. The content of these applications is incorporated herein by reference.

TECHNICAL FIELD

The present invention relates to an organic electronic device containing an anode layer, a cathode layer, at least one emission layer (EML) and at least one hole injection layer (HIL), wherein the hole injection layer comprises an organic matrix compound.

BACKGROUND ART

Organic electronic devices, such as organic light-emitting diodes OLEDs, which are self-emitting devices, have a wide viewing angle, excellent contrast, quick response, high brightness, excellent operating voltage characteristics, and color reproduction. A typical OLED comprises an anode layer, a hole injection layer HIL, a hole transport layer HTL, an emission layer EML, an electron transport layer ETL, and a cathode layer, which are sequentially stacked on a substrate. In this regard, the HIL, the HTL, the EML, and the ETL are thin films formed from organic compounds.

When a voltage is applied to the anode and the cathode, holes injected from the anode move to the EML, via the HIL and HTL, and electrons injected from the cathode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has low operating voltage, excellent efficiency and/or a long lifetime.

Performance of an organic light emitting diode may be affected by characteristics of the hole injection layer, and among them, may be affected by characteristics of the organic matrix compound and the metal complexes which are contained in the hole injection layer.

WO2017029370 relates to metal amides of general Formula Ia and for their use as hole injection layer (HIL) for an Organic light-emitting diode (OLED), and a method of manufacturing Organic light-emitting diode (OLED) comprising an hole injection layer containing a metal amide of general Formula Ia. In WO2017029370 is disclosed hole transport layer which may comprises in addition a triarylamine compound having the Formula VIIa:

(VIIa)

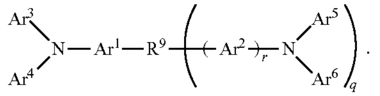

The emission layer (EML) may be formed of a combination of a host and a dopant.

WO2017029366 relates to a hole injection layer for an OLED comprising a triarylamine compound doped with a charge neutral metal amide compound, characterized in that the hole injection layer has a thickness of at least about ≥20 nm to about ≤1000 nm and the charge neutral metal amide compound has the Formula Ia. In WO2017029366 is disclosed a hole injection layer (HIL) comprises a triarylamine compound having the Formula VIIa:

(VIIa)

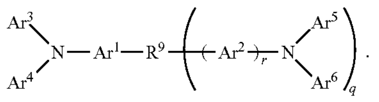

The emission layer (EML) may be formed of a combination of a host and a dopant.

WO2017102861 relates to an organic electronic component (10) comprising at least one organic layer (3), which has a fluorinated sulphonamide metal salt of the following formula 1: (1) wherein M is either a bivalent or higher-order metal having an atomic mass of greater than 26 g/mol or a monovalent metal having an atomic mass of greater than or equal to 39 g/mol, wherein 1≤n≤7, and wherein R1, R2 are selected independently of each other and from a group comprising a fluoride-substituted aryl radical, a fluoride-substituted alkyl radical, and a fluoride-substituted arylalkyl radical. The matrix material is a hole-transport material. The organic electronic component comprises a light-emitting layer.

US2016336519A1 provides a novel light-emitting element, a light-emitting element with a long lifetime, or a light-emitting element with high emission efficiency. The light-emitting element includes an EL layer between a pair of electrodes. The EL layer includes at least a light-emitting layer containing a fluorescent substance and a host material, a first electron-transport layer containing a first electron-transport material, and a second electron-transport layer containing a second electron-transport material, which are in contact with each other and in this order. The LUMO level of each of the host material and the second electron-transport material is higher than the LUMO level of the first electron-transport material.

US2019198789A1 discloses an organic light emitting diode and an organic light emitting display including the same, where the organic light emitting diode includes: a first electrode; a light emitting stack disposed on the first electrode; and a second electrode disposed on the light emitting stack, where the light emitting stack includes a hole transport layer and a blue light emitting layer such that the hole transport layer and the blue light emitting layer are sequentially stacked on the first electrode, where the blue light emitting layer includes a blue host material and a blue fluorescent dopant material, and the hole transport layer includes a hole transport layer material. The blue fluorescent dopant material has a higher LUMO energy level than the blue host material and the blue fluorescent dopant material has a higher HOMO energy level than the blue host material.

There remains a need to improve performance of organic electronic devices by providing hole injection layers with improved hole injection into the at least one emission layer, in particular to achieve improved operating voltage through improving the characteristics of the hole injection layer and the organic electronic device.

It is a further objective to provide a hole injection layer comprising compounds which can be deposited through vacuum thermal evaporation under conditions suitable for mass production.

Disclosure

An aspect of the present invention provides an organic electronic device comprising an anode layer, a cathode layer, at least one emission layer (EML) and at least one hole injection layer (HIL), wherein the hole injection layer is arranged between the anode layer and the at least one emission layer; wherein the hole injection layer comprises an organic matrix compound (OMC) and a metal complex, wherein the metal complex has the Formula (II):

$$M^{n\oplus}(L^{\ominus})_n \quad \text{(II)},$$

wherein

M is a metal ion, n is the valency of M, wherein n is an integer from 1 to 4

L is a ligand; and the at least one emission layer comprises at least one emitter matrix compound (EMC), wherein the HOMO level of the emitter matrix compound (EMC) and the HOMO level of the organic matrix compound (OMC) fulfills the following equation:

$$-0.24\text{ eV}<[\text{HOMO level (EMC)}-\text{HOMO level (OMC)}]\leq 0.8\text{ eV}.$$

The term "HOMO level" is understood to mean the highest occupied molecular orbital and is determined in eV (electron Volt).

According to one embodiment the organic electronic device comprises an anode layer, a cathode layer, at least one emission layer (EML) and at least one hole injection layer (HIL), wherein the hole injection layer is arranged between the anode layer and the at least one emission layer; wherein the hole injection layer comprises an organic matrix compound (OMC) and a metal complex, wherein the metal complex has the Formula (II):

$$M^{n\oplus}(L^{\ominus})_n \quad \text{(II)},$$

wherein

M is a metal ion, wherein M is not Mo, n is the valency of M, wherein n is an integer from 1 to 4

L is a ligand; and the at least one emission layer comprises at least one emitter matrix compound (EMC), wherein the HOMO level of the emitter matrix compound (EMC) and the HOMO level of the organic matrix compound (OMC) fulfills the following equation:

$$-0.24\text{ eV}<[\text{HOMO level (EMC)}-\text{HOMO level (OMC)}]\leq 0.8\text{ eV}.$$

According to one embodiment the organic electronic device comprises an anode layer, a cathode layer, at least one emission layer (EML) and at least one hole injection layer (HIL), wherein the hole injection layer is arranged between the anode layer and the at least one emission layer; wherein the hole injection layer comprises an organic matrix compound (OMC) and a metal complex, wherein the metal complex has the Formula (II):

$$M^{n\oplus}(L^{\ominus})_n \quad \text{(II)},$$

wherein

M is a metal ion, wherein M is not Mo, Ir and Pt, n is the valency of M, wherein n is an integer from 1 to 4

L is a ligand; and the at least one emission layer comprises at least one emitter matrix compound (EMC), wherein the HOMO level of the emitter matrix compound (EMC) and the HOMO level of the organic matrix compound (OMC) fulfills the following equation:

$$-0.24\text{ eV}<[\text{HOMO level (EMC)}-\text{HOMO level (OMC)}]\leq 0.8\text{ eV}.$$

According to one embodiment the organic electronic device comprises an anode layer, a cathode layer, at least one emission layer (EML) and at least one hole injection layer (HIL), wherein the hole injection layer is arranged between the anode layer and the at least one emission layer; wherein the hole injection layer comprises an organic matrix compound (OMC) and a metal complex, wherein the metal complex has the Formula (II):

$$M^{n\oplus}(L^{\ominus})_n \quad \text{(II)},$$

wherein

M is a metal ion, wherein M is not Mo, n is the valency of M, wherein n is an integer from 1 to 4

L is a ligand; and the at least one emission layer comprises at least one emitter matrix compound (EMC), wherein the HOMO level of the emitter matrix compound (EMC) and the HOMO level of the organic matrix compound (OMC) fulfills the following equation:

$$-0.24\text{ eV}<[\text{HOMO level (EMC)}-\text{HOMO level (OMC)}]\leq 0.8\text{ eV}.$$

wherein metal phthalocyanine metal complexes, in particular copper phthalocyanine metal complexes (also named CuPc) are excluded and/or optionally the ligand L has one negative charge.

According to one embodiment the organic electronic device comprises an anode layer, a cathode layer, at least one emission layer (EML) and at least one hole injection layer (HIL), wherein the hole injection layer is arranged between the anode layer and the at least one emission layer; wherein the hole injection layer comprises an organic matrix compound (OMC) and a metal complex, wherein the metal complex has the Formula (II):

$$M^{n\oplus}(L^{\ominus})_n \quad \text{(II)},$$

wherein

M is a metal ion, wherein M is not Mo, Ir and Pt, n is the valency of M, wherein n is an integer from 1 to 4, L is a ligand; and the at least one emission layer comprises at least one emitter matrix compound (EMC), wherein the HOMO level of the emitter matrix compound (EMC) and the HOMO level of the organic matrix compound (OMC) fulfills the following equation:

$$-0.24\text{ eV}<[\text{HOMO level (EMC)}-\text{HOMO level (OMC)}]\leq 0.8\text{ eV; and}$$

wherein metal phthalocyanine metal complexes, in particular copper phthalocyanine metal complexes (also named CuPc) are excluded and/or optionally the ligand L has one negative charge.

According to one embodiment the organic electronic device comprises an anode layer, a cathode layer, at least one emission layer (EML) and at least one hole injection layer (HIL), wherein the hole injection layer is arranged between the anode layer and the at least one emission layer; wherein the hole injection layer comprises an organic matrix compound (OMC) and a metal complex, wherein the metal complex has the Formula (II):

$$M^{n\oplus}(L^{\ominus})_n \quad \text{(II)},$$

wherein

M is a metal ion, wherein M is not Mo and Cu, n is the valency of M, wherein n is an integer from 1 to 4, L is a ligand; and the at least one emission layer comprises at least one emitter matrix compound (EMC), wherein the HOMO level of the emitter matrix compound (EMC) and the HOMO level of the organic matrix compound (OMC) fulfills the following equation:

$$-0.24\ \text{eV}<[\text{HOMO level (EMC)}-\text{HOMO level (OMC)}]\leq 0.8\ \text{eV},$$ and optionally the ligand L has one negative charge.

According to one embodiment the organic electronic device comprises an anode layer, a cathode layer, at least one emission layer (EML) and at least one hole injection layer (HIL), wherein the hole injection layer is arranged between the anode layer and the at least one emission layer; wherein the hole injection layer comprises an organic matrix compound (OMC) and a metal complex, wherein the metal complex has the Formula (II):

$$M^{n\oplus}(L^{\ominus})_n \qquad \text{(II)},$$

wherein

M is a metal ion, wherein M is not Mo, Cu, Ir and Pt, n is the valency of M, wherein n is an integer from 1 to 4, L is a ligand; and the at least one emission layer comprises at least one emitter matrix compound (EMC), wherein the HOMO level of the emitter matrix compound (EMC) and the HOMO level of the organic matrix compound (OMC) fulfills the following equation:

$$-0.24\ \text{eV}<[\text{HOMO level (EMC)}-\text{HOMO level (OMC)}]\leq 0.8\ \text{eV},$$ and optionally the ligand L has one negative charge.

According to one embodiment the organic electronic device comprises an anode layer, a cathode layer, at least one emission layer (EML) and at least one hole injection layer (HIL), wherein the hole injection layer is arranged between the anode layer and the at least one emission layer; wherein the hole injection layer comprises an organic matrix compound (OMC) and a metal complex, wherein the metal complex has the Formula (II):

$$M^{n\oplus}(L^{\ominus})_n \qquad \text{(II)},$$

wherein

M is a metal ion, n is the valency of M, wherein n is an integer from 1 to 4

L is a ligand; and the at least one emission layer comprises at least one emitter matrix compound (EMC), wherein the HOMO level of the emitter matrix compound (EMC) and the HOMO level of the organic matrix compound (OMC) fulfills the following equation:

$$-0.24\ \text{eV}<[\text{HOMO level (EMC)}-\text{HOMO level (OMC)}]\leq 0.8\ \text{eV}.$$

The term "HOMO level" is understood to mean the highest occupied molecular orbital and is determined in eV (electron Volt);

the ligand L of Formula (II), also named L, may be selected from a group comprising:

at least three carbon atoms, alternatively at least four carbon atoms, and/or at least two oxygen atoms or one oxygen and one nitrogen atom, two to four oxygen atoms, two to four oxygen atoms and zero to two nitrogen atoms, and/or at least one or more groups selected from halogen, F, CN, substituted or unsubstituted $C_1$ to $C_6$ alkyl, substituted or unsubstituted $C_1$ to $C_6$ alkoxy, alternatively two or more groups selected from halogen, F, CN, substituted or unsubstituted $C_1$ to $C_6$ alkyl, substituted or unsubstituted $C_1$ to $C_6$ alkoxy, at least one or more groups selected from halogen, F, CN, substituted $C_1$ to $C_6$ alkyl, substituted $C_1$ to $C_6$ alkoxy, alternatively two or more groups selected from halogen, F, CN, perfluorinated $C_1$ to $C_6$ alkyl, perfluorinated $C_1$ to $C_6$ alkoxy, one or more groups selected from substituted or unsubstituted $C_1$ to $C_6$ alkyl, substituted or unsubstituted $C_6$ to $C_{12}$ aryl, and/or substituted or unsubstituted $C_3$ to $C_{12}$ heteroaryl, wherein the substituents are selected from D, $C_6$ aryl, $C_3$ to $C_9$ heteroaryl, $C_1$ to $C_6$ alkyl, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkyl, partially or perdeuterated $C_1$ to $C_6$ alkoxy, $COR^6$, $COOR^6$, halogen, F or CN;

wherein $R^6$ may be selected from $C_6$ aryl, $C_3$ to $C_9$ heteroaryl, $C_1$ to $C_6$ alkyl, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkyl, partially or perdeuterated $C_1$ to $C_6$ alkoxy; and optionally ligand L may be free of sulfur atoms.

The term "HOMO level further away from vacuum level" is understood to mean that the absolute value of the HOMO level is higher than the absolute value of the HOMO level of the reference compound. For example, the term "further away from vacuum level than the HOMO level of N4,N4'''-di(naphthalen-1-yl)-N4,N4'''-diphenyl-[1,1':4',1'':4'',1'''-quaterphenyl]-4,4'''-diamine" is understood to mean that the absolute value of the HOMO level of the organic matrix compound (OMC) is higher than the HOMO level of N4,N4'''-di(naphthalen-1-yl)-N4,N4'''-diphenyl-[1,1':4',1'':4'',1''-quaterphenyl]-4,4'''-diamine.

The term "absolute value" is understood to mean the value without the "-" symbol. Preferably, the HOMO level of the emitter matrix compound (EMC) and the HOMO level of the organic matrix compound (OMC) fulfills the following equation:

$$-0.2\ \text{eV}<[\text{HOMO level (EMC)}-\text{HOMO level (OMC)}]\leq 0.7\ \text{eV},$$

alternatively $-0.1$ eV<[HOMO level (EMC)−HOMO level (OMC)]≤0.7 eV, alternatively $-0.05$ eV<[HOMO level (EMC)−HOMO level (OMC)]≤0.6 eV, alternatively $-0.05$ eV<[HOMO level (EMC)−HOMO level (OMC)]≤0.55 eV.

According to one embodiment of the present invention, the HOMO level of the organic matrix compound (OMC) and HOMO level of the emitter matrix compound (EMC) may be calculated by quantum mechanical methods.

According to one embodiment of the present invention, the HOMO level of the organic matrix compound (OMC) and HOMO level of the emitter matrix compound (EMC) may be calculated with the program package TURBOMOLE V6.5, available from TURBOMOLE GmbH, Litzenhardtstras se 19, 76135 Karlsruhe, Germany.

If the HOMO level is calculated by this method, organic matrix compounds in the prior art have the following HOMO levels. For comparison, HOMO levels calculated from redox potential are also provided.

| Name | Structure | HOMO level based on redox potential (eV) disclosed in WO2017029370 | HOMO level calculated with TURBOMOLE V6.5 (eV) |
|---|---|---|---|
| N,N,N',N'-Tetrakis(4-methylphenyl)-benzidine (T-1) | 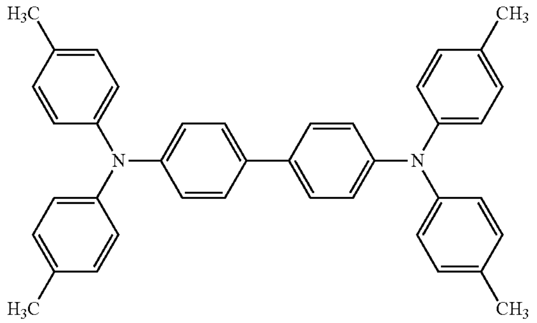 [SMILES: Cc1ccc(N(c2ccc(C)cc2)c2ccc(-c3ccc(N(c4ccc(C)cc4)c4ccc(C)cc4)cc3)cc2)cc1] | −4.99 | — |
| N4,N4,N4',N4'-tetra(biphenyl-4-yl)biphenyl-4,4'-diamine (T-2) | 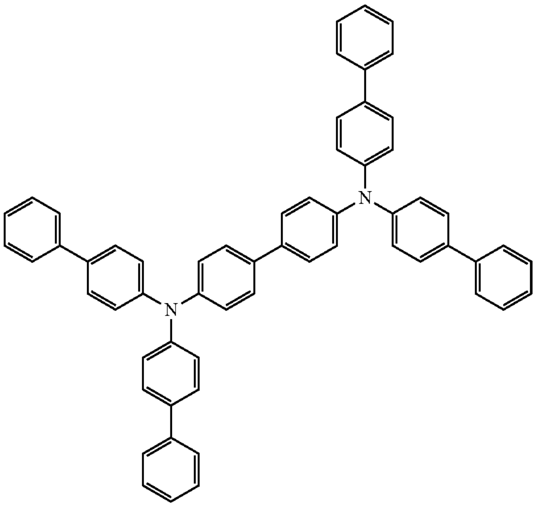 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] | −5.08 | −4.73 |
| Biphenyl-4-yl(9,9-diphenyl-9H-fluoren-2-yl)-[4-(9-phenyl-9H-carbazol-3-yl)phenyl]-amine (T-3) | 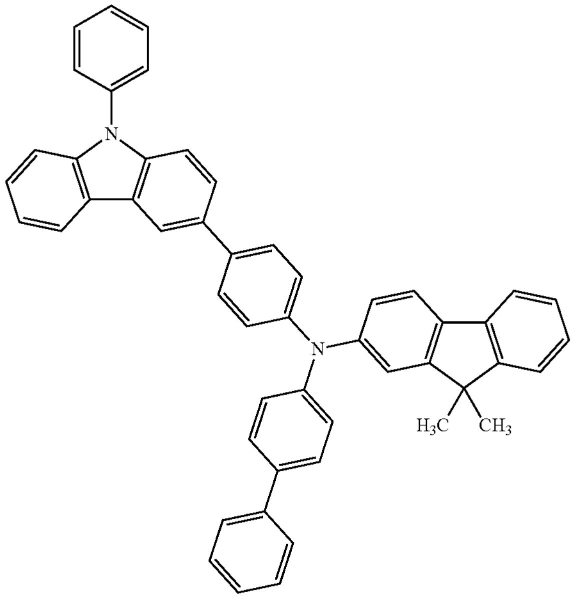 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21] | −5.10 | −4.69 |

-continued

| Name | Structure | HOMO level based on redox potential (eV) disclosed in WO2017029370 | HOMO level calculated with TURBOMOLE V6.5 (eV) |
|---|---|---|---|
| N,N'-Bis(naphthalen-1-yl)-N,N'-bis(phenyl)-benzidine (T-4) | 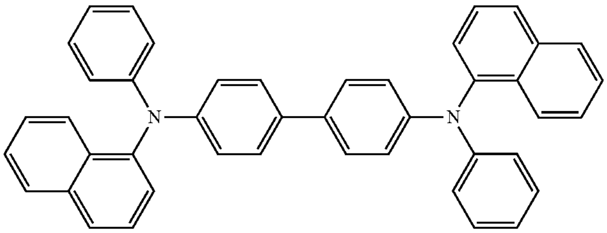 [SMILES: c1ccc(N(c2ccc(-c3ccc(N(c4ccccc4)c4cccc5ccccc45)cc3)cc2)c2cccc3ccccc23)cc1] | −5.11 | −4.72 |
| N1,N3-di([1,1'-biphenyl]-4-yl)-5-(9,9-dimethyl-9H-fluoren-2-yl)-N1,N3-bis(3,5-dimethylphenyl) benzene-1,3-diamine (T-5) | 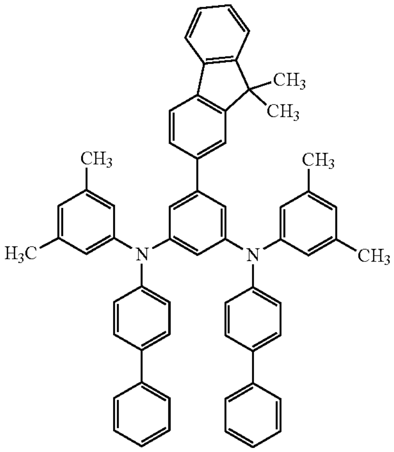 | −5.18 | −4.79 |
| N1,N3-di([1,1'-biphenyl]-4-yl)-5-(9,9-dimethyl-9H-fluoren-2-yl)-N1,N3-dimesitylbenzene- 1,3-diamine (T-6) | 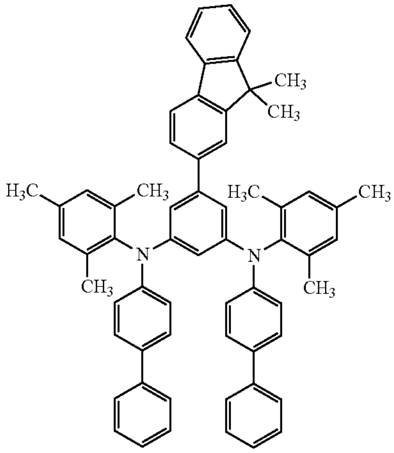 | −5.22 | −4.68 |
| N,N'-((9H-fluorene-9,9-diyl)bis(4,1-phenylene))bis(N-([1,1'-biphenyl]-4-yl)-[1,1'-biphenyl]-4-amine) (T-7) | 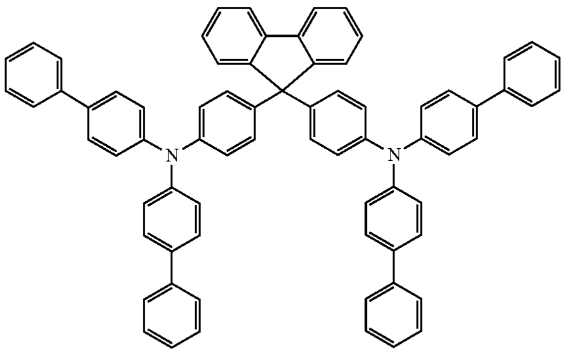 [SMILES: c1ccc(-c2ccc(N(c3ccc(-c4ccccc4)cc3)c3ccc(C4(c5ccc(N(c6ccc(-c7ccccc7)cc6)c6ccc(-c7ccccc7)cc6)cc5)c5ccccc5-c5ccccc54)cc3)cc2)cc1] | −5.24 | −4.86 |

-continued

| Name | Structure | HOMO level based on redox potential (eV) disclosed in WO2017029370 | HOMO level calculated with TURBOMOLE V6.5 (eV) |
|---|---|---|---|
| N4,N4''-di(naphthalen-1-yl)-N4,N4''-diphenyl-[1,1':4',1''-terphenyl]-4,4''-diamine (CAS 139255-16-6) (T-8) | 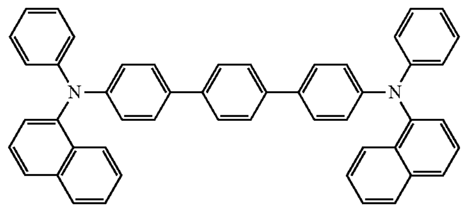 [SMILES: c1ccc(N(c2ccc(-c3ccc(-c4ccc(N(c5ccccc5)c5cccc6ccccc56)cc4)cc3)cc2)c2cccc3ccccc23)cc1] | −5.25 | −4.81 |
| 4,4'-Bis-(N-(1-naphthyl)-N-phenyl-amino)-quaterphenyl (CAS 650609-47-5) (T-9) | 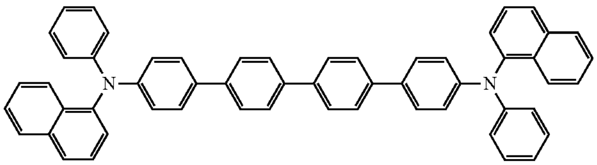 [SMILES: c1ccc(N(c2ccc(-c3ccc(-c4ccc(-c5ccc(N(c6ccccc6)c6cccc7ccccc67)cc5)cc4)cc3)cc2)c2cccc3ccccc23)cc1] | −5.33 | −4.85 |
| 4,4',4''-Tris(carbazol-9-yl)-triphenylamine (T-10) | 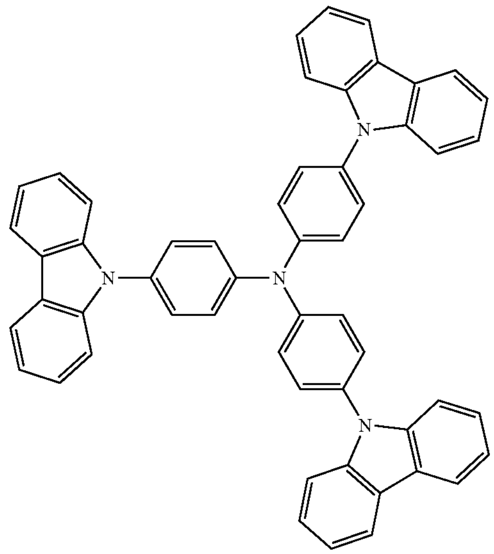 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1] | −5.7 | −5.09 |

If the HOMO level is far away from vacuum level, accurate measurement of the redox potential may no longer be viable. Therefore, in the specification the HOMO level is determined by quantum mechanical methods, unless stated otherwise.

It should be noted that the ligand L has a negative charge. According to one embodiment the ligand L has one negative charge, in other words the ligand L is mono-anionic. According to one embodiment the negative charge of the Ligand L may correspond to the valency of the metal ion M.

Another aspect is an organic electronic device comprising an anode layer, a cathode layer, at least one emission layer (EML) and at least one hole injection layer (HIL), wherein the hole injection layer is arranged between the anode layer and the at least one emission layer, wherein the hole injection layer comprises an organic matrix compound (OMC) and a metal complex, wherein the organic matrix compound (OMC) and the emitter matrix compound (EMC) have the Formula (I):

$$(Ar^1)_k\text{-}(Ar^2)_m\text{-}Ar^3\text{-}(Ar^4)_p\text{-}(Ar^5)_q\text{-}(Ar^6)_r \quad \text{(I)},$$

wherein k, m, q, r are independently from each other 0, 1 or 2, p is 1, 2 or 3, wherein $2 \leq k+m+q+r+p \leq 11$, $Ar^1$ to $Ar^6$ are independently selected from a substituted or unsubstituted unsaturated 5-to 7-member ring of a heterocycle, a substituted or unsubstituted $C_6$ to $C_{30}$ aryl or a substituted or unsubstituted $C_3$ to $C_{30}$ heteroaryl, a substituted or unsubstituted fluorene, or a fused ring system comprising 2 to 6 substituted or unsubstituted 5-to 7-member rings and the rings are selected from the group comprising (i) unsaturated 5-to 7-member ring of a heterocycle, (ii) 5-to 6-member of an aromatic heterocycle, (iii) unsaturated 5-to 7-member ring of a non-heterocycle, (iv) 6-member ring of an aromatic non-heterocycle;

wherein the substituents are selected from the group H, D, $C_1$ to $C_{12}$ alkyl, unsubstituted $C_6$ to $C_{18}$ aryl, unsubstituted $C_3$ to $C_{18}$ heteroaryl, a fused ring system comprising 2 to 6 unsubstituted 5-to 7-member rings and the rings are selected from the group comprising unsaturated 5-to 7-member ring of a heterocycle, 5-to 6-member of an aromatic heterocycle, unsaturated 5-to 7-member ring of a non-heterocycle, and 6-member ring of an aromatic non-heterocycle;

the metal complex has the Formula (II):

$$M^{n}\oplus(L^{\ominus})^{n} \quad (II),$$

wherein

M is a metal ion, n is the valency of M, wherein n is an integer from 1 to 4,

L is a ligand;

and wherein the organic matrix compound (OMC) and the emitter matrix compound (EMC) are selected the same or selected different.

According to one embodiment the organic electronic device comprising an anode layer, a cathode layer, at least one emission layer (EML) and at least one hole injection layer (HIL), wherein the hole injection layer is arranged between the anode layer and the at least one emission layer, wherein the hole injection layer comprises an organic matrix compound (OMC) and a metal complex, wherein the organic matrix compound (OMC) and the emitter matrix compound (EMC) have the Formula (I):

$$(Ar^1)_k\text{-}(Ar^2)_m\text{-}Ar^3\text{-}(Ar^4)_p\text{-}(Ar^5)_q\text{-}(Ar^6)_r \quad (I),$$

wherein k, m, q, r are independently from each other 0, 1 or 2, p is 1, 2 or 3, wherein $2 \leq k+m+q+r+p \leq 11$, $Ar^1$ to $Ar^6$ are independently selected from substituted or unsubstituted biphenylene, substituted or unsubstituted fluorene, substituted or unsubstituted naphthalene, substituted or unsubstituted anthracene, substituted or unsubstituted phenanthrene, substituted or unsubstituted pyrene, substituted or unsubstituted perylene, substituted or unsubstituted triphenylene, substituted or unsubstituted tetracene, substituted or unsubstituted tetraphene, substituted or unsubstituted dibenzofurane, substituted or unsubstituted dibenzothiophene, substituted or unsubstituted xanthene, substituted or unsubstituted carbazole, substituted or unsubstituted azepine, substituted or unsubstituted dibenzo[b,f]azepine, 9,9'-spirobi[fluorene], substituted or unsubstituted spiro[fluorene-9,9'-xanthene], substituted or unsubstituted 9,14-dihydrodibenzo[2,3:6,7]azepino[4,5-b]indole, or a substituted or unsubstituted aromatic fused ring system comprising at least three substituted or unsubstituted aromatic rings selected from the group comprising substituted or unsubstituted non-hetero, substituted or unsubstituted hetero 5-member rings, substituted or unsubstituted 6-member rings and/or substituted or unsubstituted 7-member rings, wherein the substituents are selected from the group H, D, $C_1$ to $C_{12}$ alkyl, unsubstituted $C_6$ to $C_{18}$ aryl, unsubstituted $C_3$ to $C_{18}$ heteroaryl, a fused ring system comprising 2 to 6 unsubstituted 5-to 7-member rings and the rings are selected from the group comprising unsaturated 5-to 7-member ring of a heterocycle, 5-to 6-member of an aromatic heterocycle, unsaturated 5-to 7-member ring of a non-heterocycle, and 6-member ring of an aromatic non-heterocycle; and wherein the organic matrix compound (OMC) and the emitter matrix compound (EMC) are selected the same or selected different.

According to one embodiment, the organic electronic device comprising an anode layer, a cathode layer, at least one emission layer (EML) and at least one hole injection layer (HIL), wherein the hole injection layer is arranged between the anode layer and the at least one emission layer, wherein the hole injection layer comprises an organic matrix compound (OMC) and a metal complex, wherein the organic matrix compound (OMC) and the emitter matrix compound (EMC) have the Formula (I):

$$(Ar^1)_k\text{-}(Ar^2)_m\text{-}Ar^3\text{-}(Ar^4)_p\text{-}(Ar^5)_q\text{-}(Ar^6)_r \quad (I),$$

wherein k, m, q, r may be independently selected from each other 0, 1 or 2,

P is 1, 2 or 3, wherein $2 \leq k+m+q+r+p \leq 11$, $Ar^1$ to $Ar^6$ may be independently selected from a substituted or unsubstituted unsaturated 5-to 7-member ring of a heterocycle, a substituted or unsubstituted $C_6$ to $C_{30}$ aryl, a substituted or unsubstituted $C_3$ to $C_{30}$ heteroaryl, a substituted or unsubstituted fluorene, or a fused ring system comprising 2 to 6 substituted or unsubstituted 5-to 7-member rings and the rings are selected from the group comprising (i) unsaturated 5-to 7-member ring of a heterocycle, (ii) 5-to 6-member of an aromatic heterocycle, (iii) unsaturated 5-to 7-member ring of a non-heterocycle, (iv) 6-member ring of an aromatic non-heterocycle;

wherein the substituents are selected from the group H, D, $C_1$ to $C_{12}$ alkyl, unsubstituted $C_6$ to $C_{18}$ aryl, unsubstituted $C_3$ to $C_{18}$ heteroaryl, a fused ring system comprising 2 to 6 unsubstituted 5-to 7-member rings and the rings are selected from the group comprising unsaturated 5-to 7-member ring of a heterocycle, 5-to 6-member of an aromatic heterocycle, unsaturated 5-to 7-member ring of a non-heterocycle, and 6-member ring of an aromatic non-heterocycle; and the metal complex has the Formula (II):

$$M^{n}\oplus(L^{\ominus})^{n} \quad (II),$$

wherein

M is a metal ion, n is the valency of M, wherein n is an integer from 1 to 4,

L is a ligand comprising at least two carbon atoms; wherein the organic matrix compound (OMC) and the emitter matrix compound (EMC) are selected the same or selected different.

According to another aspect, the organic matrix compound (OMC) and the emitter matrix compound (EMC) according to Formula (I) may be a hole transport compound.

According to one embodiment, wherein n may be an integer from 1 to 4, preferably 1 to 3, also preferred 2 or 3.

It should be noted that k, m, q, r represents the number of substituents to the neighbouring Ar moiety. For example, compound F13 according to Formula (I):

(F13)

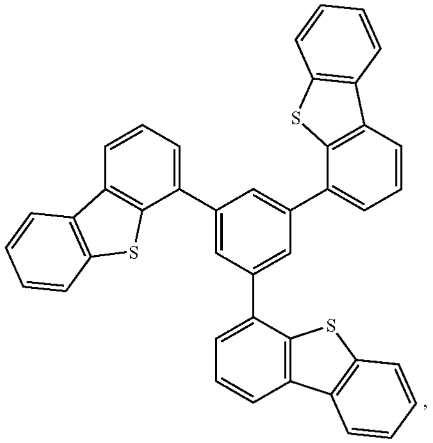

is represented by $Ar^3$=phenylene, k, m, q and r=0 and p is 3, wherein (D8)

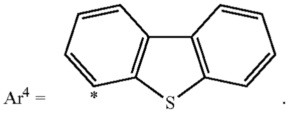

According to one embodiment the hole injection layer is non-emissive.

According to one embodiment of the present invention the hole injection layer and/or the organic matrix compound (OMC) and the emitter matrix compound (EMC) of Formula (I) and/or the metal complex of formula (II) are non-emissive.

In the context of the present specification the term "essentially non-emissive" or "non-emissive" means that the contribution of the hole injection layer, the organic matrix compound (OMC) and the emitter matrix compound (EMC) of Formula (I) and/or the metal complex of formula (II) to the visible emission spectrum from an organic electronic device, such as OLED or display device, may be less than 10%, preferably less than 5% relative to the visible emission spectrum. The visible emission spectrum is an emission spectrum with a wavelength of about ≥380 nm to about ≤780 nm.

It should be noted that throughout the application and the claims any $Ar^1$ to $Ar^6$ etc. always refer to the same moieties, unless otherwise noted.

In the present specification, when a definition is not otherwise provided, "substituted" refers to one substituted with a H, deuterium, $C_1$ to $C_{12}$ alkyl, unsubstituted $C_6$ to $C_{18}$ aryl, and unsubstituted $C_3$ to $C_{18}$ heteroaryl.

In the present specification, when a definition is not otherwise provided, an aryl group with at least 6 C-ring atoms can be substituted with 1, 2, 3, 4 or 5 substituents. For example a substituted $C_6$ aryl group may have 1, 2, 3, 4 or 5 phenyl substituents. Below is an example for a substituted $C_6$ aryl group with 4 phenyl groups:

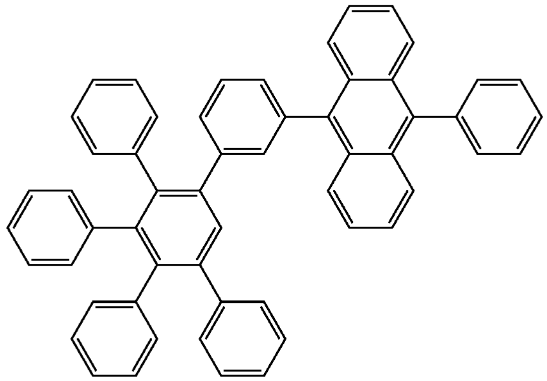 [SMILES: c1ccc(-c2cc(-c3cccc(-c4c5ccccc5c(-c5ccccc5)c5ccccc45)c3)c(-c3ccccc3)c(-c3ccccc3)c2-c2ccccc2)cc1]

However, in the present specification "aryl substituted" refers to a substitution with one or more aryl groups, which themselves may be substituted with one or more aryl and/or heteroaryl groups.

Correspondingly, in the present specification "heteroaryl substituted" refers to a substitution with one or more heteroaryl groups, which themselves may be substituted with one or more aryl and/or heteroaryl groups.

In the present specification, when a definition is not otherwise provided, an "alkyl group" refers to a saturated aliphatic hydrocarbyl group. The alkyl group may be a $C_1$ to $C_{12}$ alkyl group. More specifically, the alkyl group may be a $C_1$ to $C_{10}$ alkyl group or a $C_1$ to $C_6$ alkyl group. For example, a $C_1$ to $C_4$ alkyl group includes 1 to 4 carbons in alkyl chain, and may be selected from methyl, ethyl, propyl, iso-propyl, n-butyl, iso-butyl, sec-butyl, and tert-butyl.

Specific examples of the alkyl group may be a methyl group, an ethyl group, a propyl group, an iso-propyl group, a butyl group, an iso-butyl group, a sec-butyl group, a tert-butyl group, a pentyl group, a branched pentyl group, a hexyl group.

The term "cycloalkyl" refers to saturated hydrocarbyl groups derived from a cycloalkane by formal abstraction of one hydrogen atom from a ring atom comprised in the corresponding cycloalkane. Examples of the cycloalkyl group may be a cyclopropyl group, a cyclobutyl group, a cyclopentyl group, a cyclohexyl group, a methyl cyclohexyl group, an adamantly group and the like.

The term "hetero" is understood the way that at least one carbon atom, in a structure which may be formed by covalently bound carbon atoms, is replaced by another polyvalent atom. Preferably, the heteroatoms are selected from B, Si, N, P, O, S; more preferably from N, P, O, S.

Preferred examples of the compounds according to Formula (I), which can be covalent bonded compounds, are organic compounds that consisting predominantly from covalently bound C, H, O, N, S, which may optionally comprise also covalently bound B, P, As, Se. In one embodiment, the compounds according to Formula (I), which can be a covalent compound, is free of metal atoms and majority of its skeletal atoms may be selected from C, O, S, N. Alternatively, the covalent compounds according to Formula (I) are free of metal atoms and majority of its skeletal atoms may be selected from C and N.

According to one embodiment the organic matrix compound (OMC) and the emitter matrix compound (EMC) or the organic matrix compound (OMC) and the emitter matrix compound (EMC) according to Formula (I), may comprise hetero-atom/s that are selected from the group comprising O, S, N, B, P or Si, preferably the hetero-atom is selected from the group comprising O, S, N, B or Si, alternatively the hetero-atom is selected from the group comprising O, S, N or Si.

In the present specification, "aryl group" and "aromatic rings" refers to a hydrocarbyl group which can be created by formal abstraction of one hydrogen atom from an aromatic ring in the corresponding aromatic hydrocarbon. Aromatic hydrocarbon refers to a hydrocarbon which contains at least one aromatic ring or aromatic ring system. Aromatic ring or aromatic ring system refers to a planar ring or ring system of covalently bound carbon atoms, wherein the planar ring or ring system comprises a conjugated system of delocalized electrons fulfilling Hückel's rule. Examples of aryl groups include monocyclic groups like phenyl or tolyl, polycyclic groups which comprise more aromatic rings linked by single bonds, like biphenyl, and polycyclic groups comprising fused rings, like naphthyl or fluorenyl.

Analogously, under "heteroaryl" and "heteroaromatic", it is especially where suitable understood a group derived by formal abstraction of one ring hydrogen from a heterocyclic aromatic ring in a compound comprising at least one such ring.

The term "non-heterocycle" is understood to mean a ring or ring-system comprising no hetero-atom as a ring member.

The term "heterocycle" is understood to mean that the heterocycle comprises at least one ring comprising one or more hetero-atoms. A heterocycle comprising more than one ring means that all rings comprising a hetero-atom or at least one ring comprising a hetero atom and at least one ring comprising C-atoms only and no hetero atom.

Under heterocycloalkyl, it is especially where suitable understood a group derived by formal abstraction of one ring hydrogen from a saturated cycloalkyl ring in a compound comprising at least one such ring.

The term "fused aryl rings" or "condensed aryl rings" is understood the way that two aryl rings are considered fused or condensed when they share at least two common $sp^2$-hybridized carbon atoms.

The term "fused ring system" is understood to mean a ring system wherein two or more rings share at least two atoms.

The term"5-, 6- or 7-member ring" is understood to mean a ring comprising 5, 6 or 7 atoms. The atoms may be selected from C and one or more hetero-atoms.

In the present specification, the single bond refers to a direct bond.

In the context of the present invention, "different" means that the compounds do not have an identical chemical structure.

The term "free of", "does not contain", "does not comprise" does not exclude impurities which may be present in the compounds according to Formula (I) prior to deposition. Impurities have no technical effect with respect to the object achieved by the present invention.

The term "adjacent to" is understood to mean that distance between layers may be less than 20 nm or that the adjacent arranged layers contact each other. The term "contacting sandwiched" refers to an arrangement of three layers whereby the layer in the middle is in direct contact with the two adjacent layers.

The terms "light-emitting layer", "light emission layer" and "emission layer" are used synonymously.

The terms "OLED", "organic light-emitting diode" and "organic light-emitting device" are used synonymously.

The terms anode, anode layer and anode electrode are used synonymously.

The terms cathode, cathode layer and cathode electrode are used synonymously.

The term "hole injection layer" is understood to mean a layer which improves charge injection from the anode layer into the at least one emission layer.

The term "hole transport layer" is understood to mean a layer which transports holes between the hole injection layer and the at least one emission layer and/or between a first and a second emission layer.

The operating voltage U is measured in Volt.

In the specification, hole characteristics refer to an ability to donate an electron to form a hole when an electric field is applied and that a hole formed in the anode may be easily injected into the emission layer and transported in the emission layer due to conductive characteristics according to a highest occupied molecular orbital (HOMO) level.

In addition, electron characteristics refer to an ability to accept an electron when an electric field is applied and that electrons formed in the cathode may be easily injected into the emission layer and transported in the emission layer due to conductive characteristics according to a lowest unoccupied molecular orbital (LUMO) level.

Advantageous Effects

Surprisingly, it was found that the organic electronic device according to the invention solves the problem underlying the present invention by enabling organic electronic devices, such as organic light-emitting diodes, in various aspects superior over the organic electronic devices known in the art, in particular with respect to operating voltage.

Additionally, it was found that the problem underlying the present invention can be solved by providing compounds which may be suitable for deposition through vacuum thermal evaporation under conditions suitable for mass production. In particular, the rate onset temperature of the organic matrix compound (OMC), emitter matrix compound (EMC) and of the metal complex of the present invention may be in a range suitable for mass production.

According to one embodiment the HOMO level of the organic matrix compound (OMC) or organic matrix compound (OMC) of Formula (I) is further away from vacuum level than the HOMO level of N4,N4'''-di(naphthalen-1-yl)-N4,N4'''-diphenyl-[1,1':4',1'':4'',1'''-quaterphenyl]-4,4'''-diamine (−4.85 eV calculated by the method described in the present specification) when determined under the same conditions.

Preferably, the HOMO level of the organic matrix compound (OMC) or organic matrix compound (OMC) of Formula (I) is further away from vacuum level than the HOMO level of N,N'-((9H-fluorene-9,9-diyl)bis(4,1-phenylene))bis(N-([1,1'-biphenyl]-4-yl)-[1,1'-biphenyl]-4-amine) (−4.86 eV calculated by the method described in the present specification); alternatively the HOMO level of the organic matrix compound (OMC) or organic matrix compound (OMC) of Formula (I) is the same or further away from vacuum level than the HOMO level of 9-phenyl-10-(3',4',5'-triphenyl-[1,1':2',1''-terphenyl]-3-yl)anthracene (−5.04 eV calculated by the method described in the present specification); alternatively, the HOMO level of the organic matrix compound (OMC) or organic matrix compound (OMC) of Formula (I) is the same or further away from vacuum level than the HOMO level of tris(4-(9H-carbazol-9-yl)phenyl)amine(−5.09 eV calculated by the method described in the present specification).

According to one embodiment the HOMO level of the organic matrix compound (OMC) or organic matrix compound (OMC) of Formula (I) is further away from vacuum level than the HOMO level of N4,N4'''-di(naphthalen-1-yl)-

N4,N4'''-diphenyl-[1,1':4',1'':4'',1'''-quaterphenyl]-4,4'''-diamine and the same or closer to vacuum level than 4,4',4''-(1,3,5-Benzenetriyl)tris-[dibenzothiophene] when determined under the same conditions; preferably the HOMO level of the organic matrix compound (OMC) or organic matrix compound (OMC) of Formula (I) is further away from vacuum level than the HOMO level of N,N'-((9H-fluorene-9,9-diyl)bis(4,1-phenylene))bis(N-([1,1'-biphenyl]-4-yl)-[1,1'-biphenyl]-4-amine) and the same or closer to vacuum level than 4,4',4''-(1,3,5-Benzenetriyl)tris[dibenzothiophene]; alternatively the HOMO level of the organic matrix compound (OMC) or organic matrix compound (OMC) of Formula (I) is the same or further away from vacuum level than the HOMO level of 9-phenyl-10-(3',4',5'-triphenyl-[1,1':2',1''-terphenyl]-3-yl)anthracene and the same or closer to vacuum level than 4,4',4''-(1,3,5-Benzenetriyl)tris[dibenzothiophene]; alternatively, the HOMO level of the organic matrix compound (OMC) or organic matrix compound (OMC) of Formula (I) is further away from vacuum level than the HOMO level of tris(4-(9H-carbazol-9-yl)phenyl)amine and the same or closer to vacuum level than 4,4',4''-(1,3,5-Benzenetriyl)tris[dibenzothiophene] (−5.67 eV calculated by the method described in the present specification).

The term "HOMO level closer to vacuum level" is understood to mean that the absolute value of the HOMO level is lower than the absolute value of the HOMO level of the reference compound. For example, the term "closer to vacuum level than the HOMO level of 4,4',4''-(1,3,5-Benzenetriyl)tris[dibenzothiophene]" is understood to mean that the absolute value of the HOMO level of the organic matrix compound (OMC) is lower than the HOMO level of 4,4',4''-(1,3,5-Benzenetriyl)tris[dibenzothiophene].

According to one embodiment the HOMO level of the organic matrix compound (OMC) or organic matrix compound (OMC) of Formula (I) is further away from vacuum level than the HOMO level of N4,N4'''-di(naphthalen-1-yl)-N4,N4'''-diphenyl-[1,1':4',1'':4'',1'''-quaterphenyl]-4,4'''-diamine when determined under the same conditions; wherein the HOMO level of N4,N4'''-di(naphthalen-1-yl)-N4,N4'''-diphenyl-[1,1':4',1'':4'',1'''-quaterphenyl]-4,4'''-diamine is −4.85 eV;

alternatively the HOMO level of the organic matrix compound (OMC) or organic matrix compound (OMC) of Formula (I) is the same or further away from vacuum level than the HOMO level of N,N'-((9H-fluorene-9,9-diyl)bis(4,1-phenylene))bis(N-([1,1'-biphenyl]-4-yl)-[1,1'-biphenyl]-4-amine), wherein the HOMO level of N,N'4(9H-fluorene-9,9-diyl)bis(4,1-phenylene))bis(N-([1,1'-biphenyl]-4-yl)-[1,1'-biphenyl]-4-amine) is −4.86 eV;

alternatively the HOMO level of the organic matrix compound (OMC) or organic matrix compound (OMC) of Formula (I) is the same or further away from vacuum level than the HOMO level of 9-phenyl-10-(3',4',5'-triphenyl-[1,1':2',1''-terphenyl]-3-yl)anthracene, wherein the HOMO level of 9-phenyl-10-(3',4',5'-triphenyl-[1,1':2',1''-terphenyl]-3-yl)anthracene is −5.04 eV; alternatively, the HOMO level of the organic matrix compound (OMC) or organic matrix compound (OMC) of Formula (I) is the same or further away from vacuum level than the HOMO level of tris(4-(9H-carbazol-9-yl)phenyl)amine, wherein the HOMO level of tris(4-(9H-carbazol-9-yl)phenyl)amine is −5.09 eV.

Preferably, the HOMO level of the organic matrix compound (OMC) or organic matrix compound (OMC) of Formula (I) and/or the emitter matrix compound (EMC) or emitter matrix compound (EMC) of Formula (I) is further away from vacuum level than the HOMO level of N,N'4

(9H-fluorene-9,9-diyl)bis(4,1-phenylene))bis(N-([1,1'-biphenyl]-4-yl)-[1,1'-biphenyl]-4-amine) (−4.86 eV calculated by the method described in the present specification).

According to one embodiment the HOMO level of the organic matrix compound (OMC) or organic matrix compound (OMC) of Formula (I) and/or the emitter matrix compound (EMC) or emitter matrix compound (EMC) of Formula (I) is further away from vacuum level than the HOMO level of N4,N4'''-di(naphthalen-1-yl)-N4,N4''''-diphenyl-[1,1':4',1'':4'',1'''-quaterphenyl]-4,4'''-diamine and the same or closer to vacuum level than 4,4',4''-(1,3,5-Benzenetriyl)tris-[dibenzothiophene] when determined under the same conditions; preferably the HOMO level of the organic matrix compound (OMC) or organic matrix compound (OMC) of Formula (I) and/or the emitter matrix compound (EMC) or emitter matrix compound (EMC) of Formula (I) is further away from vacuum level than the HOMO level of N,N'-((9H-fluorene-9,9-diyl)bis(4,1-phenylene))bis(N-([1,1'-biphenyl]-4-yl)-[1,1'-biphenyl]-4-amine) and the same or closer to vacuum level than 4,4',4''-(1,3,5-Benzenetriyl)tris[dibenzothiophene] (−5.67 eV calculated by the method described in the present specification).

According to one embodiment the HOMO level of the organic matrix compound (OMC) or organic matrix compound (OMC) of Formula (I) and/or the emitter matrix compound (EMC) or emitter matrix compound (EMC) of Formula (I) is further away from vacuum level than the HOMO level of N4,N4'''-di(naphthalen-1-yl)-N4,N4''''-diphenyl-[1,1':4',1'':4'',1'''-quaterphenyl]-4,4'''-diamine when determined under the same conditions; wherein the HOMO level of N4,N4'''-di(naphthalen-1-yl)-N4,N4'''-diphenyl-[1,1':4',1'':4'',1'''-quaterphenyl]-4,4'''-diamine is −4.85 eV, preferably, the HOMO level of the organic matrix compound (OMC) or organic matrix compound (OMC) of Formula (I) and/or the emitter matrix compound (EMC) or emitter matrix compound (EMC) of Formula (I) is further away from vacuum level than the HOMO level of N,N'-((9H-fluorene-9,9-diyl)bis(4,1-phenylene))bis(N-([1,1'-biphenyl]-4-yl)-[1,1'-biphenyl]-4-amine) when determined under the same conditions; wherein the HOMO level of N,N'-((9H-fluorene-9,9-diyl)bis(4,1-phenylene))bis(N-([1,1'-biphenyl]-4-yl)-[1,1'-biphenyl]-4-amine) is −4.86 eV.

According to one embodiment the organic matrix compound (OMC) fulfills the following equation: −7 eV<HOMO level (OMC)<−4.85 eV, alternatively −6 eV<HOMO level (OMC) <−4.86 eV, alternatively −6 eV<HOMO level (OMC) <−4.9 eV, alternatively −6 eV<HOMO level (OMC) <−5 eV, alternatively −5.8 eV<HOMO level (OMC) <−5.05 eV, alternatively −5.7 eV<HOMO level (OMC) <−5.1 eV.

According to one embodiment the emitter matrix compound (EMC) fulfills the following equation: −7 eV<HOMO level (EMC)<−4.85 eV, alternatively −6 eV<HOMO level (EMC)<−4.86 eV, alternatively −6 eV<HOMO level (EMC)<−4.9 eV, alternatively −6 eV<HOMO level (EMC)<−5 eV, alternatively −5.7 eV<HOMO level (EMC)<−5.05 eV, alternatively −5.3 eV<HOMO level (EMC)<−5.1 eV.

According to one embodiment the organic matrix compound (OMC) and the emitter matrix compound (EMC) fulfill the following equation:

$$-7\ \text{eV} < \text{HOMO level (OMC) and HOMO level (EMC)} < -4.85\ \text{eV},$$

preferably −6 eV<HOMO level (OMC) and HOMO level (EMC)<−4.86 eV, alternatively −6 eV<HOMO level (OMC)

and HOMO level (EMC)<−4.9 eV, alternatively −6 eV<HOMO level (OMC) and HOMO level (EMC)<−5 eV, alternatively −5.7 eV<HOMO level (OMC) and HOMO level (EMC)≤−5.05 eV, alternatively −5.3 eV≤HOMO level (OMC) and HOMO level (EMC)≤−5.1 eV.

The organic matrix compound (OMC) that can be suitable used, for example as a matrix material in a hole injection layer of an organic electronic device, may have the Formula (I):

$$(Ar^1)_k\text{-}(Ar^2)_m\text{-}Ar^3\text{-}(Ar^4)_p\text{-}(Ar^5)_q\text{-}(Ar^6)_r, \quad (I),$$

wherein k, m, q, r may be independently selected from each other 0, 1 or 2, p is 1, 2 or 3, 2≤k+m+q+r+p≤11, $Ar^1$ to $Ar^6$ may be independently selected from a substituted or unsubstituted unsaturated 5-to 7-member ring of a heterocycle, a substituted or unsubstituted $C_6$ to $C_{30}$ aryl, a substituted or unsubstituted $C_3$ to $C_{30}$ heteroaryl, a substituted or unsubstituted fluorene, or a fused ring system comprising 2 to 6 substituted or unsubstituted 5-to 7-member rings and the rings are selected from the group comprising (i) unsaturated 5-to 7-member ring of a heterocycle, (ii) 5-to 6-member of an aromatic heterocycle, (iii) unsaturated 5-to 7-member ring of a non-heterocycle, (iv) 6-member ring of an aromatic non-heterocycle;

wherein the substituents are selected from the group H, D, $C_1$ to $C_{12}$ alkyl, unsubstituted $C_6$ to $C_{18}$ aryl, unsubstituted $C_3$ to $C_{18}$ heteroaryl, a fused ring system comprising 2 to 6 unsubstituted 5-to 7-member rings and the rings are selected from the group comprising unsaturated 5-to 7-member ring of a heterocycle, 5-to 6-member of an aromatic heterocycle, unsaturated 5- to 7-member ring of a non-heterocycle, and 6-member ring of an aromatic non-heterocycle.

According to one embodiment the organic matrix compound (OMC) and the emitter matrix compound (EMC) have the Formula (I):

$$(Ar^1)_k\text{-}(Ar^2)_m\text{-}Ar^3\text{-}(Ar^4)_p\text{-}(Ar^5)_q\text{-}(Ar^6)_r, \quad (I),$$

wherein k, m, q, r are independently from each other 0, 1 or 2, p is 1, 2 or 3, wherein 2≤k+m+q+r+p≤11, $Ar^1$ to $Ar^6$ are independently selected from substituted or unsubstituted unsaturated 5- to 7-member ring of a heterocycle, substituted or unsubstituted $C_6$ to $C_{30}$ aryl, substituted or unsubstituted $C_3$ to $C_{30}$ heteroaryl, a substituted or unsubstituted fluorene, or a fused ring system comprising 2 to 6 substituted or unsubstituted 5- to 7-member rings and the rings are selected from the group comprising (i) unsaturated 5- to 7-member ring of a heterocycle, (ii) 5- to 6-member of an aromatic heterocycle, (iii) unsaturated 5- to 7-member ring of a non-heterocycle, (iv) 6-member ring of an aromatic non-heterocycle;

$Ar^2$ if k=1, $Ar^3$, $Ar^4$ if q=1, $Ar^5$ if r=1:

are independently selected from substituted or unsubstituted unsaturated 5- to 7-member ring of a heterocycle, substituted or unsubstituted $C_6$ to $C_{30}$ arylene, substituted or unsubstituted $C_3$ to Cm heteroarylene, substituted or unsubstituted biphenylene, substituted or unsubstituted fluorene, substituted or unsubstituted naphthalene, substituted or unsubstituted anthracene, substituted or unsubstituted phenanthrene, substituted or unsubstituted pyrene, substituted or unsubstituted perylene, substituted or unsubstituted triphenylene, substituted or unsubstituted tetracene, substituted or unsubstituted tetraphene, substituted or unsubstituted dibenzofurane, substituted or unsubstituted dibenzothiophene, substituted or unsubstituted xanthene, substituted or unsubstituted carbazole, substituted or unsubstituted azepine, substituted or unsubstituted dibenzo[b,f]azepine, 9,9'-spirobi[fluorene], substituted or unsubstituted spiro[fluorene-9,9'-xanthene], substituted or unsubstituted 9,14-dihydrodibenzo[2,3:6,7]azepino[4,5-b]indole, or a substituted or unsubstituted aromatic fused ring system comprising at least three substituted or unsubstituted aromatic rings selected from the group comprising substituted or unsubstituted non-hetero, substituted or unsubstituted hetero 5-member rings, substituted or unsubstituted 6-member rings and/or substituted or unsubstituted 7-member rings;

$Ar^2$ if k=0, $Ar^3$ if m=0 and k=0, $Ar^4$ if q and r=0, $Ar^5$ if r=0:

are independently selected from substituted or unsubstituted unsaturated 5- to 7-member ring of a heterocycle, substituted or unsubstituted $C_6$ to Cm aryl, substituted or unsubstituted $C_3$ to Cm heteroaryl, substituted or unsubstituted biphenyl, substituted or unsubstituted fluorenyl, substituted or unsubstituted naphthalenyl, substituted or unsubstituted anthracenyl, substituted or unsubstituted phenanthrenyl, substituted or unsubstituted pyrenyl, substituted or unsubstituted perylenyl, substituted or unsubstituted triphenylenyl, substituted or unsubstituted tetracenyl, substituted or unsubstituted tetraphenyl, substituted or unsubstituted dibenzofuranyl, substituted or unsubstituted dibenzothiophenyl, substituted or unsubstituted xanthenyl, substituted or unsubstituted carbazole, substituted or unsubstituted azepine, substituted or unsubstituted dibenzo[b,f]azepine, 9,9'-spirobi[fluorenyl], substituted or unsubstituted spiro[fluorenyl-9,9'-xanthene], substituted or unsubstituted 9,14-dihydrodibenzo[2,3:6,7]azepino[4,5-b]indole, or a substituted or unsubstituted aromatic fused ring system comprising at least three substituted or unsubstituted aromatic rings selected from the group comprising substituted or unsubstituted non-hetero, substituted or unsubstituted hetero 5-member rings, substituted or unsubstituted 6-member rings and/or substituted or unsubstituted 7-member rings;

wherein the substituents are selected from the group H, D, $C_1$ to $C_{12}$ alkyl, unsubstituted $C_6$ to $C_{18}$ aryl, unsubstituted $C_3$ to $C_{18}$ heteroaryl, a fused ring system comprising 2 to 6 unsubstituted 5- to 7-member rings and the rings are selected from the group comprising unsaturated 5- to 7-member ring of a heterocycle, 5- to 6-member of an aromatic heterocycle, unsaturated 5- to 7-member ring of a non-heterocycle, and 6-member ring of an aromatic non-heterocycle; and wherein the organic matrix compound (OMC) and the emitter matrix compound (EMC) are selected the same or selected different, preferably different; and wherein the metal complex has the Formula (II).

According to one embodiment $Ar^1$ to $Ar^6$ may be independently selected from substituted or unsubstituted biphenylene, substituted or unsubstituted fluorene, substituted or unsubstituted naphthalene, substituted or unsubstituted anthracene, substituted or unsubstituted phenanthrene, substituted or unsubstituted pyrene, substituted or unsubstituted perylene, substituted or unsubstituted triphenylene, substituted or unsubstituted tetracene, substituted or unsubstituted tetraphene, substituted or unsubstituted dibenzofurane, substituted or unsubstituted dibenzothiophene, substituted or unsubstituted xanthene, substituted or unsubstituted carbazole, substituted or unsubstituted azepine, substituted or unsubstituted dibenzo[b,f]azepine, 9,9'-spirobi[fluorene], substituted or unsubstituted spiro[fluorene-9,9'-xanthene], substituted or unsubstituted 9,14-dihydrodibenzo[2,3:6,7]azepino[4,5-b]indole, or a substituted or unsubstituted aromatic fused ring system comprising at least three substituted or unsubstituted aromatic rings selected from the group comprising substituted or unsubstituted non-hetero, substituted or unsubstituted hetero 5-member rings, substituted or unsubstituted 6-member rings and/or substituted or unsubstituted 7-member rings, wherein the substituents are selected from the group H, D, $C_1$ to $C_{12}$ alkyl, unsubstituted $C_6$ to $C_{18}$ aryl, unsubstituted $C_3$ to $C_{18}$ heteroaryl, a fused ring system comprising 2 to 6 unsubstituted 5- to 7-member rings and the rings are selected from the group comprising unsaturated 5- to 7-member ring of a heterocycle, 5- to 6-member of an aromatic heterocycle, unsaturated 5- to 7-member ring of a non-heterocycle, and 6-member ring of an aromatic non-heterocycle.

According to one embodiment the organic matrix compound (OMC) of Formula (I) contained in the hole injection layer and/or the emitter matrix compound (EMC) of Formula (I) contained in the emission layer (EML) may have a molecular weight Mw of ≥400 and ≤2000 g/mol, preferably a molecular weight Mw of ≥450 and ≤1500 g/mol, further preferred a molecular weight Mw of ≥500 and ≤1000 g/mol, in addition preferred a molecular weight Mw of ≥550 and ≤900 g/mol, also preferred a molecular weight Mw of ≥600 and ≤800 g/mol.

According to one embodiment, the HOMO level of the organic matrix compound (OMC) or organic matrix compound (OMC) of Formula (I) may be less than −4.85 eV, preferably less than −4.9 eV, alternatively less than −4.95 eV, alternatively less than −5 eV, alternatively less than −5.05 eV, alternatively less than −5.09 eV.

According to one embodiment, the HOMO level of the organic matrix compound (OMC) or organic matrix compound (OMC) of Formula (I) may be less than −4.85 eV and more than −7 eV, preferably less than −4.9 eV and more than −7 eV, alternatively less than −4.95 eV and more than −7 eV, alternatively less than −5 eV and more than −7 eV, alternatively less than −5.05 eV and more than −7 eV, alternatively less than −5.09 eV and more than −7 eV.

According to one embodiment, the HOMO level of the organic matrix compound (OMC) or organic matrix compound (OMC) of Formula (I) and/or the emitter matrix compound (EMC) or the emitter matrix compound (EMC) of Formula (I) may be less than −4.85 eV, preferably less than −4.9 eV, alternatively less than −4.95 eV, alternatively less than −5 eV.

According to one embodiment, the HOMO level of the organic matrix compound (OMC) or organic matrix compound (OMC) of Formula (I) and/or the emitter matrix compound (EMC) or the emitter matrix compound (EMC) of Formula (I) may be less than −4.85 eV and more than −7 eV, preferably less than −4.9 eV and more than −7 eV, alternatively less than −4.95 eV and more than −7 eV, alternatively less than −5 eV and more than −7 eV.

According to one embodiment, the HOMO level of the organic matrix compound (OMC) or organic matrix compound (OMC) of Formula (I) and/or the emitter matrix compound (EMC) or the emitter matrix compound (EMC) of Formula (I) may be less than −4.85 eV and more than −6.5 eV, preferably less than −4.9 eV and more than −6.5 eV, alternatively less than −4.95 eV and more than −6.5 eV, alternatively less than −5 eV and more than −6.5 eV, alternatively less than −5.05 eV and more than −6.5 eV, alternatively less than −5.09 eV and more than −6.5 eV.

According to one embodiment, the HOMO level of the organic matrix compound (OMC) or organic matrix compound (OMC) of Formula (I) and/or the emitter matrix compound (EMC) or the emitter matrix compound (EMC) of Formula (I) may be less than −4.85 eV and more than −6 eV, preferably less than −4.9 eV and more than −6 eV, alternatively less than −4.95 eV and more than −6 eV, alternatively less than −5 eV and more ve than −6 eV, alternatively less than −5.05 eV and more than −6 eV, alternatively less than −5.09 eV and more than −6 eV.

According to one embodiment the organic matrix compound (OMC) or organic matrix compound (OMC) of Formula (I) and/or the emitter matrix compound (EMC) or the emitter matrix compound (EMC) of Formula (I) may comprises at least ≥1 to ≤6 substituted or unsubstituted aromatic fused ring systems comprising heteroaromatic rings.

According to one embodiment the organic matrix compound (OMC) or organic matrix compound (OMC) of Formula (I) and/or the emitter matrix compound (EMC) or the emitter matrix compound (EMC) of Formula (I) may comprises at least ≥1 to ≤6 substituted or unsubstituted aromatic fused ring systems comprising heteroaromatic rings and at least ≥1 to ≤3 substituted or unsubstituted unsaturated 5- to 7-member ring of a heterocycle, preferably ≥2 to ≤5 substituted or unsubstituted aromatic fused ring systems comprising heteroaromatic rings.

According to one embodiment the organic matrix compound (OMC) or organic matrix compound (OMC) of Formula (I) and/or the emitter matrix compound (EMC) or the emitter matrix compound (EMC) of Formula (I) may comprises at least ≥1 to <6 substituted or unsubstituted aromatic fused ring systems comprising heteroaromatic rings and at least ≥1 to <3 substituted or unsubstituted unsaturated 5- to 7-member ring of a heterocycle, preferably ≥2 to <5 substituted or unsubstituted aromatic fused ring systems comprising heteroaromatic rings, and at least ≥1 to <3 substituted or unsubstituted unsaturated 5- to 7-member ring of a heterocycle, further preferred 3 or 4 substituted or unsubstituted aromatic fused ring systems comprising heteroaromatic rings and optional at least ≥1 to <3 substituted or unsubstituted unsaturated 5- to 7-member ring of a heterocycle, and additional preferred wherein the aromatic fused ring systems comprising heteroaromatic rings are unsubstituted and optional at least ≥1 to <3 unsubstituted unsaturated 5- to 7-member ring of a heterocycle.

According to one embodiment the organic matrix compound (OMC) or organic matrix compound (OMC) of Formula (I) and/or the emitter matrix compound (EMC) or the emitter matrix compound (EMC) of Formula (I) may comprises at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems.

According to one embodiment the organic matrix compound (OMC) or organic matrix compound (OMC) of Formula (I) and/or the emitter matrix compound (EMC) or the emitter matrix compound (EMC) of Formula (I) may comprises at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems, which comprises substituted or unsubstituted heteroaromatic rings.

According to one embodiment the organic matrix compound (OMC) or organic matrix compound (OMC) of Formula (I) and/or the emitter matrix compound (EMC) or the emitter matrix compound (EMC) of Formula (I) may comprises at least ≥1 to ≤3 or 2 substituted or unsubstituted unsaturated 5- to 7-member ring of a heterocycle.

According to one embodiment the organic matrix compound (OMC) or organic matrix compound (OMC) of Formula (I) and/or the emitter matrix compound (EMC) or the emitter matrix compound (EMC) of Formula (I) may comprises at least ≥1 to ≤3 or 2 substituted or unsubstituted unsaturated 7-member ring of a heterocycle.

According to one embodiment substituted or unsubstituted aromatic fused ring systems of the organic matrix compound (OMC) or organic matrix compound (OMC) of Formula (I) and/or the emitter matrix compound (EMC) or the emitter matrix compound (EMC) of Formula (I) may comprises at least ≥1 to ≤3 or 2 substituted or unsubstituted unsaturated 5- to 7-member ring of a heterocycle.

According to one embodiment the substituted or unsubstituted aromatic fused ring systems of the organic matrix compound (OMC) or organic matrix compound (OMC) of Formula (I) and/or the emitter matrix compound (EMC) or the emitter matrix compound (EMC) of Formula (I) may comprises at least ≥1 to ≤3 or 2 substituted or unsubstituted unsaturated 7-member ring of a heterocycle.

According to one embodiment the organic matrix compound (OMC) or organic matrix compound (OMC) of Formula (I) and/or the emitter matrix compound (EMC) or the emitter matrix compound (EMC) of Formula (I) may comprises at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems, and wherein the aromatic fused ring system comprises substituted or unsubstituted unsaturated 5- to 7-member ring of a heterocycle.

According to one embodiment the organic matrix compound (OMC) or organic matrix compound (OMC) of Formula (I) and/or the emitter matrix compound (EMC) or the emitter matrix compound (EMC) of Formula (I) may comprises at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems, which comprises substituted or unsubstituted heteroaromatic rings, and wherein the aromatic fused ring system comprises substituted or unsubstituted unsaturated 5- to 7-member ring of a heterocycle.

According to one embodiment the organic matrix compound (OMC) or organic matrix compound (OMC) of Formula (I) and/or the emitter matrix compound (EMC) or the emitter matrix compound (EMC) of Formula (I) may comprises at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems, and wherein the aromatic fused ring system comprises at least ≥1 to ≤3 or 2 substituted or unsubstituted unsaturated 5- to 7-member ring of a heterocycle.

According to one embodiment the organic matrix compound (OMC) or organic matrix compound (OMC) of Formula (I) and/or the emitter matrix compound (EMC) or the emitter matrix compound (EMC) of Formula (I) may comprises at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems, which comprises substituted or unsubstituted heteroaromatic rings, and wherein the aromatic fused ring system comprises at least ≥1 to ≤3 or 2 substituted or unsubstituted unsaturated 5- to 7-member ring of a heterocycle.

According to one embodiment,

- the organic matrix compound (OMC) and the emitter matrix compound (EMC) comprise a substituted or unsubstituted aromatic fused ring systems with at least ≥2 to ≤6, preferably ≥3 to ≤5, or 4 fused aromatic rings selected from the group comprising substituted or unsubstituted non-hetero aromatic rings, substituted or unsubstituted hetero 5-member rings, substituted or unsubstituted 6-member rings and/or substituted or unsubstituted unsaturated 5- to 7-member ring of a heterocycle; or
- the organic matrix compound (OMC) and the emitter matrix compound (EMC) or the organic matrix compound of formula (I) and the emitter matrix compound of formula (I) comprises an unsubstituted aromatic fused ring systems with at least ≥2 to ≤6, preferably ≥3 to ≤5, or 4 fused aromatic rings selected from the group comprising unsubstituted non-hetero aromatic rings, unsubstituted hetero 5-member rings, unsubstituted 6-member rings and/or unsubstituted unsaturated 5- to 7-member ring of a heterocycle.

It should be noted here that the wording "aromatic fused ring system" may include at least one aromatic ring and at least one substituted or unsubstituted unsaturated 5- to 7-member ring. It should be noted here that the substituted or unsubstituted unsaturated 5- to 7-member ring may not be an aromatic ring.

According to one embodiment the organic matrix compound (OMC) or organic matrix compound (OMC) of Formula (I) and/or the emitter matrix compound (EMC) or the emitter matrix compound (EMC) of Formula (I) may comprises at least at least ≥1 to ≤6, preferably ≥2 to ≤5, or further preferred 3 or 4 of the substituted or unsubstituted aromatic fused ring systems with:

- at least one unsaturated 5-member ring, and/or
- at least one unsaturated 6-member ring, and/or
- at least one unsaturated 7-member ring; wherein preferably at least one unsaturated 5- and/or at least one unsaturated 7-member ring comprises at least 1 to 3, preferably 1 hetero-atom.

According to one embodiment the organic matrix compound (OMC) or organic matrix compound (OMC) of Formula (I) and/or the emitter matrix compound (EMC) or the emitter matrix compound (EMC) of Formula (I) may comprises at least at least ≥1 to ≤6, preferably ≥2 to ≤5, or further preferred 3 or 4 of the substituted or unsubstituted aromatic fused ring systems with:

- at least one aromatic 5-member ring, and/or
- at least one aromatic 6-member ring, and/or
- at least one aromatic 7-member ring; wherein preferably at least one aromatic 5- and/or at least one aromatic 7-member ring comprises at least 1 to 3, preferably 1 hetero-atom;

wherein the substituted or unsubstituted aromatic fused ring system comprises at least ≥1 to ≤3 or 2 substituted or unsubstituted unsaturated 5- to 7-member ring of a heterocycle.

According to one embodiment the organic matrix compound (OMC) or organic matrix compound (OMC) of Formula (I) and/or the emitter matrix compound (EMC) or the emitter matrix compound (EMC) of Formula (I) may comprises:

- at least ≥6 to ≤12, preferably ≥7 to ≤11, further preferred≥8 to ≤10 or 9 aromatic rings; and/or
- at least ≥4 to ≤11, preferably ≥5 to ≤10, further preferred≥6 to ≤9 or in addition preferred 7 or 8 non-hetero aromatic rings, preferably the non-hetero aromatic rings are aromatic $C_6$ rings; and/or
- at least ≥1 to ≤4, preferably 2 or 3 aromatic 5-member-rings, preferably hetero aromatic 5-member-rings; and/or
- at least 1 or 2 unsaturated 5- to 7-member-ring of a heterocycle, preferably at least 1 or 2 unsaturated 7-member-ring of a heterocycle;
- at least ≥6 to ≤12, preferably ≥7 to ≤11, further preferred≥8 to ≤10 or 9 aromatic rings, wherein therefrom
  - at least ≥4 to ≤11, preferably ≥5 to ≤10, further preferred≥6 to ≤9 or in addition preferred 7 or 8 are non-hetero aromatic rings, and
  - at least ≥1 to ≤4, preferably 2 or 3 aromatic rings are hetero aromatic rings, wherein the total number of non-hetero aromatic rings and hetero aromatic rings in total does not exceed 12 aromatic rings; and/or
- at least ≥6 to ≤12, preferably ≥7 to ≤11, further preferred≥8 to ≤10 or 9 aromatic rings, wherein therefrom
  - at least ≥4 to ≤11, preferably ≥5 to ≤10, further preferred≥6 to ≤9 or in addition preferred 7 or 8 are non-hetero aromatic rings, and
  - at least ≥1 to ≤4, preferably 2 or 3 aromatic rings are hetero aromatic rings, wherein the total number of non-hetero aromatic rings and hetero aromatic rings in total does not exceed 12 aromatic rings; and the organic matrix compound or the organic matrix compound according to Formula I and the emitter matrix compound or the emitter matrix compound according to Formula I comprise at least ≥1 to ≤4, preferably 2 or 3 aromatic 5-member-rings, preferably hetero aromatic 5-member-rings, and/or the organic matrix compound or the organic matrix compound according to Formula I and the emitter matrix compound or the emitter matrix compound according to Formula I comprise at least 1 or 2 unsaturated 5- to 7-member-ring of a heterocycle, preferably at least 1 or 2 unsaturated 7-member-ring of a heterocycle.

According to one embodiment the organic matrix compound (OMC) or organic matrix compound (OMC) of Formula (I) and/or the emitter matrix compound (EMC) or the emitter matrix compound (EMC) of Formula (I) may comprises a hetero-atom, which may be selected from the group comprising O, S, N, B or P, preferably the hetero-atom may be selected from the group comprising O, S or N.

According to one embodiment the organic matrix compound (OMC) or organic matrix compound (OMC) of Formula (I) and/or the emitter matrix compound (EMC) or the emitter matrix compound (EMC) of Formula (I) may comprises at least at least ≥1 to ≤6, preferably ≥2 to ≤5, or further preferred 3 or 4 of the substituted or unsubstituted aromatic fused ring systems with:

- at least one aromatic 5-member ring, and/or
- at least one aromatic 6-member ring, and/or
- at least one aromatic 7-member ring; wherein preferably at least one aromatic 5- and/or at least one aromatic 7-member ring comprises at least 1 to 3, preferably 1 hetero-atom;

wherein the substituted or unsubstituted aromatic fused ring system optional comprises at least ≥1 to ≤3 or 2 substituted or unsubstituted unsaturated 5- to 7-member ring of a heterocycle; and wherein the substituted or unsubstituted aromatic fused ring system comprises a hetero-atom, which may be selected from the group comprising O, S, N, B, P, As or Se, preferably the hetero-atom may be selected from the group comprising O, S or N.

According to one embodiment the organic matrix compound (OMC) or organic matrix compound (OMC) of Formula (I) and/or the emitter matrix compound (EMC) or the emitter matrix compound (EMC) of Formula (I) may be free of hetero-atoms which are not part of an aromatic ring and/or part of an unsaturated 7-member-ring, preferably the organic matrix compound (OMC) or organic matrix compound (OMC) of Formula (I) and/or the emitter matrix compound (EMC) or the emitter matrix compound (EMC) of Formula (I) may be free on N-atoms except N-atoms which are part of an aromatic ring or are part of an unsaturated 7-member-ring.

According to one embodiment, the organic matrix compound (OMC) or organic matrix compound (OMC) of Formula (I) and/or the emitter matrix compound (EMC) or the emitter matrix compound (EMC) of Formula (I) comprises two carbazole groups, at least one dibenzofurane group, at least one dibenzothiophene group and/or at least one anthracene group.

According to one embodiment, the organic matrix compound (OMC) or organic matrix compound (OMC) of Formula (I) and/or the emitter matrix compound (EMC) or the emitter matrix compound (EMC) of Formula (I) comprises two carbazole groups, one to three dibenzofurane groups, one to three dibenzothiophene groups and/or one to two anthracene groups.

According to one embodiment, wherein for the organic matrix compound (OMC) of Formula (I) and/or the emitter matrix compound (EMC) of Formula (I):

$Ar^3$ may be selected from D1 to D17, preferably D1 to D6 and D16:

(D1)

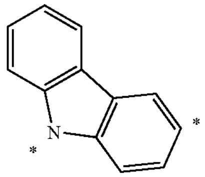

, (D2)

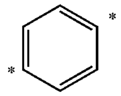

, (D3)

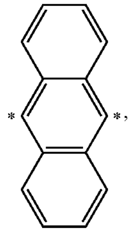

,

-continued (D4)

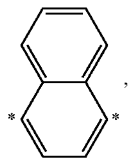

(D5)

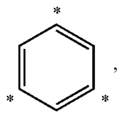

(D6)

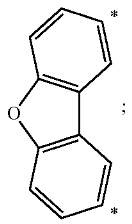

(D7)

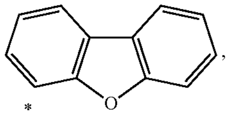

(D8)

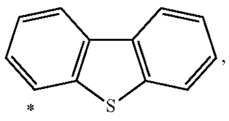

(D9)

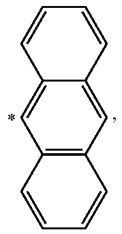

(D10)

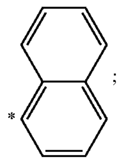

(D11)

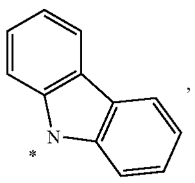

(D12)

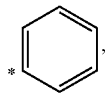

-continued (D13)

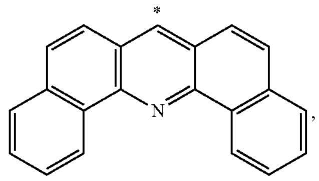

(D14)

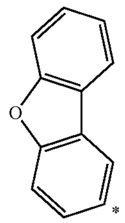

(D15)

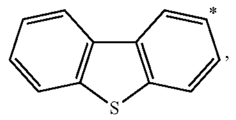

(D16)

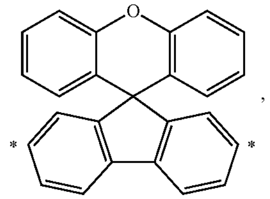

(D17)

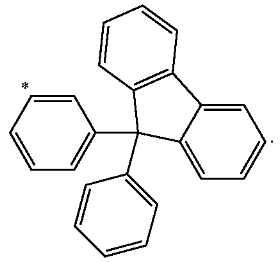

According to one embodiment, wherein according to Formula (I) $Ar^1$ may be selected from D7 to D15 and D17. $Ar^2$ may selected from D1 to D6, or D7 to D15 and D17. $Ar^4$ may be selected from D1 to D6, or D7 to D15 and D17. $Ar^5$ may be selected from D1 to D6, or D7 to D15 and D17. $Ar^6$ may be selected from D7 to D15 and D17.

According to one embodiment, wherein the organic matrix compound (OMC) of Formula (I) and/or the emitter matrix compound (EMC) of Formula (I):

$Ar^3$ may be selected from D1 to D17, preferably D1 to D6 and D16:

(D1)

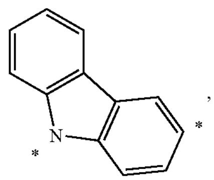

-continued (D2)

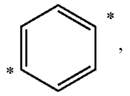

(D3)

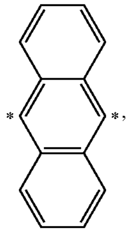

(D4)

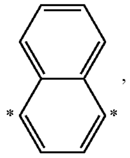

(D5)

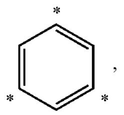

(D6)

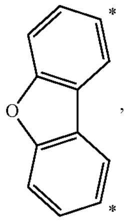

(D7)

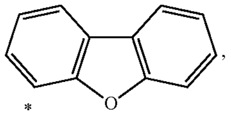

(D8)

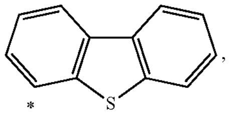

(D9)

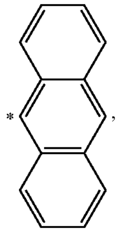

(D10)

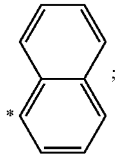

-continued (D11)

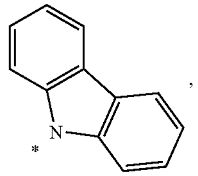

(D12)

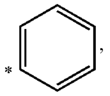

(D13)

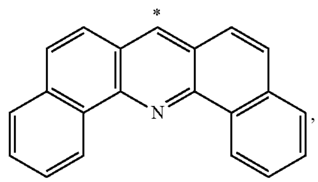

(D14)

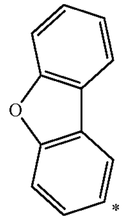

(D15)

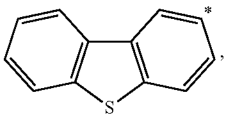

(D16)

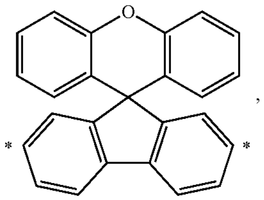

(D17)

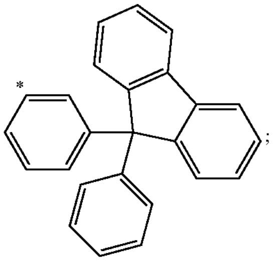

$Ar^1$ is selected from D7 to D15 and D17, if m>0 and k>0, or is selected from D7 to D15 and D17, if k>0 and m=0, or is selected from D1 to D6, if k>1;

$Ar^2$ is selected from D1 to D6, if m>0 and k>0; or is selected from D7 to D15 and D17, if m>0 and k=0;

$Ar^4$ is selected from D1 to D6, if q>0, or is selected from D1 to D6, if q=0 and r>0; or is selected from D7 to D15 and D17, if q and r=0;

$Ar^5$ is selected from D1 to D6, if q>0 and r>0, or is selected from D7 to D15 and D17, if q>0 and r=0;

$Ar^6$ is selected from D7 to D15 and D17, if r>0, q>0, or is selected from D7 to D15 and D17, if r>0, q=0, or is selected from D1 to D6, if r>1.

According to one embodiment, wherein in Formula (I) the $Ar^3$ group is selected from anthracene, carbazole, dibenzothiophene and/or dibenzofurane.

According to one embodiment, wherein in Formula (I) the $Ar^3$ group is selected anthracene.

According to one embodiment, wherein in Formula (I) the $Ar^3$ group is selected from carbazole, dibenzothiophene and/or dibenzofurane.

According to one embodiment, wherein the organic matrix compound (OMC) according to formula (I) and/or the emitter matrix compound (EMC) according to formula (I) may be selected from F1 to F13:

(F1)

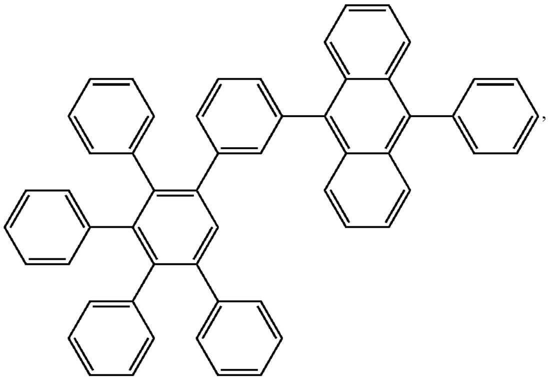

, (F2)

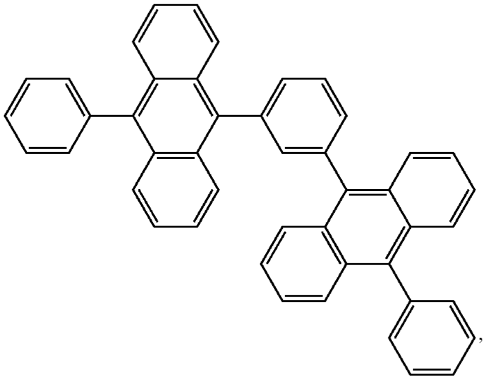

, (F3)

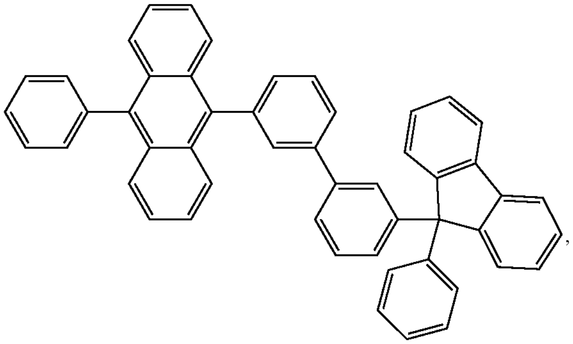

,

-continued (F4)

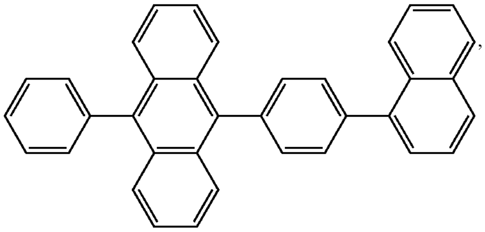

, (F5)

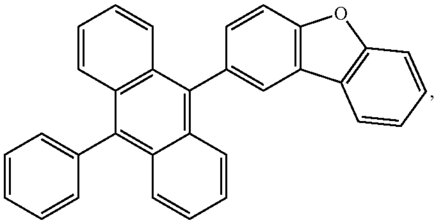

, (F6)

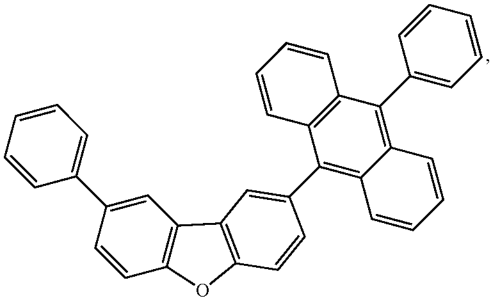

, (F7)

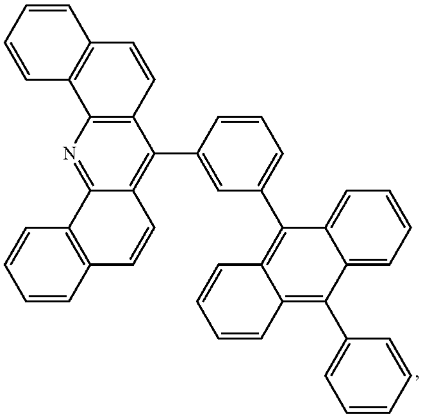

,

-continued (F8)

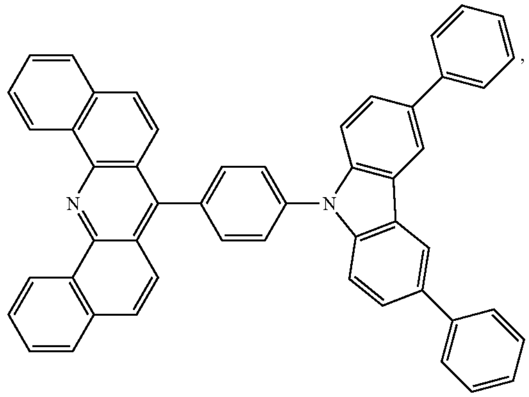

, (F9)

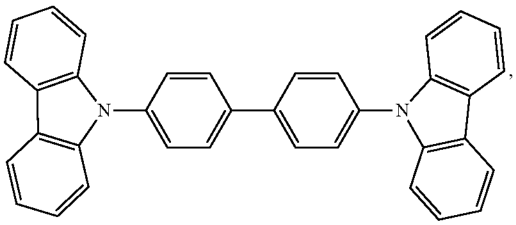

, (F10)

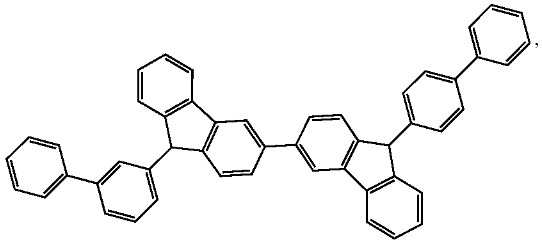

, (F11)

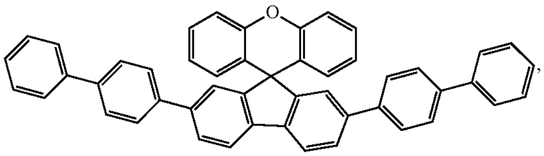

, (F12)

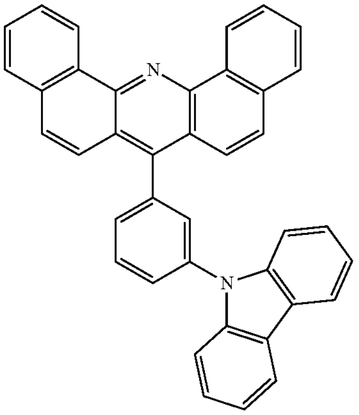

,

-continued (F13)

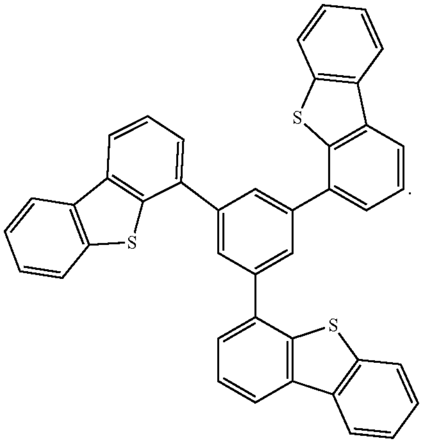

.

Preferably, the organic matrix compound (OMC) and/or the emitter matrix compound are free of metals and/or ionic bonds.

The hole injection layer and/or the organic matrix compound (OMC) and/or the emitter matrix compound (EMC) according to formula (I) may be free of HTM014, HTM081, HTM163, HTM222, EL-301, HTM226, HTM355, HTM133, HTM334, HTM604 and EL-22T. The abbreviations denote the manufacturers' names, for example, of Merck or Lumtec.

The hole injection layer and/or the organic matrix compound (OMC) and/or the emitter matrix compound (EMC) according to formula (I) may be free of N,N'-Bis(naphthalen-1-yl)-N,N'-bis(phenyl)-9,9-dimethyl-fluorene, N,N-Bis (3-methylphenyl)-N,N'-bis(phenyl)-9,9-dimethyl-fluorene, N,N'-Bis(naphthalen-1-yl)-N,N'-bis(phenyl)-9,9-dimethyl-fluorene, N,N'-Bis(naphthalen-1-yl)-N,N'-bis(phenyl)-2,2-dimethylbenzidine, N,N'-Bis(3-methylphenyl)-N,N'-bis (phenyl)-9,9-spirobifluorene, 2,2',7,7'-Tetrakis(N,N-diphenylamino)-9,9'-spirobifluorene, N,N'-Bis(naphthalen-1-yl)-N,N'-bis(phenyl)-benzidine, N,N'-Bis(naphthalen-2-yl)-N,N'-bis(phenyl)-benzidine, N,N'-Bis(3-methylphenyl)-N,N'-bis(phenyl)-benzidine, N,N'-Bis(3-methylphenyl)-N,N'-bis(phenyl)-9,9-dimethyl-fluorene, N,N'-Bis(naphthalen-1-yl)-N,N'-bis(phenyl)-9,9-spirobifluorene, Di-[4-(N,N-ditolyl-amino)-phenyl]cyclohexane, 2,2',7,7'-tetra(N,N-di-tolyl)amino-spiro-bifluorene, 9,9-Bis[4-(N,N-bis-biphenyl-4-yl-amino)phenyl]-9H-fluorene, 2,2',7,7'-Tetrakis(N,N-naphthalenyl(phenyl)-amino]-9,9'-spirobifluorene, 2,7-Bis (N,N-bis(9,9-spiro-bifluorene-2-yl)-amino]-9,9'-spirobifluorene, 2,2'-Bis(N,N-bis(biphenyl-4-yl)aminol-9, 9'-spirobifluorene, N,N'-bis(phenanthren-9-yl)-N,N'-bis (phenyl)-benzidine, N,N,N',N'-tetra-naphthalen-2-yl)-benzidine, 2,2'-Bis(N,N-di-phenyl-amino)-9,9-spirobifluorene, 9,9-Bis[4-(N,N-bis-naphthalen-2-yl-amino) phenyl]-9H-fluorene, 9,9-Bis[4-(N,N'-bis-naphthalen-2-yl-N,N'-bis-phenyl-amino)-phenyl]-9H-fluorene, Titanium oxide phthalocyanine, Copper phthalocyanine, 2,3,5,6 Tetrafluoro 7,7,8,8, tetracyano-quinodimethane, 4,4'4"-Tris(N-3-methylphenyl-N-phenyl-amino)triphenylamine, 4,4',4"-Tris(N-(2-naphthyl)-N-phenyl-amino)triphenylamine, 4,4', 4"-Tris(N-(1-naphthyl)-N-phenyl-amino)triphenylamine, 4,4',4"-Tris(N,N-diphenyl-amino)triphenylamine, Pyrazino [2,3-f][1,10]phenanthroline-2,3-dicarbonitrile, N,N,N',N'-Tetrakis(4-methoxyphenyl)benzidine, HTM014, HTM081, HTM163, HTM222, EL-301, HTM226, HTM355, HTM133, HTM334, HTM604 and EL-22T. The abbreviations denote the manufacturers' names, for example, of Merck or Lumtec.

Metal Complex of Formula (II)

The metal complex according to Formula (II) may be non-emissive. In the context of the present specification the term "essentially non-emissive" or "non-emissive" means that the contribution of the metal complex according to Formula (II) to the visible emission spectrum from an organic electronic device, such as OLED or display device, is less than 10%, preferably less than 5% relative to the visible emission spectrum. The visible emission spectrum is an emission spectrum with a wavelength of about ≥380 nm to about ≤780 nm.

According to one embodiment the metal ion M of Formula (II) may be selected from a metal ion wherein the corresponding metal has an electronegativity value according to Allen of less than 2.4, preferably M may be selected from an alkali, alkaline earth, rare earth or transition metal, further preferred M may be selected from a metal with an atomic mass≥24 Da, in addition preferred M may be selected from a metal with an atomic mass≥24 Da and M has an oxidation number≥2.

The term "electronegativity value according to Allen" especially refers to Allen, Leland C. (1989). "Electronegativity is the average one-electron energy of the valence-shell electrons in ground-state free atoms". Journal of the American Chemical Society 111 (25): 9003-9014.

According to one embodiment of the present invention, the valency n of M is 1 or 2.

According to one embodiment of the present invention, M is selected from a metal ion wherein the corresponding metal has an electronegativity value according to Allen of less than 2.4, preferably less than 2, more preferred less than 1.9, and the valency n of M is 1 or 2.

According to one embodiment of the present invention, M is selected from an alkali, alkaline earth, rare earth or transition metal, alternatively M is selected from alkali, alkaline earth, transition or a period 4 or 5 main group metal.

According to one embodiment of the present invention, M is selected from Li, Na, K, Cs, Mg, Mn, Cu, Zn, Ag, Bi and Mo; preferably M is selected from Na, K, Cs, Mg, Mn, Cu, Zn and Ag; also preferred M is selected from Na, K, Mg, Mn, Cu, Zn and Ag, wherein if M is Cu, n is 2.

According to one embodiment of the present invention, M is not Li.

According to one embodiment of the present invention, M is not Li or K.

According to one embodiment of the present invention, M is not Ag.

According to one embodiment of the present invention, M is not Cu.

According to one embodiment of the present invention, M is not Mo.

According to one embodiment of the present invention, M is not Jr and/or Pt.

According to another embodiment the metal complex according to Formula (II) may have a has a molecular weight Mw of ≥287 and ≤2000 g/mol, preferably a molecular weight Mw of ≥400 and ≤1500 g/mol, further preferred a molecular weight Mw of ≥580 and ≤1500 g/mol, in addition preferred a molecular weight Mw of ≥580 and ≤1400 g/mol.

According to another embodiment the ligand L of Formula (II), also named L, may be selected from a group comprising:

- at least three carbon atoms, alternatively at least four carbon atoms, and/or
- at least two oxygen atoms or one oxygen and one nitrogen atom, two to four oxygen atoms, two to four oxygen atoms and zero to two nitrogen atoms, and/or
- at least one or more groups selected from halogen, F, CN, substituted or unsubstituted $C_1$ to $C_6$ alkyl, substituted or unsubstituted $C_1$ to $C_6$ alkoxy, alternatively two or more groups selected from halogen, F, CN, substituted or unsubstituted $C_1$ to $C_6$ alkyl, substituted or unsubstituted $C_1$ to $C_6$ alkoxy, at least one or more groups selected from halogen, F, CN, substituted $C_1$ to $C_6$ alkyl, substituted $C_1$ to $C_6$ alkoxy, alternatively two or more groups selected from halogen, F, CN, perfluorinated $C_1$ to $C_6$ alkyl, perfluorinated $C_1$ to $C_6$ alkoxy, one or more groups selected from substituted or unsubstituted $C_1$ to $C_6$ alkyl, substituted or unsubstituted $C_6$ to $C_{12}$ aryl, and/or substituted or unsubstituted $C_3$ to $C_{12}$ heteroaryl,
- wherein the substituents are selected from D, $C_6$ aryl, $C_3$ to $C_9$ heteroaryl, $C_1$ to $C_6$ alkyl, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkyl, partially or perdeuterated $C_1$ to $C_6$ alkoxy, $COR^6$, $COOR^6$, halogen, F or CN;
  - wherein $R^6$ may be selected from $C_6$ aryl, $C_3$ to $C_9$ heteroaryl, $C_1$ to $C_6$ alkyl, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkyl, partially or perdeuterated $C_1$ to $C_6$ alkoxy.

According to another embodiment, the ligand L of Formula (II) may be selected from a group comprising at least two carbon atoms, alternatively at least three carbon atoms, at least one oxygen atom, at least two oxygen atoms, at least one oxygen and/or nitrogen atom, one nitrogen atom and at least two oxygen atoms, at least two carbon atoms and at least one oxygen atom, at least two carbon atoms and two oxygen atoms or one oxygen and one nitrogen atom, at least one or more groups selected from halogen, F, CN, substituted or unsubstituted $C_1$ to $C_6$ alkyl, substituted or unsubstituted $C_1$ to $C_6$ alkoxy, alternatively two or more groups selected from halogen, F, CN, substituted or unsubstituted $C_1$ to $C_6$ alkyl, substituted or unsubstituted $C_1$ to $C_6$ alkoxy, at least one or more groups selected from halogen, F, CN, substituted $C_1$ to $C_6$ alkyl, substituted $C_1$ to $C_6$ alkoxy, alternatively two or more groups selected from halogen, F, CN, perfluorinated $C_1$ to $C_6$ alkyl, perfluorinated $C_1$ to $C_6$ alkoxy, one or more groups selected from substituted or unsubstituted $C_1$ to $C_6$ alkyl, substituted or unsubstituted $C_6$ to $C_{12}$ aryl, and/or substituted or unsubstituted $C_3$ to $C_{12}$ heteroaryl,

- wherein the substituents are selected from D, $C_6$ aryl, $C_3$ to $C_9$ heteroaryl, $C_1$ to $C_6$ alkyl, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkyl, partially or perdeuterated $C_1$ to $C_6$ alkoxy, $COR^6$, $COOR^6$, halogen, F or CN;
  - wherein $R^6$ may be selected from $C_6$ aryl, $C_3$ to $C_9$ heteroaryl, $C_1$ to $C_6$ alkyl, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkyl, partially or perdeuterated $C_1$ to $C_6$ alkoxy.

According to another embodiment the ligand L of Formula (II) may be selected from a group comprising F, CN, perfluorinated $C_1$ to $C_6$ alkyl, substituted or unsubstituted $C_1$ to $C_6$ alkyl, substituted or unsubstituted $C_1$ to $C_6$ alkoxy.

The substituents may be selected from D, $C_6$ aryl, $C_3$ to $C_9$ heteroaryl, $C_1$ to $C_6$ alkyl, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkyl, partially or perdeuterated $C_1$ to $C_6$ alkoxy, $COR^6$, $COOR^6$, halogen, F or CN, wherein $R^6$ may be selected from $C_6$ aryl, $C_3$ to $C_9$ heteroaryl, $C_1$ to $C_6$ alkyl, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkyl, partially or perdeuterated $C_1$ to $C_6$ alkoxy.

According to another embodiment the ligand L is free of sulfur atoms. According to another embodiment the ligand L is free of sulfur atoms or phthalocyanine groups.

According to another embodiment the ligand L of Formula (II) may be independently selected from G1 to G64, preferably G1 to G62:

(G1)

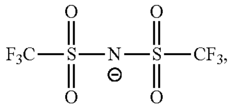

(G2)

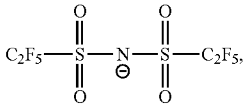

(G3)

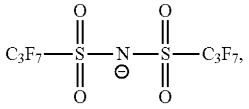

(G4)

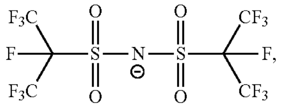

(G5)

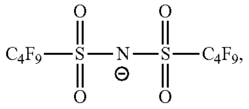

(G6)

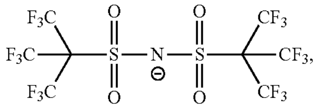

(G7)

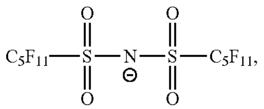

-continued (G8)

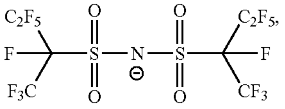

(G9)

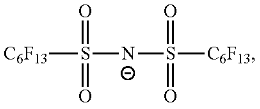

(G10)

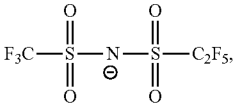

(G11)

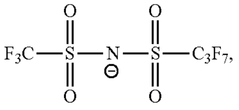

(G12)

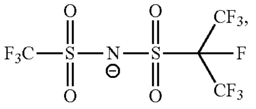

(G13)

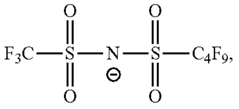

(G14)

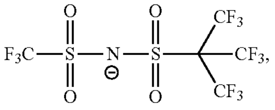

(G15)

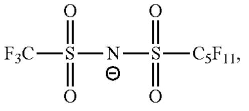

(G16)

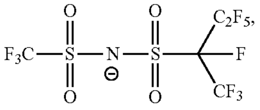

(G17)

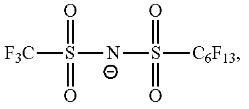

(G18)

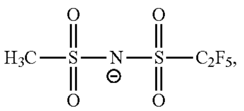

(G19)

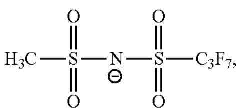

(G20)

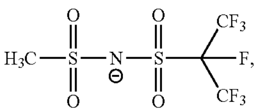

-continued
(G21)
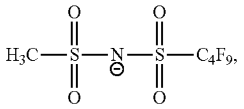
(G22)
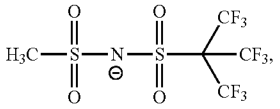
(G23)
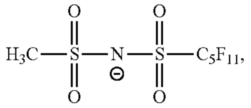
(G24)
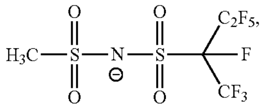
(G25)
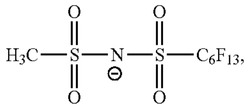
(G26)
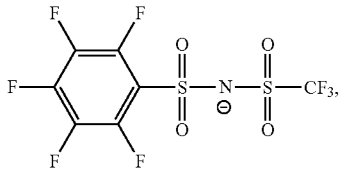
(G27)
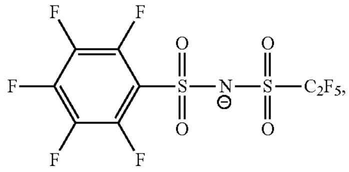
(G28)
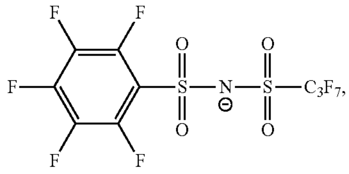
(G29)
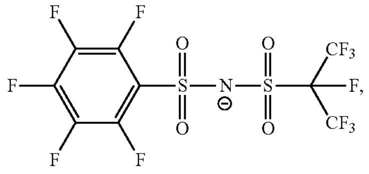
(G30)
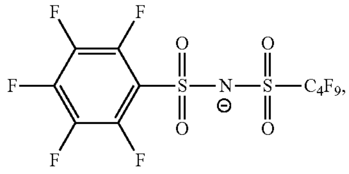
-continued
(G31)
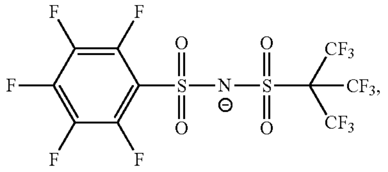
(G32)
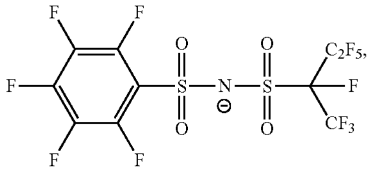
(G33)
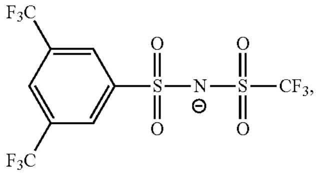
(G34)
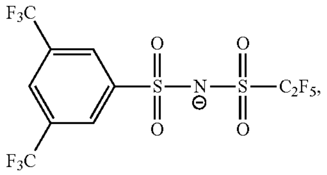
(G35)
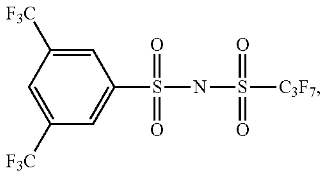
(G36)
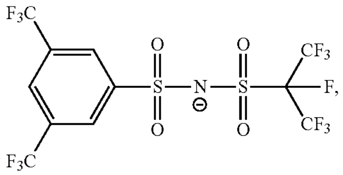
(G37)
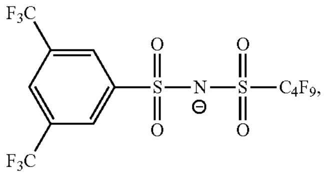
(G38)
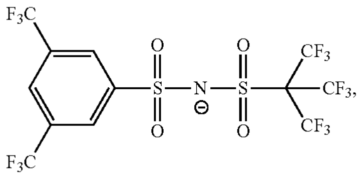

-continued
(G39)
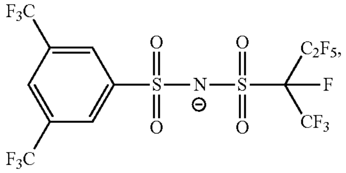
(G40)
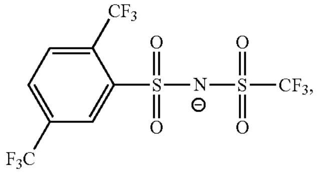
(G41)
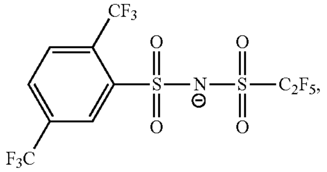
(G42)
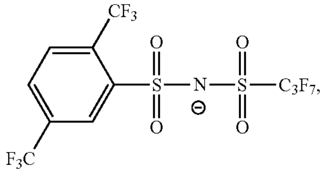
(G43)
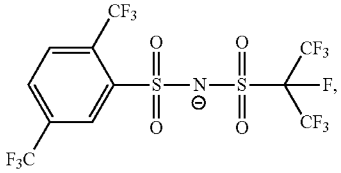
(G44)
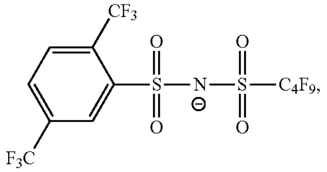
(G45)
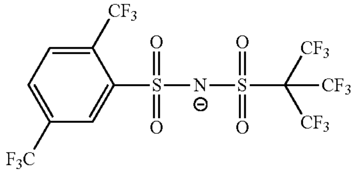
(G46)
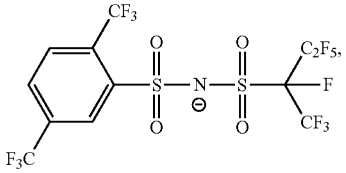
-continued
(G47)
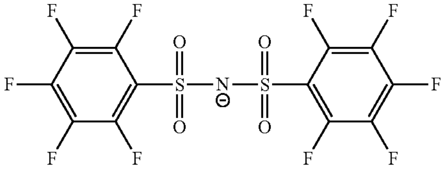
(G48)
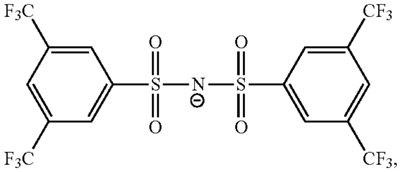
(G49)
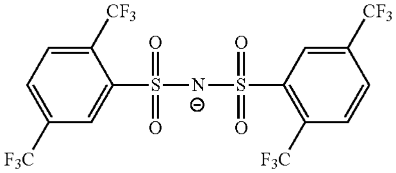
(G50)
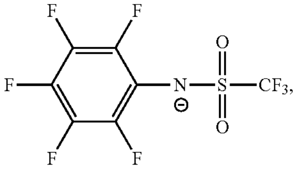
(G51)
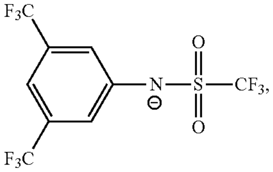
(G52)
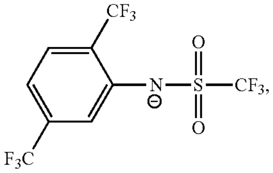
(G53)
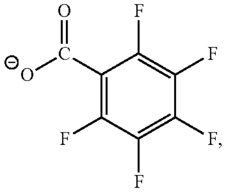
(G54)
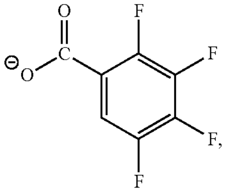

-continued (G55)

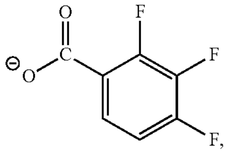

(G56)

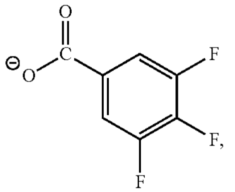

(G57)

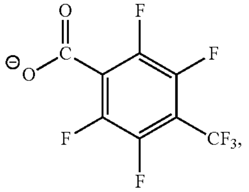

(G58)

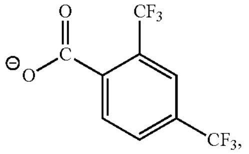

(G59)

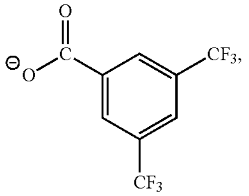

(G60)

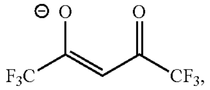

(G61)

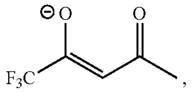

(G62)

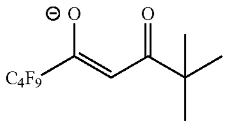

(G63)

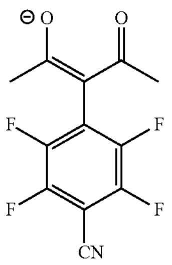

-continued (G64)

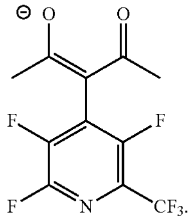

The negative charge in metal complexes of formula (II) may be delocalised partially or fully over the ligand L.

According to another embodiment, L is selected from (G1) to (G52) and (G60) to (G64).

Preferably, L is selected from (G2) to (G59), alternatively L is selected from (G2) to (G52).

Metal Complex of Formulas (IIa) to (IIe)

According to one embodiment the metal complex may be selected from the following formulas (IIa) to (IIe) and preferably be selected from the following formulas (IIa) to (IId):

(IIa)

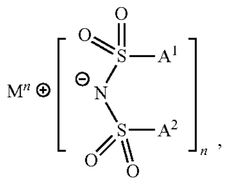

(IIb)

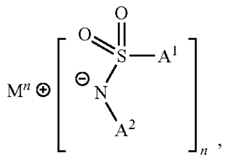

(IIc)

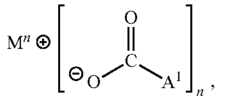

(IId)

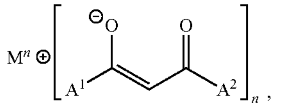

(IIe)

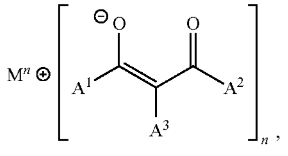

wherein

M is a metal ion;

n is the valency of M, wherein preferably n is an integer from 1 to 4; $A^1$ and $A^2$ may be independently selected from substituted or unsubstituted $C_1$ to $C_{12}$ alkyl, substituted or unsubstituted $C_6$ to $C_{12}$ aryl, substituted or unsubstituted $C_3$ to $C_{12}$ heteroaryl;

$A^3$ is selected from H, D, substituted or unsubstituted $C_1$ to $C_{12}$ alkyl, substituted or unsubstituted $C_6$ to $C_{12}$ aryl, substituted or unsubstituted $C_3$ to $C_{12}$ heteroaryl;

wherein the substituents of $A^1$, $A^2$ and/or $A^3$ may be independently selected from D, $C_6$ aryl, $C_3$ to $C_9$ heteroaryl, $C_1$ to $C_6$ alkyl, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkyl, partially or perdeuterated $C_1$ to $C_6$ alkoxy, $COR^1$, $COOR^1$, halogen, F or CN, wherein $R^1$ may be selected from $C_6$ aryl, $C_3$ to $C_9$ heteroaryl, $C_1$ to $C_6$ alkyl, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkyl, partially or perdeuterated $C_1$ to $C_6$ alkoxy.

The negative charge in metal complexes of formula (IIa), (IIb), (IIc) and/or (IId) may be delocalised partially or fully over the carbon and hetero atoms and $A^1$, $A^2$ and/or $A^3$.

According to one embodiment wherein at least one of $A^1$, $A^2$ and/or $A^3$ may comprise a substituent, wherein at least one of the substituents of $A^1$, $A^2$ and/or $A^3$ may be independently selected from $C_3$ to $C_9$ heteroaryl, $C_1$ to $C_6$ alkoxy, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkoxy, $COR^1$, $COOR^1$, halogen, F or CN; preferably at least one of $A^1$ and $A^2$ and/or $A^3$ comprises at least two substituents, wherein the substituents on $A^1$, $A^2$ and/or $A^3$ may be independently selected from $C_3$ to $C_9$ heteroaryl, $C_1$ to $C_6$ alkoxy, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkoxy, $COR^1$, $COOR^1$, halogen, F or CN; and further preferred $A^1$, $A^2$ and/or $A^3$ may comprise at least one substituent independently selected from halogen, F, $CF_3$, $C_2F_5$, $C_3F_7$, $C_4F_9$, $OCF_3$, $OC_2F_5$, or CN; and in addition preferred $A^1$, $A^2$ and/or $A^3$ may comprise at least two substituents independently selected from halogen, F, $CF_3$, $C_2F_5$, $C_3F_7$, $C_4F_9$, $OCF_3$, $OC_2F_5$ or CN.

According to one embodiment of the present invention, $A^1$, $A^2$ and/or $A^3$ may be independently selected from $CF_3$, $C_2F_5$, $C_3F_7$, $C_4F_9$, $C_5F_{11}$, $C_6F_{13}$ and/or phenyl substituted with two to five groups independently selected from F or $CF_3$, alternatively $C_2F_5$, $C_3F_7$, $C_4F_9$, $C_5F_{11}$, $C_6F_{13}$ and/or phenyl substituted with two to five groups independently selected from F or $CF_3$, alternatively $CF_3$, $C_2F_5$, $C_3F_7$, $C_4F_9$, $C_5F_{11}$, $C_6F_{13}$ or phenyl substituted with zero to two $CF_3$ groups and/or zero to five F atoms.

According to one embodiment of the present invention, the metal complex may be selected from Formula (IIa), wherein M is selected from an alkali, alkaline earth, transition or rare earth metal; and/or Formula (IIb), wherein M is selected from alkali, alkaline earth, transition or rare earth metal; and/or Formula (IIc), wherein M is selected from alkali, alkaline earth or main group metal.

According to one embodiment of the present invention, the metal complex may be selected from Formula (IIa) or (IIb), wherein M is selected from a metal ion wherein the corresponding metal has an electronegativity value according to Allen of less than 2.4, preferably M is selected from an alkali, alkaline earth, rare earth or transition metal, further preferred M is selected from a metal with an atomic mass≥24 Da, in addition preferred M is selected from a metal with an atomic mass≥24 Da and M has an oxidation number≥2; and/or Formula (IIc), wherein M is selected from Bi.

Metal complexes of the following formulas may be particularly preferred:

Li TFSI

K TFSI

Cs TFSI

Ag TFSI

Mg $(TFSI)_2$

Mn $(TFSI)_2$

Sc $(TFSI)_3$

Mg $[N(SO_2{}^iC_3F_7)_2]_2$

Zn $[N(SO_2{}^iC_3F_7)_2]_2$

Ag $[N(SO_2{}^iC_3F_7)_2]$

Ag $[N(SO_2C_3F_7)_2]$

Ag $[N(SO_2C_4F_9)_2]$

Ag $[N(SO_2CF_3)(SO_2C_4F_9)]$

Cu $[N(SO_2{}^1C_3F_7)_2]_2$

Cu $[N(SO_2C_3F_7)_2]_2$

Cu $[N(SO_2CF_3)\ (SO_2C_4F_9)]_2$

Mg $[N(SO_2CF_3)\ (SO_2C_4F_9)]_2$

Mn $[N(SO_2CF_3)\ (SO_2C_4F_9)]_2$

Cu $[N(SO_2CH_3)\ (SO_2C_4F_9)]_2$

Ag $[N(SO_2CH_3)\ (SO_2C_4F_9)]$

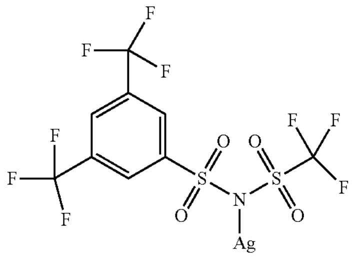

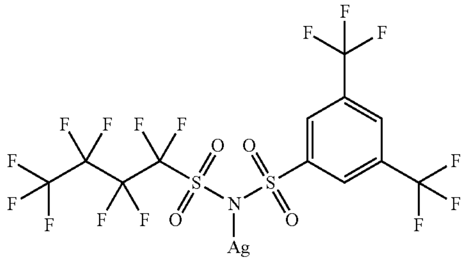

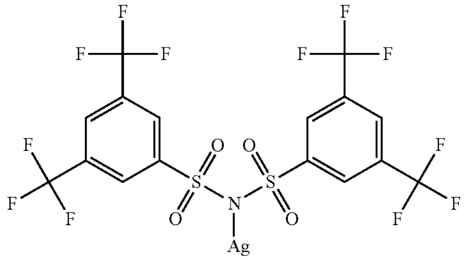

-continued

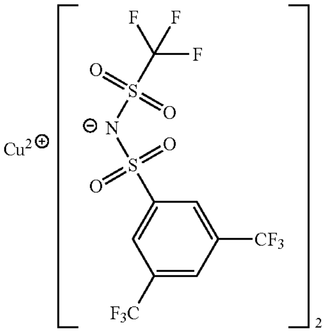

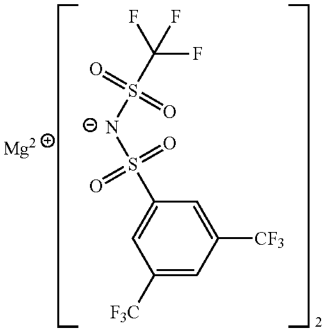

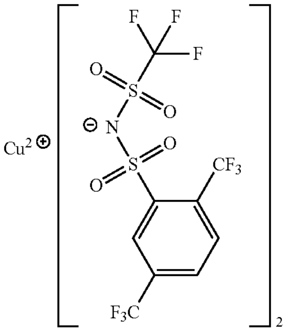

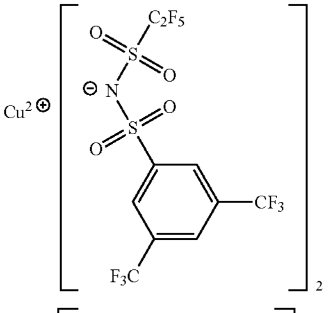

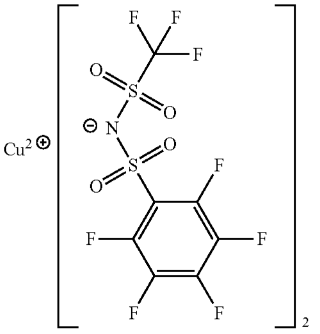

-continued

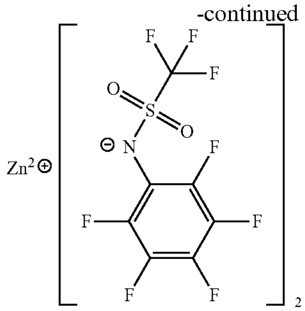

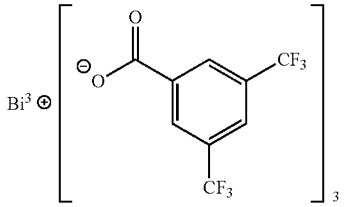

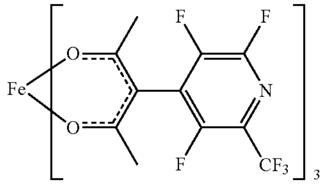

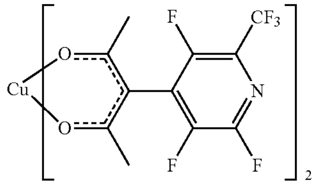

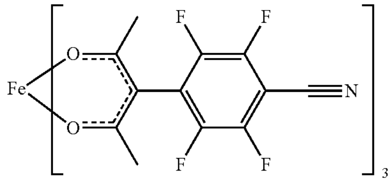

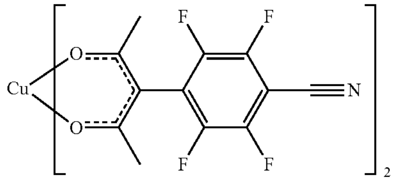

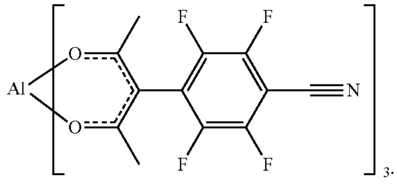

According to one embodiment, the metal complex may be free of TFSI. Thereby, the metal complex may be particularly suited to mass production of organic electronic devices.

Hole Injection Layer

According to another embodiment, the hole injection layer may comprises an organic matrix compound (OMC) and a metal complex, wherein the metal complex has the Formula (II):

$$M^{n\oplus}(L^{\ominus})^{n} \quad \text{(II)},$$

wherein

M is a metal ion, n is the valency of M, wherein n is an integer from 1 to 4,

L is a ligand.

According to another embodiment the hole injection layer may comprises an organic matrix compound (OMC) and a metal complex:

wherein the matrix compound (OMC) has the Formula (I):

$$(Ar^1)_k\text{-}(Ar^2)_m\text{-}Ar^3\text{-}(Ar^4)_p\text{-}(Ar^5)_q\text{-}(Ar^6)_r \quad \text{(I)},$$

wherein k, m, q, r may be independently selected from each other 0, 1 or 2, p is 1, 2 or 3, wherein $2 \leq k+m+q+r+p \leq 11$, $Ar^1$ to $Ar^6$ may be independently selected from substituted or unsubstituted unsaturated 5- to 7-member ring of a heterocycle, substituted or unsubstituted $C_6$ to $C_{30}$ aryl, substituted or unsubstituted $C_3$ to $C_{30}$ heteroaryl, a substituted or unsubstituted fluorene, or a fused ring system comprising 2 to 6 substituted or unsubstituted 5- to 7-member rings and the rings are selected from the group comprising (i) unsaturated 5- to 7-member ring of a heterocycle, (ii) 5- to 6-member of an aromatic heterocycle, (iii) unsaturated 5- to 7-member ring of a non-heterocycle, (iv) 6-member ring of an aromatic non-heterocycle;

$Ar^2$ if k=1, $Ar^3$, $Ar^4$ if q=1, $Ar^5$ if r=1:

may be independently selected from substituted or unsubstituted unsaturated 5- to 7-member ring of a heterocycle, substituted or unsubstituted $C_6$ to $C_{30}$ arylene, substituted or unsubstituted $C_3$ to $C_{30}$ heteroarylene, substituted or unsubstituted biphenylene, substituted or unsubstituted fluorene, substituted or unsubstituted naphthalene, substituted or unsubstituted anthracene, substituted or unsubstituted phenanthrene, substituted or unsubstituted pyrene, substituted or unsubstituted perylene, substituted or unsubstituted triphenylene, substituted or unsubstituted tetracene, substituted or unsubstituted tetraphene, substituted or unsubstituted dibenzofurane, substituted or unsubstituted dibenzothiophene, substituted or unsubstituted xanthene, substituted or unsubstituted carbazole, substituted or unsubstituted azepine, substituted or unsubstituted dibenzo[b,f]azepine, 9,9'-spirobi[fluorene], substituted or unsubstituted spiro[fluorene-9,9'-xanthene], substituted or unsubstituted 9,14-dihydrodibenzo[2,3:6,7]azepino[4,5-b]indole, or a substituted or unsubstituted aromatic fused ring system comprising at least three, preferably three to six, substituted or unsubstituted aromatic rings selected from the group comprising substituted or unsubstituted non-hetero, substituted or unsubstituted hetero 5-member rings, substituted or unsubstituted 6-member rings and/or substituted or unsubstituted 7-member rings;

$Ar^2$ if k=0, $Ar^3$ if m=0 and k=0, $Ar^4$ if q and r=0, $Ar^5$ if r=0:

may be independently selected from substituted or unsubstituted unsaturated 5- to 7-member ring of a heterocycle, substituted or unsubstituted $C_6$ to $C_{30}$ aryl, substituted or unsubstituted $C_3$ to $C_{30}$ heteroaryl, substituted or unsubstituted biphenyl, substituted or unsubstituted fluorenyl, substituted or unsubstituted naphthalenyl, substituted or unsubstituted anthracenyl, substituted or unsubstituted phenanthrenyl, substituted or unsubstituted pyrenyl, substituted or unsubstituted perylenyl, substituted or unsubstituted triphenylenyl, substituted or unsubstituted tetracenyl, substituted or unsubstituted tetraphenyl, substituted or unsubstituted dibenzofuranyl, substituted or unsubstituted dibenzothiophenyl, substituted or unsubstituted xanthenyl, substituted or unsubstituted carbazole, substituted or unsubstituted azepine, substituted or unsubstituted dibenzo[b,f]azepine, 9,9'-spirobi[fluorenyl], substituted or unsubstituted spiro[fluorenyl-9,9'-xanthene], substituted or unsubstituted 9,14-dihydrodibenzo[2,3:6,7]azepino[4,5-b]indole, or a substituted or unsubstituted aromatic fused ring system comprising at least three preferably three to six, substituted or unsubstituted aromatic rings selected from the group comprising substituted or unsubstituted non-hetero, substituted or unsubstituted hetero 5-member rings, substituted or unsubstituted 6-member rings and/or substituted or unsubstituted 7-member rings;

wherein the substituents are selected from the group H, D, $C_1$ to $C_{12}$ alkyl, unsubstituted $C_6$ to $C_{18}$ aryl, or unsubstituted $C_3$ to $C_{18}$ heteroaryl;

wherein the metal complex has the Formula (II):

$$M^{n\oplus}(L^{\ominus})_n \quad \text{(II)},$$

wherein

M is a metal ion, n is the valency of M, wherein n is an integer from 1 to 4,

L is a ligand comprising at least two carbon atoms.

According to one embodiment n is an integer from 1 to 4, preferably 1 to 3, also preferred 2 or 3.

Preferably, the hole injection layer is free of ionic liquids, metal phthalocyanine, CuPc, HAT-CN, Pyrazino[2,3-f][1,10]phenanthroline-2,3-dicarbonitrile, $F_4TCNQ$, metal fluoride and/or metal oxides, wherein the metal in the metal oxide is selected from Re and/or Mo. Thereby, the hole injection layer can be deposited under conditions suitable for mass production.

According to one embodiment the hole injection layer is arranged in direct contact with the anode layer.

The hole injection layer (HIL) may be formed on the anode layer by vacuum deposition, spin coating, printing, casting, slot-die coating, Langmuir-Blodgett (LB) deposition, or the like. When the HIL is formed using vacuum deposition, the deposition conditions may vary according to the organic matrix compound that is used to form the HIL, and the desired structure and thermal properties of the HIL. In general, however, conditions for vacuum deposition may include a deposition temperature of 100° C. to 350° C., a pressure of $10^{-8}$ to $10^{-3}$ Torr (1 Torr equals 133.322 Pa), and a deposition rate of 0.1 to 10 nm/sec.

When the HIL is formed using spin coating or printing, coating conditions may vary according to the organic matrix compound that is used to form the HIL, and the desired structure and thermal properties of the HIL. For example, the coating conditions may include a coating speed of about 2000 rpm to about 5000 rpm, and a thermal treatment temperature of about 80° C. to about 200° C. Thermal treatment removes a solvent after the coating is performed.

The HIL may be formed of any organic matrix compound of Formula (I) and of a metal complex of Formula (II), (IIa) to (IIe) and preferably (II), (IIa) to (IId).

The thickness of the HIL may be in the range from about 1 nm to about 15 nm, and for example, from about 2 nm to about 12 nm, alternatively about 3 nm to about 10 nm.

When the thickness of the HIL is within this range, the HIL may have excellent hole injecting characteristics, without a substantial penalty in operating voltage.

According to one embodiment of the present invention, the hole injection layer may comprise:

at least about ≥5 wt.-% to about ≤90 wt.-%, preferably about ≥30 wt.-% to about ≤80 wt.-%, and more preferred about ≥40 wt.-% to about ≤80 wt.-%, also preferred about ≥50 wt.-% to about ≤80 wt.-% of an organic matrix compound or an organic matrix compound of Formula (I), and at least about ≥10 wt.-% to about ≤95 wt.-%, preferably about ≥20 wt.-% to about ≤70 wt.-%, and more preferred about ≥20 wt.-% to about ≤60 wt.-%, also preferred about ≥20 wt.-% to about ≤50 wt.-% of a metal complex of Formula (II), (IIa) to (IIe) and preferably (II), (IIa) to (IId); preferably the wt.-% of the metal complex of Formula (II), (IIa) to (IIe) and preferably (II), (IIa) to (IId), is lower than the wt.-% of the organic matrix compound or organic matrix according to Formula (I); wherein the weight-% of the components are based on the total weight of the hole injection layer.

According to one embodiment of the present invention, the hole injection layer may comprise:

at least about ≥5 vol.-% to about ≤90 vol.-%, preferably about ≥30 vol.-% to about <80 vol.-%, and more preferred about ≥40 vol.-% to about <80 vol.-%, also preferred about ≥50 vol.-% to about <80 vol.-% of an organic matrix compound or an organic matrix compound of Formula (I), and at least about ≥10 vol.-% to about <95 vol.-%, preferably about ≥20 vol.-% to about <70 vol.-%, and more preferred about ≥20 vol.-% to about <60 vol.-%, also preferred about ≥20 vol.-% to about <50 vol.-% of a metal complex of Formula (II), (IIa) to (IIe) and preferably (II), (IIa) to (IId); preferably the vol.-% of the metal complex of Formula (II), (IIa) to (IIe) and preferably (II), (IIa) to (IId), is lower than the vol.-% of the organic matrix compound or organic matrix compound according to Formula (I); wherein the weight-% of the components are based on the total weight of the hole injection layer.

Preferably, the hole injection layer is free of ionic liquids, metal phthalocyanine, ZnPc, CuPc, HAT-CN, Pyrazino[2,3-f][1,10]phenanthroline-2,3-dicarbonitrile, $F_4TCNQ$, metal fluoride and/or metal oxides, wherein the metal in the metal oxide is selected from Re and/or Mo. Thereby, the hole injection layer can be deposited under conditions suitable for mass production.

Organic Electronic Device

According to one embodiment, the organic electronic device may comprise the hole injection layer, wherein the hole injection layer comprises a first sub-layer comprising the metal complex of Formula (II) and a second sub-layer comprising the organic matrix compound or the organic matrix compound (OMC) of Formula (I), wherein the first sub-layer is arranged closer to the anode layer and the second sub-layer is arranged closer to the at least one emission layer. It can be preferred that the metal complex selected the same in both sub-layers, such as first sub-layer and second sub-layer.

According to one embodiment, the organic electronic device may comprise the hole injection layer that comprises a first sub-layer comprising the metal complex of Formula (II) and a second sub-layer comprising the organic matrix compound (OMC) and the metal complex, wherein the first sub-layer is arranged closer to the anode layer and the second sub-layer is arranged closer to the at least one emission layer.

According to one embodiment, the organic electronic device may comprise the hole injection layer, which comprises a first sub-layer comprising the metal complex of Formula (II) and a second sub-layer comprising the organic matrix compound (OMC) according the present invention and the metal complex according to Formula (II), wherein the first sub-layer is arranged closer to the anode layer and the second sub-layer is arranged closer to the at least one emission layer.

According to one embodiment of the present invention, the organic electronic device may comprise the hole injection layer that comprises a first sub-layer consisting of the metal complex of Formula (II) and a second sub-layer comprising the organic matrix compound (OMC) according the present invention, wherein the first sub-layer is arranged closer to the anode layer and the second sub-layer is arranged closer to the at least one emission layer.

In the context of the present specification the term "consisting essentially of" especially means and/or includes a concentration of ≥90% (vol/vol) more preferred≥95% (vol/vol) and most preferred≥99% (vol/vol). According to one embodiment of the present invention, the organic electronic device may comprises the hole injection layer that comprises a first sub-layer consisting of the metal complex of Formula (II) and a second sub-layer comprising the organic matrix compound (OMC) according the present invention, wherein the first sub-layer is arranged closer to the anode layer and the second sub-layer is arranged closer to the at least one emission layer, wherein in Formula (II) M is selected from Li, Na, K, Cs, Mg, Mn, Cu, Zn, Ag, Bi and Mo, alternatively Mg, Mn, Cu, Zn, Ag, Bi and Mo, alternatively Cu, Zn, Ag or Bi.

According to one embodiment, the organic electronic device may comprise the hole injection layer, which comprises a first sub-layer comprising the metal complex of Formula (II) and a second sub-layer comprising the organic matrix compound (OMC) according the present invention and the metal complex, wherein the first sub-layer is arranged closer to the anode layer and the second sub-layer is arranged closer to the at least one emission layer.

Further Layers

In accordance with the invention, the organic electronic device may comprise, besides the layers already mentioned above, further layers. Exemplary embodiments of respective layers are described in the following:

Substrate

The substrate may be any substrate that is commonly used in manufacturing of, electronic devices, such as organic light-emitting diodes. If light is to be emitted through the substrate, the substrate shall be a transparent or semitransparent material, for example a glass substrate or a transparent plastic substrate. If light is to be emitted through the top surface, the substrate may be both a transparent as well as a non-transparent material, for example a glass substrate, a plastic substrate, a metal substrate or a silicon substrate.

Anode Layer

The anode layer may be formed by depositing or sputtering a material that is used to form the anode layer. The material used to form the anode layer may be a high work-function material, so as to facilitate hole injection. The anode material may also be selected from a low work function material (i.e. aluminum). The anode layer may be a transparent or reflective electrode. Transparent conductive oxides, such as indium tin oxide (ITO), indium zinc oxide (IZO), tin-dioxide ($SnO_2$), aluminum zinc oxide (AlZO) and zinc oxide (ZnO), may be used to form the anode layer. The anode layer may also be formed using metals, typically silver (Ag), gold (Au), or metal alloys.

Hole Transport Layer

According to one embodiment, the organic electronic device further comprises a hole transport layer, wherein the hole transport layer is arranged between the hole injection layer and the at least one emission layer.

According to one embodiment, wherein the organic electronic device may further comprises a hole transport layer, wherein the hole transport layer can be arranged between the hole injection layer and the at least one emission layer.

According to one embodiment, the hole transport layer comprises an organic matrix compound (OMC) according the present invention, preferably the organic matrix compound (OMC) in the hole injection layer and hole transport layer are selected the same According to one embodiment, wherein the organic electronic device may comprises a hole transport layer, wherein the hole transport layer comprises the organic matrix compound or the organic matrix compound of formula (I), preferably the organic matrix compound or the organic matrix compound of formula (I) in the hole injection layer and in the hole transport layer may be selected the same.

According to one embodiment, the hole injection layer and hole transport layer comprise an organic matrix compound (OMC) of Formula (I) and the at least one emission layer comprises an emitter matrix compound (EMC) of Formula (I), wherein in Formula (I) the $Ar^3$ group is selected the same.

According to one embodiment, the hole injection layer and hole transport layer comprise an organic matrix compound (OMC) of Formula (I) and the at least one emission layer comprises an emitter matrix compound (EMC) of Formula (I), wherein in Formula (I) the $Ar^3$ group is selected anthracene.

According to another embodiment, wherein the organic electronic device may comprises a hole transport layer, wherein the hole transport layer may comprises the organic matrix compound or the organic matrix compound of formula (I); wherein the organic matrix compound or the organic matrix compound of formula (I) in the hole injection layer and hole transport layer are selected the same.

According to one embodiment, wherein the hole transport layer may comprises the organic matrix compound or the organic matrix compound of formula (I); wherein the organic matrix compound or the organic matrix compound of formula (I) may be free of hetero-atoms which are not part of an aromatic ring and/or part of an unsaturated 7-member-ring, preferably the organic matrix compound or the organic matrix compound according to Formula (I) may be free on N-atoms except N-atoms which are part of an aromatic ring or are part of an unsaturated 7-member-ring.

According to one embodiment, wherein the hole transport layer may comprises the organic matrix compound or the organic matrix compound of formula (I); wherein the organic matrix compound or the organic matrix compound of formula (I) in the hole injection layer and hole transport layer are selected the same and the organic matrix compound or the organic matrix compound of formula (I) comprises two carbazole groups, at least one dibenzofurane group, at least one dibenzothiophene group and/or at least one anthracene group.

According to one embodiment, wherein the hole transport layer may comprises the organic matrix compound or the organic matrix compound of formula (I); wherein the organic matrix compound or the organic matrix compound of formula (I) in the hole injection layer and hole transport layer are selected the same and the organic matrix compound or the organic matrix compound of formula (I) comprises two carbazole groups, one to three dibenzofurane groups, one to three dibenzothiophene groups and/or one to two anthracene groups.

According to one embodiment, wherein the hole transport layer may comprises the organic matrix compound or the organic matrix compound of formula (I); wherein the organic matrix compound or the organic matrix compound of formula (I) in the hole injection layer and hole transport layer are selected the same and wherein for the organic matrix compound according to Formula (I):

$Ar^3$ may be selected from D1 to D15, preferably D1 to D6:

(D1)

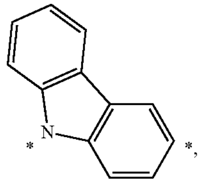

(D2)

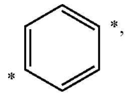

(D3)

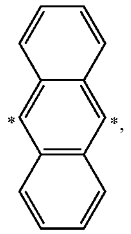

(D4)

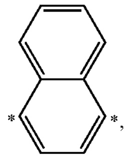

(D5)

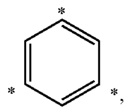

(D6)

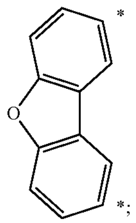

(D7)

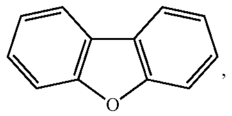

-continued (D8)

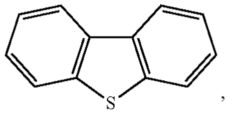

, (D9)

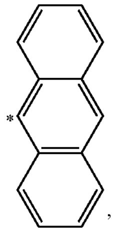

, (D10)

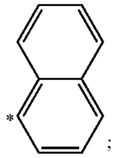

;

(D11)

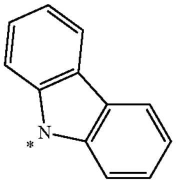

, (D12)

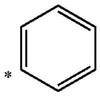

, (D13)

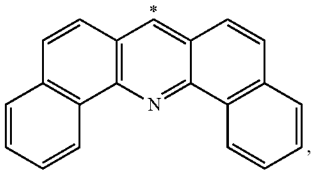

, (D14)

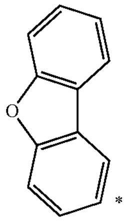

(D15)

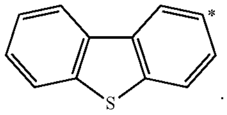

.

According to one embodiment, wherein $Ar^1$ may be selected from D7 to D13. $Ar^2$ may selected from D1 to D6, or D7 to D13. $Ar^4$ may be selected from D1 to D6, or D7 to D13. $Ar^5$ may be selected from D1 to D6, or D7 to D13. $Ar^6$ may be selected from D7 to D13.

According to one embodiment, wherein in Formula (I) the $Ar^3$ group is selected from anthracene, carbazole, dibenzothiophene and/or dibenzofurane.

According to one embodiment, wherein in Formula (I) the $Ar^3$ group is selected anthracene.

According to one embodiment, wherein in Formula (I) the $Ar^3$ group is selected from carbazole, dibenzothiophene and/or dibenzofurane.

According to one embodiment, wherein the hole transport layer may comprises the organic matrix compound or the organic matrix compound of formula (I); wherein the organic matrix compound or the organic matrix compound of formula (I) in the hole injection layer and hole transport layer are selected the same and wherein the organic matrix compound or the organic matrix compound of formula (I) may be selected from F1 to F13:

(F1)

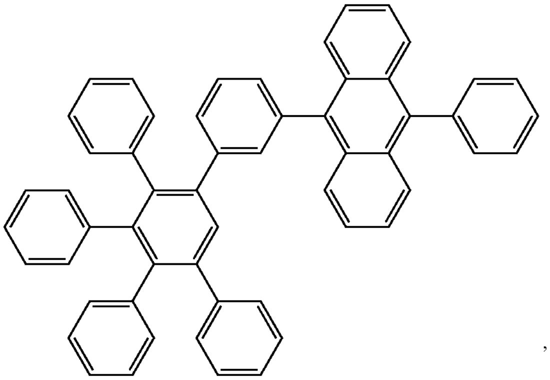

, (F2)

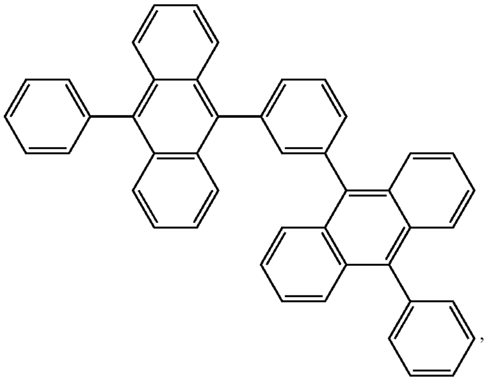

, (F3)

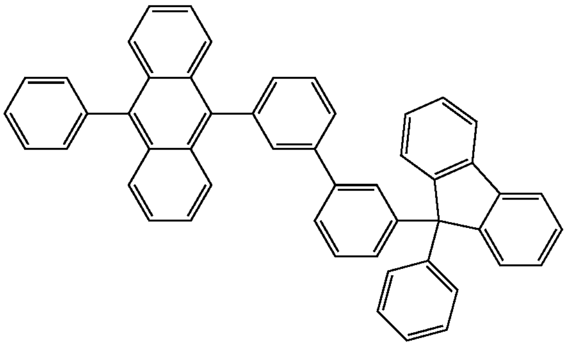

,

-continued
(F4)
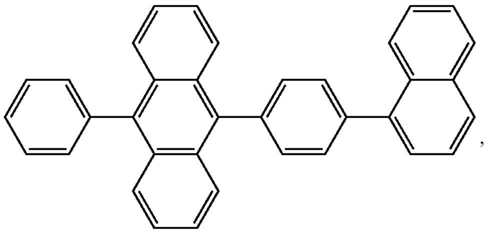
,
(F5)
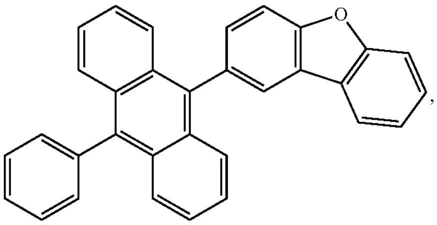
,
(F6)
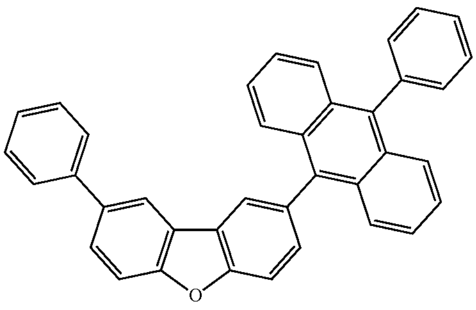
,
(F7)
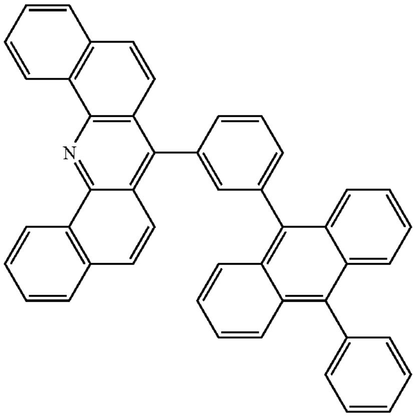
,
-continued
(F8)
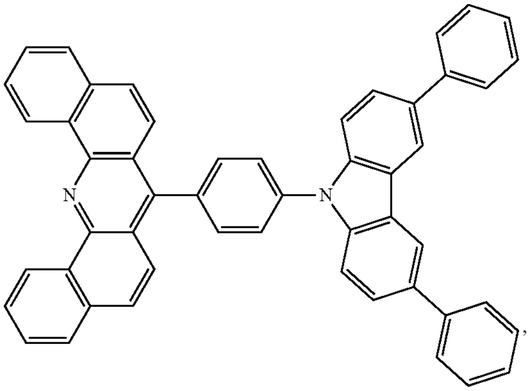
,
(F9)
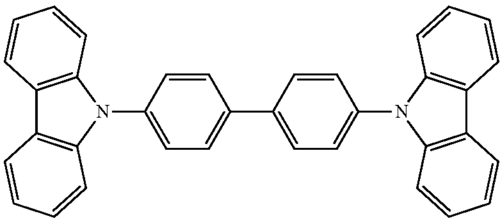
,
(F10)
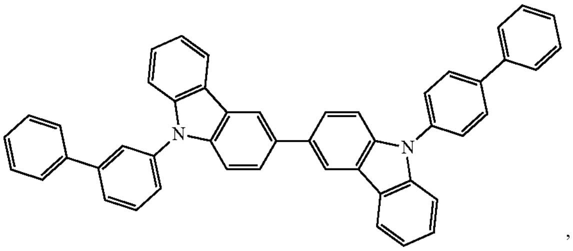
,
(F11)
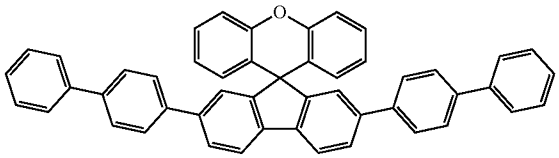
,
(F12)
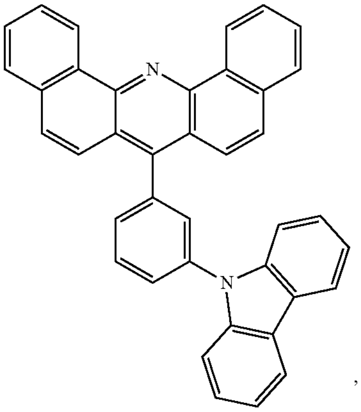
, -continued (F13)

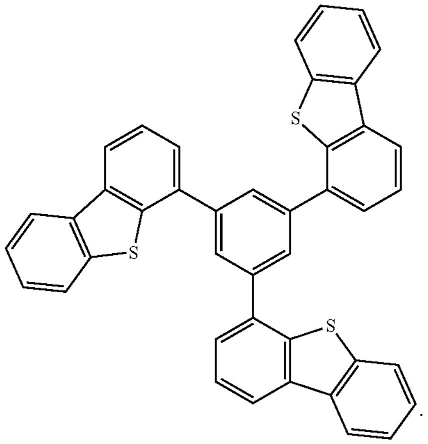

The hole transport layer may be free of HTM014, HTM081, HTM163, HTM222, EL-301, HTM226, HTM355, HTM133, HTM334, HTM604 and EL-22T. The abbreviations denote the manufacturers' names, for example, of Merck or Lumtec.

The hole transport layer may be free of N,N'-Bis(naphthalen-1-yl)-N,N'-bis(phenyl)-9,9-dimethyl-fluorene, N,N'-Bis(3-methylphenyl)-N,N'-bis(phenyl)-9,9-dimethyl-fluorene, N,N'-Bis(naphthalen-1-yl)-N,N'-bis(phenyl)-9,9-dimethyl-fluorene, N,N'-Bis(naphthalen-1-yl)-N,N'-bis(phenyl)-2,2-dimethylbenzidine, N,N'-Bis(3-methylphenyl)-N,N'-bis(phenyl)-9,9-spirobifluorene, 2,2',7,7'-Tetrakis(N,N-diphenylamino)-9,9'-spirobifluorene, N,N'-Bis(naphthalen-1-yl)-N,N'-bis(phenyl)-benzidine, N,N'-Bis(naphthalen-2-yl)-N,N'-bis(phenyl)-benzidine, N,N'-Bis(3-methylphenyl)-N,N'-bis(phenyl)-benzidine, N,N'-Bis(3-methylphenyl)-N,N'-bis(phenyl)-9,9-dimethyl-fluorene, N,N'-Bis(naphthalen-1-yl)-N,N'-bis(phenyl)-9,9-spirobifluorene, Di-[4-(N,N-ditolyl-amino)-phenyl]cyclohexane, 2,2',7,7'-tetra(N,N-di-tolyl)amino-spiro-bifluorene, 9,9-Bis[4-(N,N-bis-biphenyl-4-yl-amino)phenyl]-9H-fluorene, 2,2',7,7'-Tetrakis(N,N-naphthalenyl(phenyl)-amino]-9,9'-spiro-bifluorene, 2,7-Bis(N,N-bis(9,9-spiro-bifluorene-2-yl)-amino[−9,9'-spirobifluorene, 2,2'-Bis(N,N-bis(biphenyl-4-yl)amino]-9,9'-spirobifluorene, N,N'-bis(phenanthren-9-yl)-N,N'-bis(phenyl)-benzidine, N,N,N',N'-tetra-naphthalen-2-yl)-benzidine, 2,2'-Bis(N,N-di-phenyl-amino)-9,9-spirobifluorene, 9,9-Bis[4-(N,N-bis-naphthalen-2-yl-amino)phenyl]-9H-fluorene, 9,9-Bis[4-(N,N'-bis-naphthalen-2-yl-N,N'-bis-phenyl-amino)-phenyl]-9H-fluorene, Titanium oxide phthalocyanine, Copper phthalocyanine, 2,3,5,6 Tetrafluoro 7,7,8,8, tetracyano-quinodimethane, 4,4'4"-Tris(N-3-methylphenyl-N-phenyl-amino)triphenylamine, 4,4',4"-Tris(N-(2-naphthyl)-N-phenyl-amino)triphenylamine, 4,4',4"-Tris(N-(1-naphthyl)-N-phenyl-amino)triphenylamine, 4,4',4"-Tris(N,N-diphenyl-amino)triphenylamine, Pyrazino[2,3-f][1,10]phenanthroline-2,3-dicarbonitrile, N,N,N',N'-Tetrakis(4-methoxyphenyl)benzidine, HTM014, HTM081, HTM163, HTM222, EL-301, HTM226, HTM355, HTM133, HTM334, HTM604 and EL-22T. The abbreviations denote the manufacturers' names, for example, of Merck or Lumtec.

The hole transport layer (HTL) may be formed on the HIL by vacuum deposition, spin coating, slot-die coating, printing, casting, Langmuir-Blodgett (LB) deposition, or the like. When the HTL is formed by vacuum deposition or spin coating, the conditions for deposition and coating may be similar to those for the formation of the HIL. However, the conditions for the vacuum or solution deposition may vary, according to the compound that is used to form the HTL.

The thickness of the HTL may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 200 nm, further about 100 nm to about 180 nm, further about 120 nm to about 170 nm.

When the thickness of the HTL is within this range, the HTL may have excellent hole transporting characteristics, without a substantial penalty in operating voltage.

Electron Blocking Layer

The function of an electron blocking layer (EBL) is to prevent electrons from being transferred from an emission layer to the hole transport layer and thereby confine electrons to the emission layer. Thereby, efficiency, operating voltage and/or lifetime may be improved.

If the electron blocking layer has a high triplet level, it may also be described as triplet control layer.

The function of the triplet control layer is to reduce quenching of triplets if a phosphorescent green or blue emission layer is used. Thereby, higher efficiency of light emission from a phosphorescent emission layer can be achieved. The triplet control layer may be selected from triarylamine compounds with a triplet level above the triplet level of the phosphorescent emitter in the adjacent emission layer.

The thickness of the electron blocking layer may be selected between 2 and 20 nm.

Emission Layer (EML)

According to one embodiment, the organic electronic device of the present invention comprises a first and a second emission layer, wherein the first and second emission layer are arranged between the hole injection layer and the cathode layer. Further emission layers may be arranged between the second emission layer and the cathode layer.

The at least one emission layer (EML) may be formed on the HTL or EBL by vacuum deposition, spin coating, slot-die coating, printing, casting, LB deposition, or the like. When the at least one EML is formed using vacuum deposition or spin coating, the conditions for deposition and coating may be similar to those for the formation of the HIL. However, the conditions for deposition and coating may vary, according to the compound that is used to form the at least one EML.

It may be provided that the at least one emission layer does not comprise the organic matrix compound of Formula (I).

The at least one emission layer (EML) may be formed of a combination of an emitter matrix compound (EMC) and an emitter dopant.

The emitter dopant may be a phosphorescent or fluorescent emitter. Phosphorescent emitters and emitters which emit light via a thermally activated delayed fluorescence (TADF) mechanism may be preferred due to their higher efficiency. The emitter may be a small molecule or a polymer.

Examples of red emitter dopants are PtOEP, Ir(piq)3, and Btp2Ir(acac), but are not limited thereto. These compounds are phosphorescent emitters, however, fluorescent red emitter dopants could also be used.

Examples of phosphorescent green emitter dopants are Ir(ppy)3 (ppy=phenylpyridine), Ir(ppy)2(acac), Ir(mpyp)3.

Examples of phosphorescent blue emitter dopants are F2Irpic, (F2ppy)2Ir(tmd) and Ir(dfppz)3 and ter-fluorene.

4.4'-bis(4-diphenyl amiostyryl)biphenyl (DPAVBi), 2,5,8,11-tetra-tert-butyl perylene (TBPe) are examples of fluorescent blue emitter dopants.

The amount of the emitter dopant may be in the range from about 0.01 to about 50 parts by weight, based on 100 parts by weight of the host. Alternatively, the emission layer may consist of a light-emitting polymer.

According to one embodiment, the organic electronic device may comprise at least one emission layer, wherein the at least one emission layer can be arranged between the hole injection layer and the cathode layer. Preferably, the organic electronic device of the present invention comprises one emission layer, wherein the emission layer is arranged between the hole injection layer and the cathode layer.

According to one embodiment, the organic electronic device comprises at least one emission layer and a hole transport layer, wherein the at least one emission layer is arranged between the hole transport layer and the cathode layer.

According to one embodiment, the organic electronic device comprises a hole injection layer comprising organic matrix compound of formula (I), a hole transport layer comprising organic matrix compound of formula (I) and at least one emission layer comprising an emitter matrix compound of formula (I). Preferably, the organic matrix compound of formula (I) and the emitter matrix compound of formula (I) are selected differently.

According to one embodiment, the emitter matrix compound or the emitter matrix compound of formula (I) comprises two carbazole groups, at least one dibenzofurane group, at least one dibenzothiophene group and/or at least one anthracene group.

According to one embodiment, the emitter matrix compound or the emitter matrix compound of formula (I) comprises two carbazole groups, one to three dibenzofurane groups, one to three dibenzothiophene groups and/or one to two anthracene groups.

According to one embodiment, wherein the at least one emission layer may comprises the emitter matrix compound or the emitter matrix compound of formula (I); wherein for the emitter matrix compound according to Formula (I):

$Ar^3$ may be selected from D1 to D15, preferably D1 to D6:

(D1)

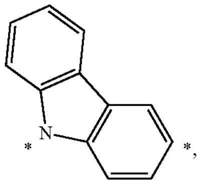

(D2)

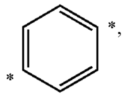

(D3)

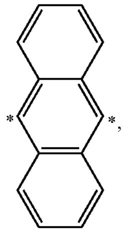

-continued (D4)

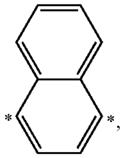

(D5)

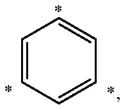

(D6)

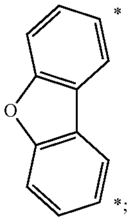

(D7)

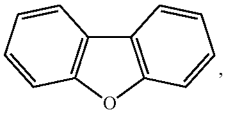

(D8)

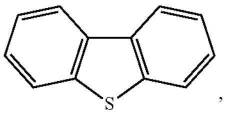

(D9)

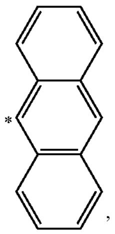

(D10)

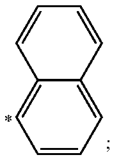

(D11)

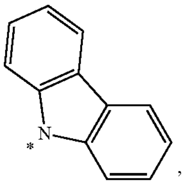

(D12)

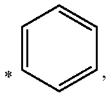

-continued (D13)

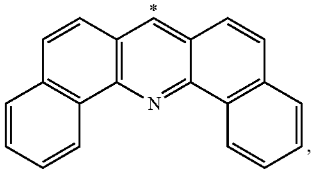

(D14)

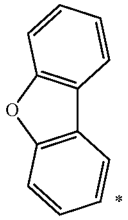

(D15)

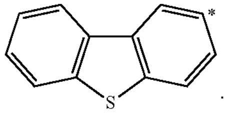

According to one embodiment, wherein $Ar^1$ may be selected from D7 to D13. $Ar^2$ may selected from D1 to D6, or D7 to D13. $Ar^4$ may be selected from D1 to D6, or D7 to D13. $Ar^5$ may be selected from D1 to D6, or D7 to D13. $Ar^6$ may be selected from D7 to D13. According to one embodiment, wherein the at least one emission layer may comprises the emitter matrix compound or the emitter matrix compound of formula (I); wherein for the emitter matrix compound of formula (I):

$Ar^3$ may be selected from D1 to D15, preferably D1 to D6:

(D1)

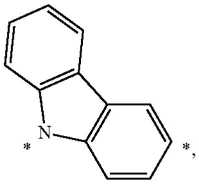

(D2)

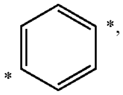

(D3)

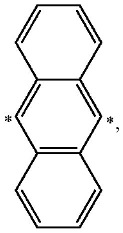

(D4)

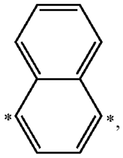

-continued (D5)

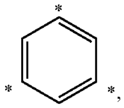

(D6)

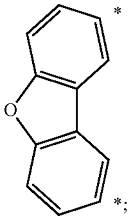

(D7)

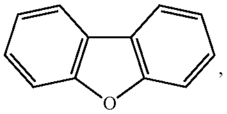

(D8)

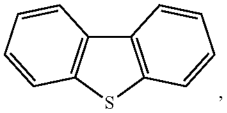

(D9)

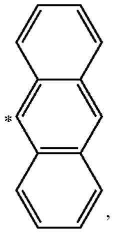

(D10)

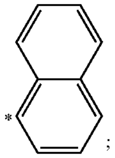

(D11)

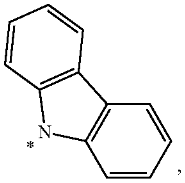

(D12)

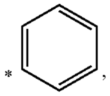

(D13)

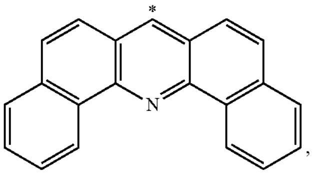

-continued (D14)

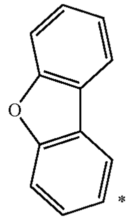

(D15)

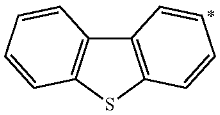

;

Ar[1] may be selected from D7 to D15, if m>0 and k>0, or may be selected from D7 to D15, if k>0 and m=0, or may be selected from D1 to D6, if k>1;

Ar[2] may be selected from D1 to D6, if m>0 and k>0; or may be selected from D7 to D15, if m>0 and k=0;

Ar[4] may be selected from D1 to D6, if q>0, or may be selected from D1 to D6, if q=0 and r>0; or may be selected from D7 to D15, if q and r=0;

Ar[5] may be selected from D1 to D6, if q>0 and r>0, or may be selected from D7 to D15, ifq>0 and r=0;

Ar[6] may be selected from D7 to D15, if r>0, q>0, or may be selected from D7 to D15, if r>0, q=0, or may be selected from D1 to D6, if r>1.

According to one embodiment, the emitter matrix compound or the emitter matrix compound of formula (I) may comprise an anthracene group, alternatively Ar[3] may be selected from anthracene.

According to one embodiment, the emitter matrix compound or the emitter matrix compound of formula (I) may be selected from F1 to F13:

(F1)

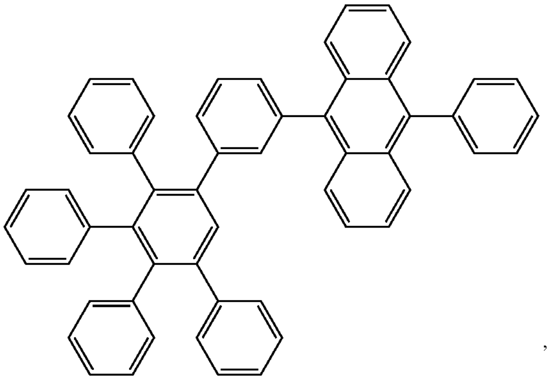

,

-continued (F2)

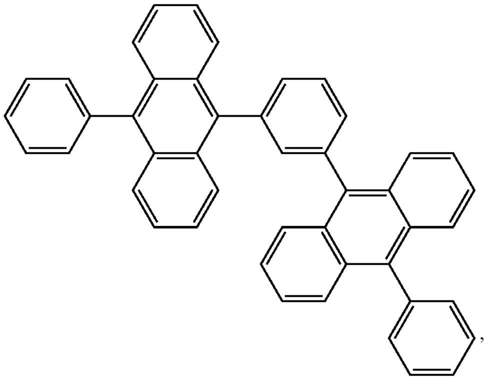

, (F3)

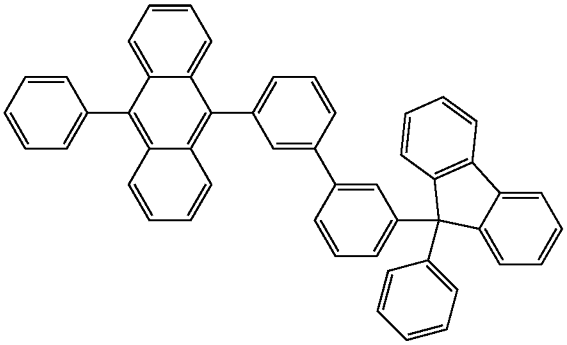

, (F4)

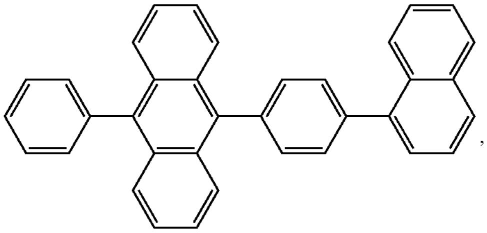

, (F5)

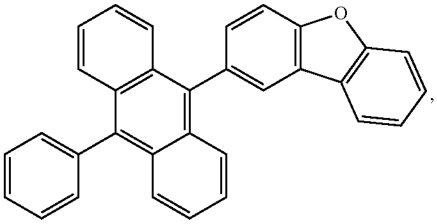

, (F6)

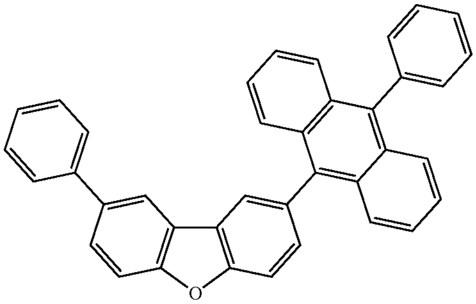

,

-continued (F7)

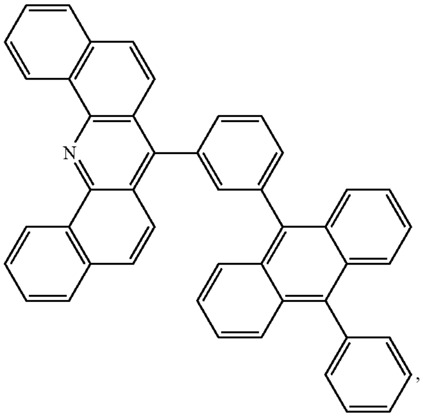

, (F8)

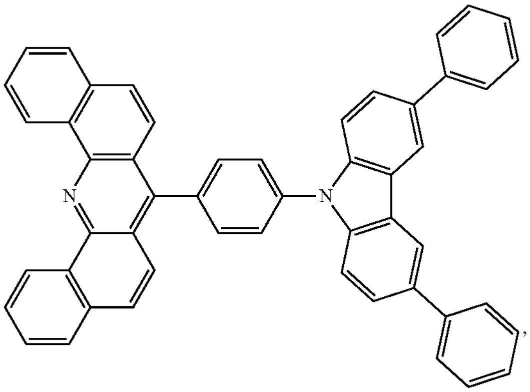

, (F9)

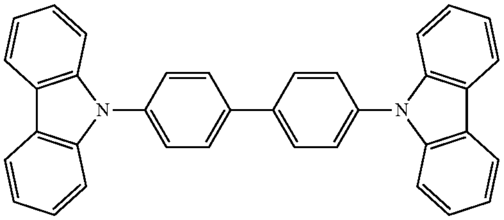

, (F10)

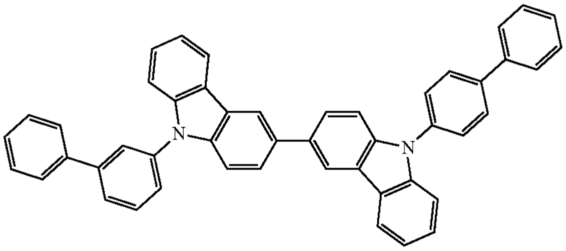

, (F11)

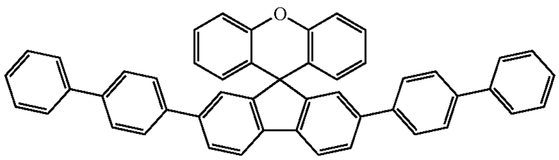

,

-continued (F12)

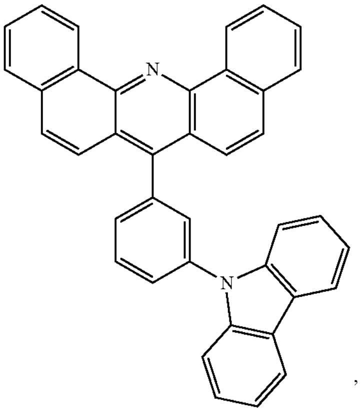

, (F13)

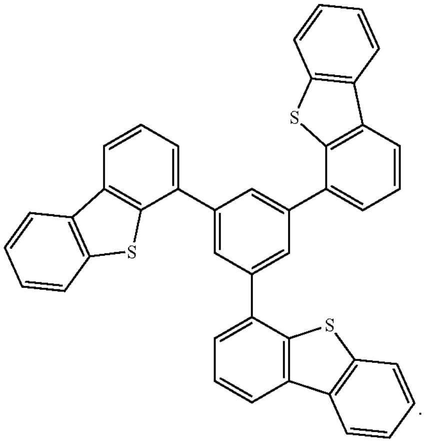

.

According to one embodiment, the emitter matrix compound or emitter matrix compound of formula (I) may be selected from F1 to F11, preferably from F2 to F6.

The at least one EML may have a thickness of about 10 nm to about 100 nm, for example, from about 20 nm to about 60 nm. When the thickness of the EML is within this range, the EML may have excellent light emission, without a substantial penalty in operating voltage.

Hole Blocking Layer (HBL)

A hole blocking layer (HBL) may be formed on the at least one EML, by using vacuum deposition, spin coating, slot-die coating, printing, casting, LB deposition, or the like, in order to prevent the diffusion of holes into the ETL. When the at least one EML comprises a phosphorescent dopant, the HBL may have also a triplet exciton blocking function.

The HBL may also be named auxiliary ETL or a-ETL.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include oxadiazole derivatives, triazole derivatives, phenanthroline derivatives and triazine derivatives.

The HBL may have a thickness in the range from about 5 nm to about 100 nm, for example, from about 10 nm to about 30 nm. When the thickness of the HBL is within this range, the HBL may have excellent hole-blocking properties, without a substantial penalty in operating voltage.

Electron Transport Layer (ETL)

The organic electronic device according to the present invention may further comprise an electron transport layer (ETL).

According to another embodiment of the present invention, the electron transport layer may further comprise an azine compound, preferably a triazine compound.

In one embodiment, the electron transport layer may further comprise a dopant selected from an alkali organic complex, preferably LiQ The thickness of the ETL may be in the range from about 15 nm to about 50 nm, for example, in the range from about 20 nm to about 40 nm. When the thickness of the EIL is within this range, the ETL may have satisfactory electron-injecting properties, without a substantial penalty in operating voltage.

According to another embodiment of the present invention, the organic electronic device may further comprise a hole blocking layer and an electron transport layer, wherein the hole blocking layer and the electron transport layer comprise an azine compound. Preferably, the azine compound is a triazine compound.

Electron Injection Layer (EIL)

An optional EIL, which may facilitates injection of electrons from the cathode, may be formed on the ETL, preferably directly on the electron transport layer. Examples of materials for forming the EIL include lithium 8-hydroxyquinolinolate (LiQ), LiF, NaCl, CsF, Li2O, BaO, Ca, Ba, Yb, Mg which are known in the art. Deposition and coating conditions for forming the EIL are similar to those for formation of the HIL, although the deposition and coating conditions may vary, according to the material that is used to form the EIL.

The thickness of the EIL may be in the range from about 0.1 nm to about 10 nm, for example, in the range from about 0.5 nm to about 9 nm. When the thickness of the EIL is within this range, the EIL may have satisfactory electron-injecting properties, without a substantial penalty in operating voltage.

Cathode Layer

The cathode layer is formed on the ETL or optional EIL. The cathode layer may be formed of a metal, an alloy, an electrically conductive compound, or a mixture thereof. The cathode layer may have a low work function. For example, the cathode layer may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. Alternatively, the cathode layer may be formed of a transparent conductive oxide, such as ITO or IZO.

The thickness of the cathode layer may be in the range from about 5 nm to about 1000 nm, for example, in the range from about 10 nm to about 100 nm. When the thickness of the cathode layer is in the range from about 5 nm to about 50 nm, the cathode layer may be transparent or semitransparent even if formed from a metal or metal alloy.

It is to be understood that the cathode layer is not part of an electron injection layer or the electron transport layer.

Organic Light-Emitting Diode (OLED)

The organic electronic device according to the invention may be a light emitting device or a display device.

According to one aspect of the present invention, there is provided an organic light-emitting diode (OLED) comprising: a substrate; an anode layer formed on the substrate; a hole injection layer comprising an organic matrix compound or an organic matrix compound of Formula (I) and a metal complex of Formula (II), a hole transport layer, at least one emission layer comprising at least one emitter matrix compound or emitter matrix compound of formula (I), an electron transport layer and a cathode layer.

According to another aspect of the present invention, there is provided an organic electronic device comprising an anode layer, a cathode layer, at least one emission layer (EML) and at least one hole injection layer (HIL), wherein the hole injection layer is arranged between the anode layer and the at least one emission layer, alternatively the hole injection layer is in direct contact with the anode layer.

According to another aspect of the present invention, there is provided an OLED comprising: a substrate; an anode layer formed on the substrate, a hole injection of the present invention comprising a first and a second sub-layer, a hole transport layer, at least one emission layer, a hole blocking layer, an electron transport layer, an electron injection layer, and a cathode layer, wherein the first sub-layer is arranged adjacent to the anode layer and the second sub-layer arranged adjacent to the hole transport layer, and wherein the first sub-layer comprises or consists of the metal complex of Formula (II) and the second sub-layer comprises or consists of a organic matrix compound or an organic matrix compound of Formula (I).

According to another aspect of the present invention, there is provided an OLED comprising: a substrate; an anode layer formed on the substrate; a hole injection layer comprising an organic matrix compound or an organic matrix compound of Formula (I) and a metal complex of Formula (II), a hole transport layer, an electron blocking layer, at least one emission layer, a hole blocking layer, an electron transport layer and a cathode layer.

According to another aspect of the present invention, there is provided an OLED comprising: a substrate; an anode layer formed on the substrate, a hole injection of the present invention comprising a first and a second sub-layer, a hole transport layer, an electron-blocking layer, an emission layer, a hole blocking layer, an electron transport layer, an electron injection layer, and a cathode layer, wherein the first sub-layer is arranged adjacent to the anode layer and the second sub-layer arranged adjacent to the hole transport layer, and wherein the first sub-layer comprises or consists of the metal complex of Formula (II) and the second sub-layer comprises or consists of an organic matrix compound or an organic matrix compound of Formula (I).

According to another aspect of the present invention, there is provided an OLED comprising: a substrate; an anode layer formed on the substrate, a hole injection layer comprising an organic matrix compound or an organic matrix compound of Formula (I) and a metal complex of Formula (II), a hole transport layer, an electron blocking layer, at least one emission layer, a hole blocking layer, an electron transport layer, an electron injection layer, and a cathode layer.

According to another aspect of the present invention, there is provided an OLED comprising: a substrate; an anode layer formed on the substrate, a hole injection of the present invention comprising a first and a second sub-layer, a hole transport layer, an electron blocking layer, an emission layer, a hole blocking layer, an electron transport layer, an electron injection layer, and a cathode layer, wherein the first sub-layer is arranged adjacent to the anode layer and the second sub-layer arranged adjacent to the hole transport layer, and wherein the first sub-layer comprises or consists of the metal complex of Formula (II) and the second sub-layer comprises or consists of an organic matrix compound or an organic matrix compound of Formula (I).

According to various embodiments of the present invention, there may be provided OLEDs layers arranged between the above mentioned layers, on the substrate or on the top electrode.

For example, the OLED according to FIG. 2 may be formed by a process, wherein on a substrate (110), an anode layer (120), a hole injection layer (130) comprising an organic matrix compound or an organic matrix compound of Formula (I) and a metal complex of Formula (II), a hole transport layer (140), an electron blocking layer (145), an emission layer (150), a hole blocking layer (155), an electron transport layer (160), an electron injection layer (180) and the cathode layer (190) are subsequently formed in that order.

Method of Manufacturing

According to another aspect of the present invention, there is provided a method of manufacturing an organic electronic device, the method using:

at least one deposition source, preferably two deposition sources and more preferred at least three deposition sources.

The methods for deposition that can be suitable comprise:

deposition via vacuum thermal evaporation;

deposition via solution processing, preferably the processing may be selected from spin-coating, printing, casting; and/or slot-die coating.

According to various embodiments of the present invention, there is provided a method using:

a first deposition source to release the organic matrix compound (OMC) of Formula (I) according to the invention, and a second deposition source to release the metal complex of Formula (II).

The method comprising the steps of forming the hole injection layer; whereby for an organic light-emitting diode (OLED):

the hole injection layer is formed by releasing the organic matrix compound (OMC) of Formula (I) according to the invention from the first deposition source and the metal complex of Formula (II) from the second deposition source.

According to various embodiments of the present invention, the method may further include forming on the hole injection layer, at least one layer selected from the group consisting of forming a hole transport layer, forming a hole blocking layer, forming an emission layer, which may comprises an emitter matrix compound (EMC) having the Formula (I), forming a hole blocking layer forming an electron transporting layer and/or forming an electron injection layer and/or forming a cathode layer.

According to various embodiments of the present invention, the method may further include the steps for forming an organic light-emitting diode (OLED), wherein on a substrate an anode layer is formed, on the anode layer a hole injection layer, which comprises an organic matrix compound (OMC) of Formula (I) and a metal complex of Formula (II) is formed, on the hole injection layer, which comprises an organic matrix compound (OMC) of Formula (I) and a metal complex of Formula (II), a hole transport layer is formed, on the hole transport layer an emission layer, which may comprises an emitter matrix compound (EMC) having the Formula (I), is formed, on the emission layer an electron transport layer is formed, optionally a hole blocking layer is formed on the emission layer, and finally a cathode layer is formed, optional a hole blocking layer is formed in that order between the hole injection layer and the emission layer, optional an electron injection layer is formed between the electron transport layer and the cathode layer.

According to various embodiments, the OLED may have the following layer structure, wherein the layers having the following order:

anode layer, hole injection layer, which comprises an organic matrix compound (OMC) of Formula (I) and a metal complex of Formula (II), hole transport layer, optional electron blocking layer, emission layer, which may comprises an emitter matrix compound (EMC) having the Formula (I), optional hole blocking layer, electron transport layer, optional electron injection layer, and cathode layer.

According to one embodiment, the organic electronic device of the present invention is formed by deposition of the hole injection layer and cathode layer in vacuum.

According to another aspect, it is provided an electronic device comprising at least one organic light emitting device according to any embodiment described throughout this application, preferably, the electronic device comprises the organic light emitting diode in one of embodiments described throughout this application. More preferably, the organic electronic device is a display device.

Hereinafter, the embodiments are illustrated in more detail with reference to examples. However, the present disclosure is not limited to the following examples. Reference will now be made in detail to the exemplary aspects.

DESCRIPTION OF THE DRAWINGS

The aforementioned components, as well as the claimed components and the components to be used in accordance with the invention in the described embodiments, are not subject to any special exceptions with respect to their size, shape, material selection and technical concept such that the selection criteria known in the pertinent field can be applied without limitations.

Additional details, characteristics and advantages of the object are disclosed in the dependent claims and the following description of the respective figures which in an exemplary fashion show preferred embodiments according to the invention. Any embodiment does not necessarily represent the full scope, however, and reference is made therefore to the claims and herein for interpreting the scope. It is to be understood that both the foregoing general description and the following detailed description are exemplary and explanatory only and are intended to provide further explanation of the present invention as claimed.

Hereinafter, the figures are illustrated in more detail with reference to examples. However, the present disclosure is not limited to the following figures.

Herein, when a first element is referred to as being formed or disposed "on" or "onto" a second element, the first element can be disposed directly on the second element, or one or more other elements may be disposed there between. When a first element is referred to as being formed or disposed "directly on" or "directly onto" a second element, no other elements are disposed there between.

Figure 1:
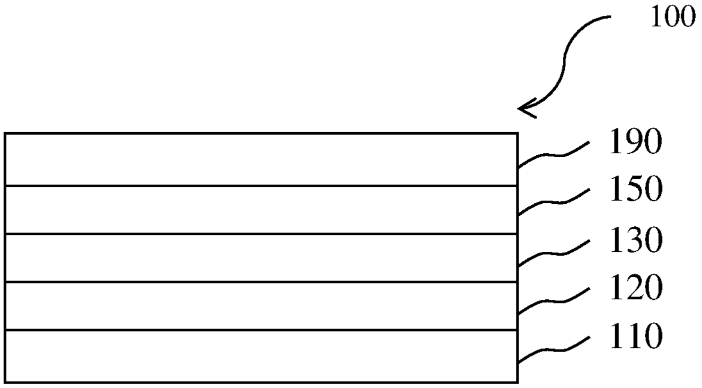
FIG. 1 is a schematic sectional view of an organic electronic device, according to an exemplary embodiment of the present invention.

FIG. 1 is a schematic sectional view of an organic electronic device 100, according to an exemplary embodiment of the present invention. The organic electronic device 100 includes a substrate 110, an anode layer 120 and a hole injection layer (HIL) (130). The HIL 130 is disposed on the anode layer 120. Onto the HIL 130, an emission layer (EML) 150, and a cathode layer 190 are disposed.

The hole injection layer (HIL) 130 may comprise a first and a second sub-layer wherein the first sub-layer is disposed on the anode and the second sub-layer is disposed on the first sub-layer. The photoactive layer (PAL) 170 is disposed on the second-sub-layer.

Figure 2:
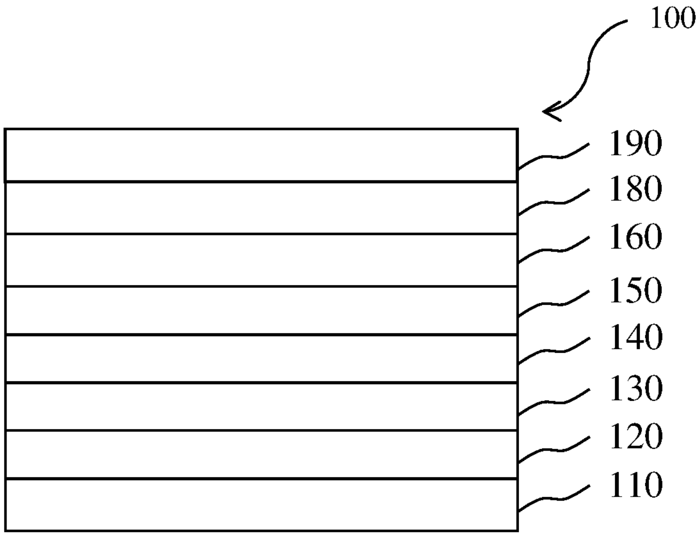
FIG. 2 is a schematic sectional view of an organic light-emitting diode (OLED), according to an exemplary embodiment of the present invention.

FIG. 2 is a schematic sectional view of an organic light-emitting diode (OLED) 100, according to an exemplary embodiment of the present invention. The OLED 100 includes a substrate 110, an anode layer 120 and a hole injection layer (HIL) 130, The HIL 130 is disposed on the anode layer 120. Onto the HIL 130, a hole transport layer (HTL) 140, an emission layer (EML) 150, an electron transport layer (ETL) 160, an electron injection layer (EIL) 180 and a cathode layer 190 are disposed. Instead of a single electron transport layer 160, optionally an electron transport layer stack (ETL) can be used.

The hole injection layer (HIL) 130 may comprise a first and a second sub-layer wherein the first sub-layer is disposed on the anode and the second sub-layer is disposed on the first sub-layer. The hole transport layer (HTL) 140 is disposed on the second-sub-layer.

Figure 3:
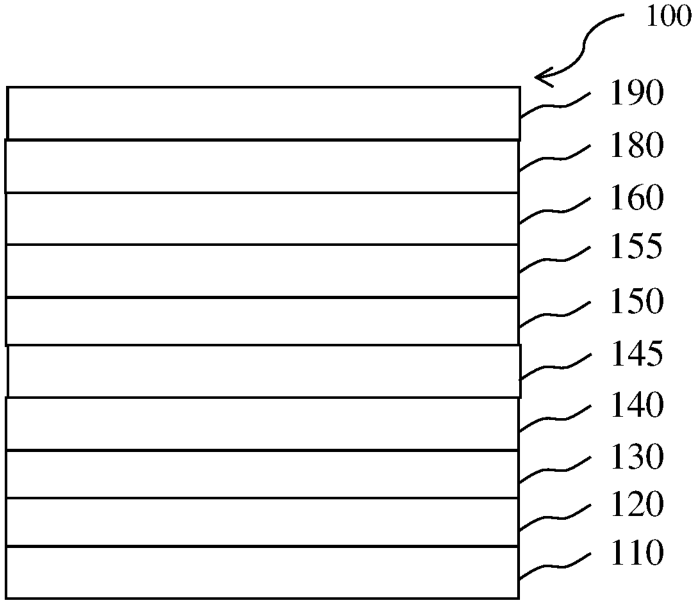
FIG. 3 is a schematic sectional view of an OLED, according to an exemplary embodiment of the present invention.

FIG. 3 is a schematic sectional view of an OLED 100, according to another exemplary embodiment of the present invention. FIG. 2 differs from FIG. 1 in that the OLED 100 of FIG. 2 comprises an electron blocking layer (EBL) 145 and a hole blocking layer (HBL) 155.

Referring to FIG. 3, the OLED 100 includes a substrate 110, an anode layer 120, a hole injection layer (HIL) 130, a hole transport layer (HTL) 140, an electron blocking layer (EBL) 145, an emission layer (EML) 150, a hole blocking layer (HBL) 155, an electron transport layer (ETL) 160, an electron injection layer (EIL) 180 and a cathode layer 190.

While not shown in FIG. 1, FIG. 2 and FIG. 3, a sealing layer may further be formed on the cathode layer 190, in order to seal the organic electronic device 100. In addition, various other modifications may be applied thereto.

Hereinafter, the embodiments are illustrated in more detail with reference to examples. However, the present disclosure is not limited to the following examples.

DETAILED DESCRIPTION

The invention is furthermore illustrated by the following examples which are illustrative only and non-binding.

Organic matrix compound of formula (I), metal complexes of formula (II) and emitter matrix compound of formula (I) may be prepared as described in the literature.

Rate Onset Temperature

The rate onset temperature ($T_{RO}$) is determined by loading 100 mg organic matrix compound into a VTE source. As VTE source a point source for organic materials may be used as supplied by Kurt J. Lesker Company (www.lesker.com) or CreaPhys GmbH (http://www.creaphys.com). The VTE source is heated at a constant rate of 15 K/min at a pressure of less than $10^{-5}$ mbar and the temperature inside the source measured with a thermocouple. Evaporation of the organic matrix compound is detected with a QCM detector which detects deposition of the organic matrix compound on the quartz crystal of the detector. The deposition rate on the quartz crystal is measured in Angstrom per second. To determine the rate onset temperature, the deposition rate is plotted against the VTE source temperature. The rate onset is the temperature at which noticeable deposition on the QCM detector occurs. For accurate results, the VTE source is heated and cooled three time and only results from the second and third run are used to determine the rate onset temperature.

To achieve good control over the evaporation rate of a metal complex of formula (II), the rate onset temperature may be in the range of ≥110° C. to ≤300° C., preferably ≥115° C. to ≤290° C. If the rate onset temperature is too low the evaporation may be too rapid and therefore difficult to control. If the rate onset temperature is too high the evaporation rate may be too low which may result in low tact time and/or decomposition of the metal complex of formula (II) in VTE source may occur due to prolonged exposure to elevated temperatures.

To achieve good control over the evaporation rate of the organic matrix compound and/or emitter matrix compound of the present invention, the rate onset temperature may be in the range of 120 to 300° C. If the rate onset temperature is too low the evaporation may be too rapid and therefore difficult to control. If the rate onset temperature is too high the evaporation rate may be too low which may result in low tact time.

The rate onset temperature is an indirect measure of the volatility of a compound. The higher the rate onset temperature the lower is the volatility of a compound.

HOMO and LUMO

The HOMO level and LUMO level are calculated with the program package TURBOMOLE V6.5 (TURBOMOLE GmbH, Litzenhardtstrasse 19, 76135 Karlsruhe, Germany). The optimized geometries and the HOMO level and LUMO levels of the molecular structures are determined by applying the hybrid functional B3LYP with a 6-31G* basis set in the gas phase. If more than one conformation is viable, the conformation with the lowest total energy may be selected. The HOMO and LUMO levels are recorded in electron volt (eV).

General procedure for fabrication of OLEDs comprising a hole injection layer and an emission layer comprising a fluorescent blue emitter For OLEDs, see Examples 1 to 11 and comparative examples 1 to 3 in Table 4 and 5, a 15 $\Omega/cm^2$ glass substrate with 90 nm ITO (available from Corning Co.) was cut to a size of 50 mm×50 mm×0.7 mm, ultrasonically washed with isopropyl alcohol for 5 minutes and then with pure water for 5 minutes, and washed again with UV ozone for 30 minutes, to prepare the anode layer.

Then, 70 vol.-% organic matrix compound and 30 vol.-% metal complex were co-deposited in vacuum on the anode layer, to form a hole injection layer (HIL) having a thickness of 10 nm. The composition of the hole injection layer can be seen in Table 4 and 5. In comparative examples 1 to 3, 70 vol.-% organic matrix compound and 30 vol.-% HAT-CN were co-deposited in vacuum on the anode layer to form a HIL having a thickness of 10 nm.

Then, the organic matrix compound was vacuum deposited on the HIL, to form a HTL having a thickness of 128 nm. The organic matrix compound in the HTL is selected the same as the organic matrix compound in the HIL. The organic matrix compound can be seen in Table 4 and 5.

Then N,N-bis(4-(dibenzo[b,d]furan-4-yl)phenyl)-[1,1':4',1"-terphenyl]-4-amine (CAS 1198399-61-9) was vacuum deposited on the HTL, to form an electron blocking layer (EBL) having a thickness of 5 nm.

Then 97 vol.-% EMC-6 as emitter matrix compound and 3 vol.-% BD200 (Sun Fine Chemicals, Korea) as fluorescent blue emitter dopant were deposited on the EBL, to form a blue-emitting EML with a thickness of 20 nm.

Then a hole blocking layer was formed with a thickness of 5 nm by depositing 2-(3'-(9,9-dimethyl-9H-fluoren-2-yl)-[1,1'-biphenyl]-3-yl)-4,6-diphenyl-1,3,5-triazine on the emission layer EML.

Then the electron transporting layer having a thickness of 31 nm was formed on the hole blocking layer by depositing 50 wt.-% 4'-(4-(4-(4,6-diphenyl-1,3,5-triazin-2-yl)phenyl)naphthalen-1-yl)-[1,1'-biphenyl]-4-carbonitrile and 50 wt.-% of LiQ Then A1 was evaporated at a rate of 0.01 to 1 Å/s at $10^{-7}$ mbar to form a cathode layer with a thickness of 100 nm on the electron transporting layer.

The OLED stack was protected from ambient conditions by encapsulation of the device with a glass slide. Thereby, a cavity is formed which may include a getter material for further protection.

General Procedure for Fabrication of OLEDs Comprising a Hole Injection Layer and an Emission Layer Comprising a Phosphorescent Green Emitter For OLEDs, see Examples 12 and 13 and comparative examples 4 and 5 in Table 5, a 15 $\Omega/cm^2$ glass substrate with 90 nm ITO (available from Corning Co.) was cut to a size of 50 mm×50 mm×0.7 mm, ultrasonically washed with isopropyl alcohol for 5 minutes and then with pure water for 5 minutes, and washed again with UV ozone for 30 minutes, to prepare the anode layer.

Then, 70 vol.-% organic matrix compound and 30 vol.-% metal complex were co-deposited in vacuum on the anode layer, to form a hole injection layer (HIL) having a thickness of 10 nm. The composition of the hole injection layer can be seen in Table 6. In comparative examples 4 and 5, 70 vol.-% organic matrix compound and 30 vol.-% HAT-CN were co-deposited in vacuum on the anode layer to form a HIL having a thickness of 10 nm.

Then, the organic matrix compound was vacuum deposited on the HIL, to form a HTL having a thickness of 165 nm. The organic matrix compound in the HTL is selected the same as the organic matrix compound in the HIL. The organic matrix compound can be seen in Table 6.

Then, 90 vol.-% GH-1 and 10 vol.-% GD-1 were co-deposited in vacuum on the HTL, to form a green-emitting emission layer with a thickness of 40 nm. GH-1 comprises EMC-4 and GET-1 in a molar ratio of 1:1. The formulas of GET-1 and GD-1 are shown below:

(GET-1)

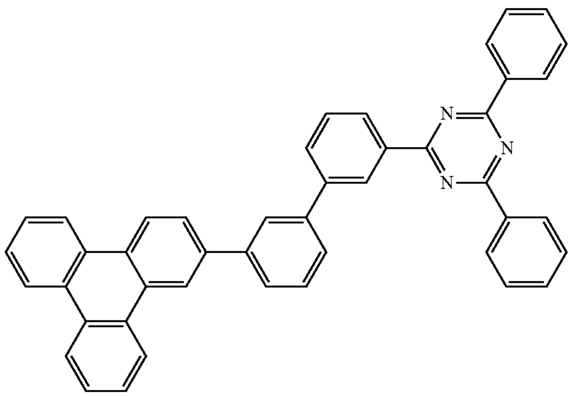

(GD-1)

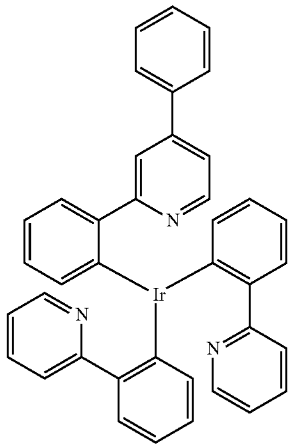

Then a hole blocking layer was formed with a thickness of 25 nm by depositing 2,4-diphenyl-6-(3'-(triphenylen-2-yl)-[1,1'-biphenyl]-3-yl)-1,3,5-triazine on the emission layer EML.

Then the electron transporting layer having a thickness of 10 nm was formed on the hole blocking layer by depositing 99 vol.-% 3-Phenyl-3H-benzo[b]dinaphtho[2,1-d:1',2'-f]phosphepine-3-oxide and 1 vol.-% Yb.

Then A1 was evaporated at a rate of 0.01 to 1 Å/s at $10^{-7}$ mbar to form a cathode layer with a thickness of 100 nm on the electron transporting layer.

The OLED stack is protected from ambient conditions by encapsulation of the device with a glass slide. Thereby, a cavity is formed which may include a getter material for further protection.

General Procedure for Fabrication of OLEDs Comprising a Hole Injection Layer Comprising a First and Second Sub-Layer For OLEDs, see Examples 14 to 28 and comparative examples 6 to 11 in Table 7, a 15 $\Omega/cm^2$ glass substrate with 90 nm ITO (available from Corning Co.) was cut to a size of 50 mm×50 mm×0.7 mm, ultrasonically washed with isopropyl alcohol for 5 minutes and then with pure water for 5 minutes, and washed again with UV ozone for 30 minutes, to prepare the anode layer.

Then, the hole injection layer comprising a first and a second sub-layer was vacuum deposited on the anode layer. First, a metal complex was vacuum deposited on the anode layer to form a first sub-layer with a thickness of 3 or 5 nm, see Table 7. In comparative examples 6 to 11, HAT-CN was vacuum deposited on the anode layer to form a first sub-layer with a thickness of 3 or 5 nm, see Table 7.

Then, the organic matrix compound was vacuum deposited on the first sub-layer to form a second sub-layer with a thickness of 7 or 5 nm, see Table 7.

Then, an organic matrix compound was vacuum deposited on the hole injection layer to form a HTL. The organic matrix compound in the HTL is selected the same as the organic matrix compound in the HIL, see Table 7. The thickness is selected in such a way, that the thickness of the second sub-layer and the thickness of the HTL add up to 128 nm in total.

Then N,N-bis(4-(dibenzo[b,d]furan-4-yl)phenyl)-[1,1':4',1"-terphenyl]-4-amine (CAS 1198399-61-9) was vacuum deposited on the HTL, to form an electron blocking layer (EBL) having a thickness of 5 nm.

Then 97 vol.-% EMC-6 as emitter matrix compound and 3 vol.-% BD200 (Sun Fine Chemicals, Korea) as fluorescent blue emitter dopant were deposited on the EBL, to form a blue-emitting EML with a thickness of 20 nm.

Then a hole blocking layer was formed with a thickness of 5 nm by depositing 2-(3'-(9,9-dimethyl-9H-fluoren-2-yl)-[1,1'-biphenyl]-3-yl)-4,6-diphenyl-1,3,5-triazine on the emission layer EML.

Then the electron transporting layer having a thickness of 31 nm was formed on the hole blocking layer by depositing 50 wt.-% 4'-(4-(4-(4,6-diphenyl-1,3,5-triazin-2-yl)phenyl)naphthalen-1-yl)-[1,1'-biphenyl]-4-carbonitrile and 50 wt.-% of LiQ Then A1 was evaporated at a rate of 0.01 to 1 Å/s at $10^{-7}$ mbar to form a cathode layer with a thickness of 100 nm on the electron transporting layer.

The OLED stack was protected from ambient conditions by encapsulation of the device with a glass slide. Thereby, a cavity is formed which may include a getter material for further protection.

To assess the performance of the inventive examples compared to the prior art, the current efficiency is measured at 20° C. The current-voltage characteristic is determined using a Keithley 2635 source measure unit, by sourcing an operating voltage U in V and measuring the current in mA flowing through the device under test. The voltage applied to the device is varied in steps of 0.1V in the range between 0V and 10V. To protect the instruments from damage, the measurement was stopped at 10 V.

Technical Effect

In order to investigate the usefulness of the inventive layer stack preferred materials were tested in view of their physical properties, see Tables 1 to 3.

In Table 1 are shown the HOMO levels calculated with program TURBOMOLE V6.5 (TURBOMOLE GmbH, Litzenhardtstrasse 19, 76135 Karlsruhe, Germany) and the rate onset temperatures $T_{RO}$ of organic matrix compounds of the present invention.

TABLE 1

Chemical formulas and physical properties of organic matrix compounds

| Name | Chemical formula | HOMO level (eV) | $T_{RO}$ (° C.) |
|---|---|---|---|
| 9-phenyl-10-(3',4',5'-triphenyl-[1,1':2',1"-terphenyl]-3-yl)anthracene OMC-1 | 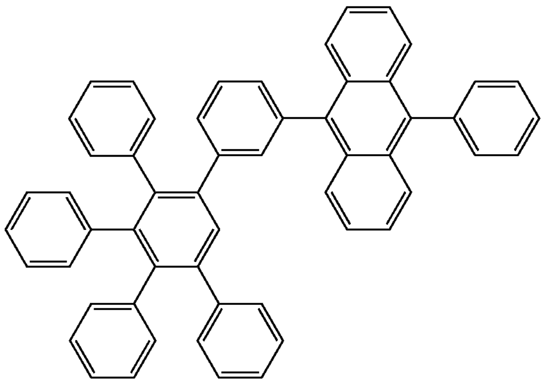 [SMILES: c1ccc(-c2cc(-c3cccc(-c4c5ccccc5c(-c5ccccc5)c5ccccc45)c3)c(-c3ccccc3)c(-c3ccccc3)c2-c2ccccc2)cc1] | −5.04 | 210 |
| 1,3-bis(10-phenylanthracen-9-yl)benzene OMC-2 | 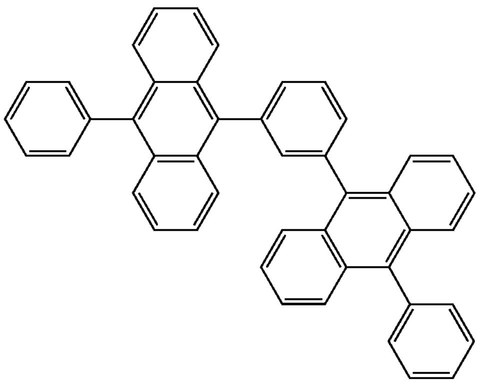 [SMILES: c1ccc(-c2c3ccccc3c(-c3cccc(-c4c5ccccc5c(-c5ccccc5)c5ccccc45)c3)c3ccccc23)cc1] | −5.08 | 230 |

TABLE 1-continued

| Chemical formulas and physical properties of organic matrix compounds | | | |
|---|---|---|---|
| Name | Chemical formula | HOMO level (eV) | $T_{RO}$ (° C.) |
| 9-phenyl-10-(3'-(9-phenyl-9H-fluoren-9-yl)-[1,1'-biphenyl]-3-yl)anthracene OMC-3 | 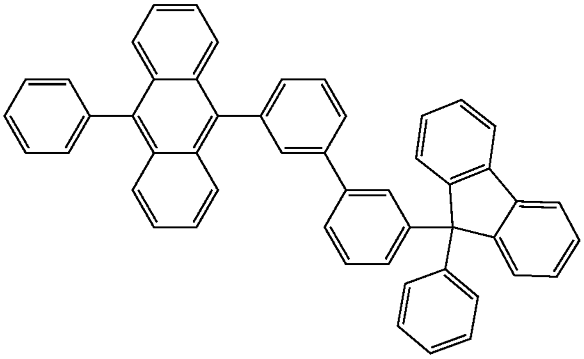 [SMILES: c1ccc(-c2c3ccccc3c(-c3cccc(-c4cccc(C5(c6ccccc6)c6ccccc6-c6ccccc65)c4)c3)c3ccccc23)cc1] | −5.08 | 226 |
| 9-([1,1'-biphenyl]-3-yl)-9'-([1,1'-biphenyl]-4-yl)-9H,9'H-3,3'-bicarbazole OMC-4 | 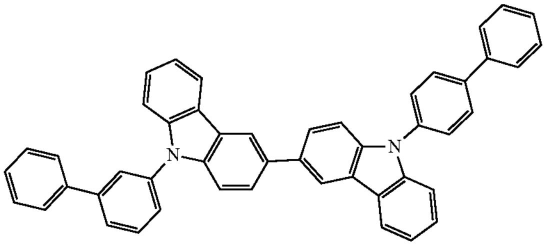 [SMILES: c1ccc(-c2ccc(-n3c4ccccc4c4cc(-c5ccc6c(c5)c5ccccc5n6-c5cccc(-c6ccccc6)c5)ccc43)cc2)cc1] | −5.09 | 265 |
| 9-(4-(naphthalen-1-yl)phenyl)-10-phenylanthracene OMC-5 | 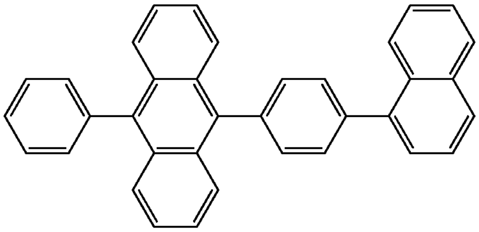 [SMILES: c1ccc(-c2c3ccccc3c(-c3ccc(-c4cccc5ccccc45)cc3)c3ccccc23)cc1] | −5.1 | approx. 130 |
| 2-(10-phenylanthracen-9-yl)dibenzo[b,d]furan OMC-6 | 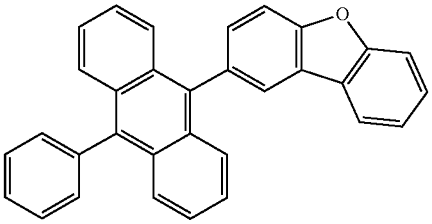 [SMILES: c1ccc(-c2c3ccccc3c(-c3ccc4oc5ccccc5c4c3)c3ccccc23)cc1] | −5.11 | — |
| 2-phenyl-8-(10-phenylanthracen-9-yl)dibenzo[b,d]furan OMC-7 | 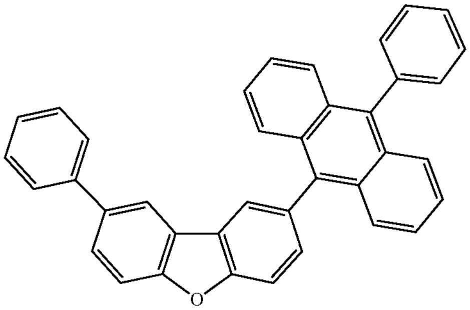 [SMILES: c1ccc(-c2ccc3oc4ccc(-c5c6ccccc6c(-c6ccccc6)c6ccccc56)cc4c3c2)cc1] | −5.13 | 216 |

TABLE 1-continued
Chemical formulas and physical properties of organic matrix compounds
| Name | Chemical formula | HOMO level (eV) | $T_{RO}$ (° C.) |
|---|---|---|---|
| 7-(3-(10-phenylanthracen-9-yl)phenyl)dibenzo[c,h] acridine OMC-8 | 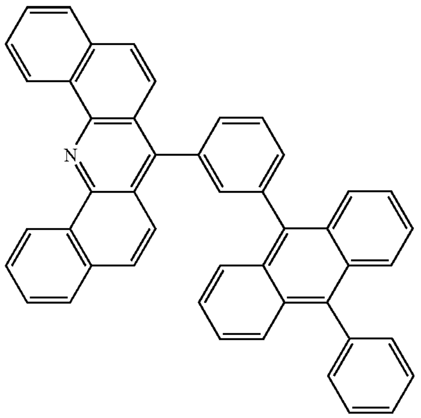 [SMILES: c1ccc(-c2c3ccccc3c(-c3cccc(-c4c5ccc6ccccc6c5nc5c4ccc4ccccc45)c3)c3ccccc23)cc1] | −5.17 | 282 |
| 7-(4-(3,6-diphenyl-9H-carbazol-9-yl)phenyl)dibenzo[c,h] acridine OMC-9 | 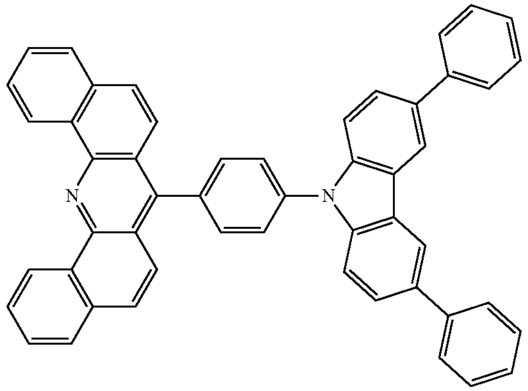 [SMILES: c1ccc(-c2ccc3c(c2)c2cc(-c4ccccc4)ccc2n3-c2ccc(-c3c4ccc5ccccc5c4nc4c3ccc3ccccc34)cc2)cc1] | −5.28 | 291 |
| 4,4'-Bis(carbazol-9-yl)-biphenyl OMC-10 | 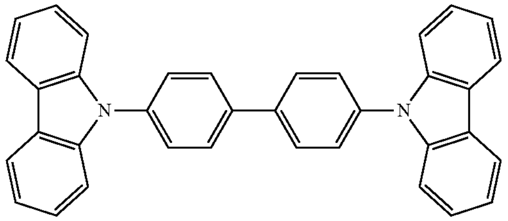 [SMILES: c1ccc2c(c1)c1ccccc1n2-c1ccc(-c2ccc(-n3c4ccccc4c4ccccc43)cc2)cc1] | −5.3 | approx. 240 |
| 2,7-di([1,1'-biphenyl]-4-yl)spiro[fluorene-9,9'-xanthene] OMC-11 | 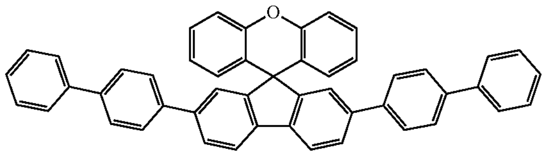 [SMILES: c1ccc(-c2ccc(-c3ccc4c(c3)C3(c5ccccc5Oc5ccccc53)c3cc(-c5ccc(-c6ccccc6)cc5)ccc3-4)cc2)cc1] | −5.38 | 242 |

TABLE 1-continued

| Chemical formulas and physical properties of organic matrix compounds | | | |
|---|---|---|---|
| Name | Chemical formula | HOMO level (eV) | $T_{RO}$ (° C.) |
| 7-(3-(9H-carbazol-9-yl)phenyl)dibenzo[c,h] acridine OMC-12 | 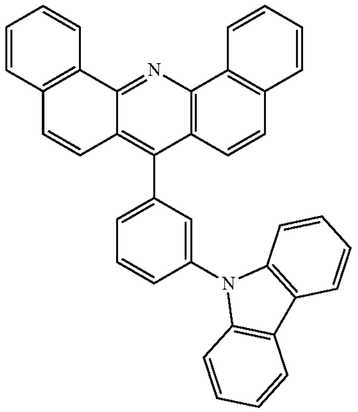 [SMILES: c1cc(-c2c3ccc4ccccc4c3nc3c2ccc2ccccc23)cc(-n2c3ccccc3c3ccccc32)c1] | −5.42 | 214 |
| 4,4',4''-(1,3,5-Benzenetriyl)tris [dibenzothiophene] OMC-13 | 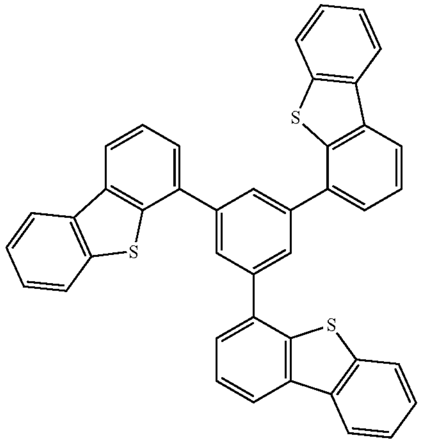 [SMILES: c1ccc2c(c1)sc1c(-c3cc(-c4cccc5c4sc4ccccc45)cc(-c4cccc5c4sc4ccccc45)c3)cccc12] | −5.67 | 272 |

As can be seen in Table 1, the organic matrix compounds have rate onset temperatures suitable for mass production of organic electronic devices.

In Table 2 are shown rate onset temperatures $T_{RO}$ of metal complexes of formula (II).

TABLE 2

| Metal complexes of formula (II) | | |
|---|---|---|
| Name | Chemical formula | $T_{RO}$ (° C.) |
| MC-1 | Li TFSI | 222 |
| MC-2 | K TFSI | 236 |
| MC-3 | Cs TFSI | 224 |
| MC-4 | Ag TFSI | 258 |
| MC-5 | Mg $(TFSI)_2$ | 243 |
| MC-6 | Mn $(TFSI)_2$ | 229 |
| MC-7 | Sc $(TFSI)_3$ | 258 |
| MC-8 | Mg $[N(SO_2{}^iC_3F_7)_2]_2$ | 166 |
| MC-9 | Zn $[N(SO_2{}^iC_3F_7)_2]_2$ | 118 |
| MC-10 | Ag $[N(SO_2{}^iC_3F_7)_2]$ | 232 |
| MC-11 | Ag $[N(SO_2C_3F_7)_2]$ | 254 |
| MC-12 | Ag $[N(SO_2C_4F_9)_2]$ | 262 |
| MC-13 | Ag $[N(SO_2CF_3)(SO_2C_4F_9)]$ | 230 |
| MC-14 | Cu $[N(SO_2{}^iC_3F_7)_2]_2$ | 101 |
| MC-15 | Cu $[N(SO_2C_3F_7)_2]_2$ | 118 |
| MC-16 | Cu $[N(SO_2CF_3)\ (SO_2C_4F_9)]_2$ | 113 |
| MC-17 | Mg $[N(SO_2CF_3)\ (SO_2C_4F_9)]_2$ | 124 |

TABLE 2-continued
Metal complexes of formula (II)
| Name | Chemical formula | $T_{RO}$ (° C.) |
|---|---|---|
| MC-18 | Mn $[N(SO_2CF_3)(SO_2C_4F_9)]_2$ | 202 |
| MC-19 | Cu $[N(SO_2CH_3)(SO_2C_4F_9)]_2$ | 179 |
| MC-20 | Ag $[N(SO_2CH_3)(SO_2C_4F_9)]$ | — |
| MC-21 | 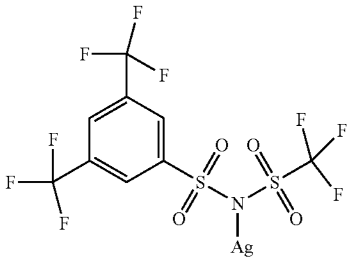 | 254 |
| MC-22 | 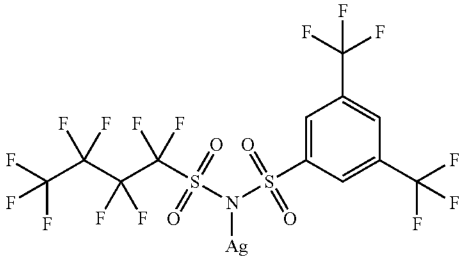 | 238 |
| MC-23 | 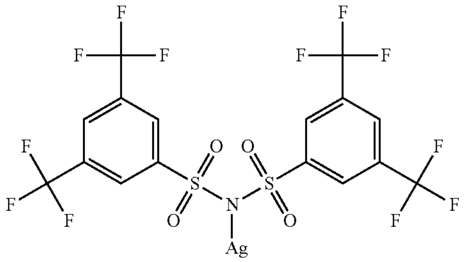 | 262 |
| MC-24 | 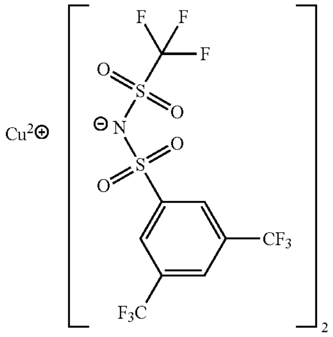 | 180 |
| MC-25 | 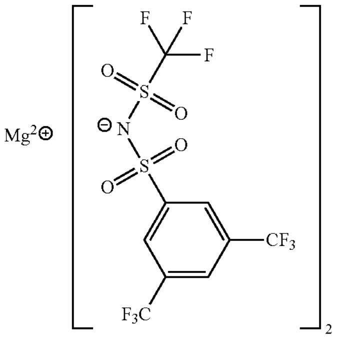 | — |

TABLE 2-continued
| Metal complexes of formula (II) | | |
|---|---|---|
| Name | Chemical formula | $T_{RO}$ (° C.) |
| MC-26 | 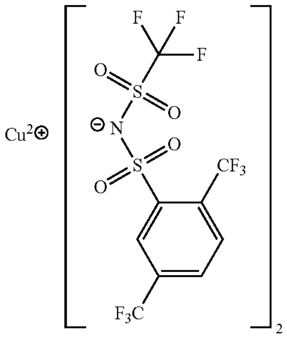 | 167 |
| MC-27 | 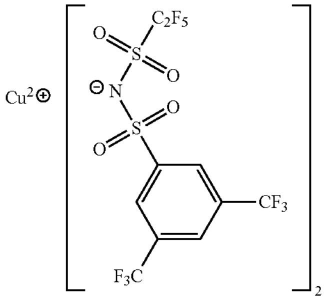 | 282 |
| MC-28 | 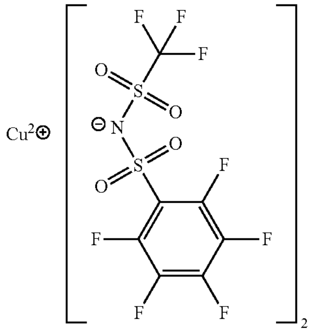 | 263 |
| MC-29 | 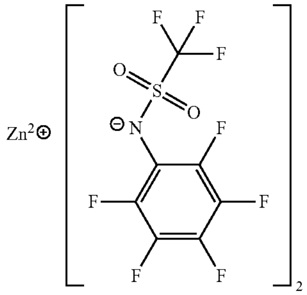 | 194 |
| MC-30 | 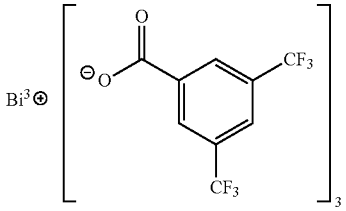 | 190 |

TABLE 2-continued
| Metal complexes of formula (II) | | |
|---|---|---|
| Name | Chemical formula | $T_{RO}$ (° C.) |
| MC-31 | 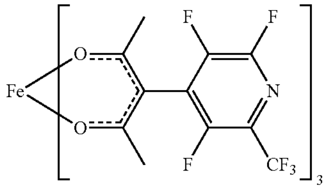 | 128 |
| MC-32 | 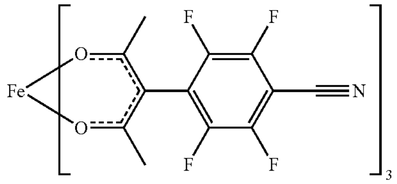 | 196 |
| MC-33 | 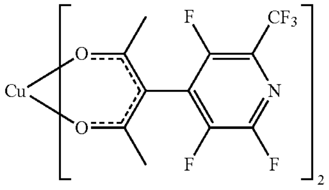 | 105 |
| MC-34 | 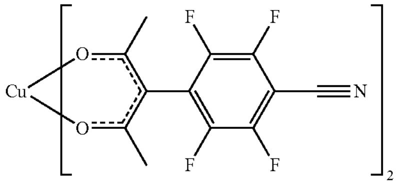 | 187 |
| MC-35 | 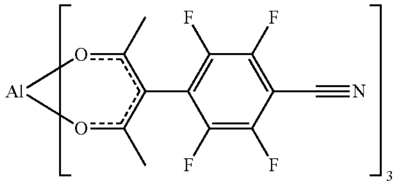 | 194 |

As can be seen in Table 2, the metal complexes of formula (II) have rate onset temperatures suitable for mass production of organic electronic devices.

In Table 3 are shown the HOMO levels calculated with program TURBOMOLE V6.5 (TURBOMOLE GmbH, Litzenhardtstrasse 19, 76135 Karlsruhe, Germany) and the rate onset temperatures $T_{RO}$ of emitter matrix compounds of the present invention.

TABLE 3

Chemical formulas and physical properties of emitter matrix compounds

| Name | Chemical formula | HOMO level (eV) | $T_{RO}$ (° C.) |
|---|---|---|---|
| 9-phenyl-10-(3',4',5'-triphenyl-[1,1':2',1''-terphenyl]-3-yl)anthracene EMC-1 | 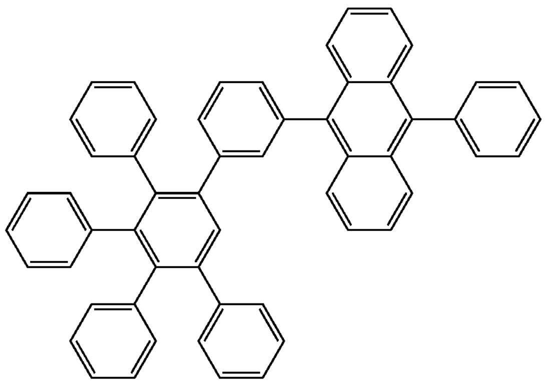 [SMILES: c1ccc(-c2cc(-c3cccc(-c4c5ccccc5c(-c5ccccc5)c5ccccc45)c3)c(-c3ccccc3)c(-c3ccccc3)c2-c2ccccc2)cc1] | −5.04 | 210 |
| 1,3-bis(10-phenylanthracen-9-yl)benzene EMC-2 | 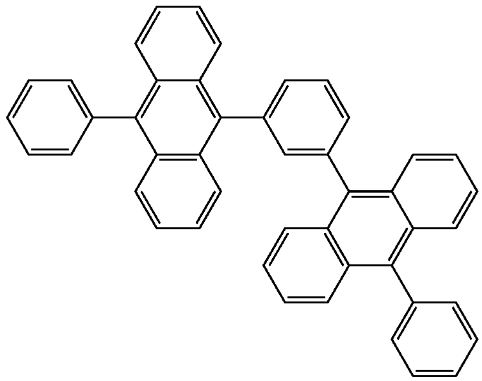 [SMILES: c1ccc(-c2c3ccccc3c(-c3cccc(-c4c5ccccc5c(-c5ccccc5)c5ccccc45)c3)c3ccccc23)cc1] | −5.08 | 230 |
| 9-phenyl-10-(3'-(9-phenyl-9H-fluoren-9-yl)-[1,1'-biphenyl]-3-yl)anthracene EMC-3 | 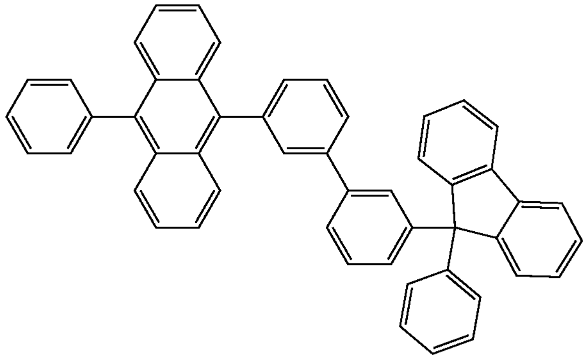 [SMILES: c1ccc(-c2c3ccccc3c(-c3cccc(-c4cccc(C5(c6ccccc6)c6ccccc6-c6ccccc65)c4)c3)c3ccccc23)cc1] | −5.08 | 226 |

TABLE 3-continued

Chemical formulas and physical properties of emitter matrix compounds

| Name | Chemical formula | HOMO level (eV) | $T_{RO}$ (° C.) |
| --- | --- | --- | --- |
| 9-([1,1'-biphenyl]-3-yl)-9'-([1,1'-biphenyl]-4-yl)-9H,9'H-3,3'-bicarbazole EMC-4 | 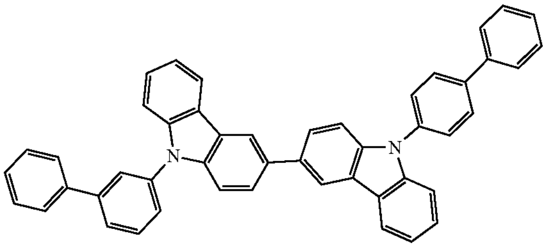 [SMILES: c1ccc(-c2ccc(-n3c4ccccc4c4cc(-c5ccc6c(c5)c5ccccc5n6-c5cccc(-c6ccccc6)c5)ccc43)cc2)cc1] | −5.09 | 265 |
| 9-(4-(naphthalen-1-yl)phenyl)-10-phenylanthracene EMC-5 | 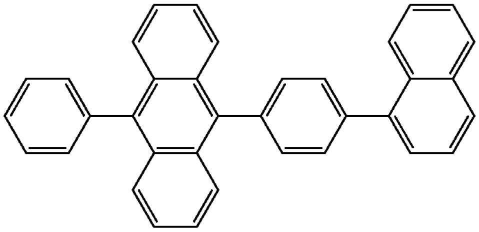 [SMILES: c1ccc(-c2c3ccccc3c(-c3ccc(-c4cccc5ccccc45)cc3)c3ccccc23)cc1] | −5.1 | approx. 130 |
| 2-(10-phenylanthracen-9-yl)dibenzo[b,d]furan EMC-6 | 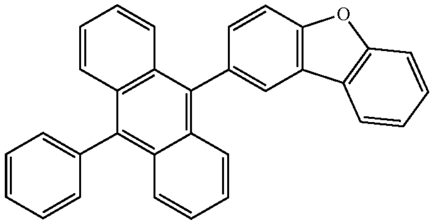 [SMILES: c1ccc(-c2c3ccccc3c(-c3ccc4oc5ccccc5c4c3)c3ccccc23)cc1] | −5.11 | — |
| 2-phenyl-8-(10-phenylanthracen-9-yl)dibenzo[b,d]furan EMC-7 | 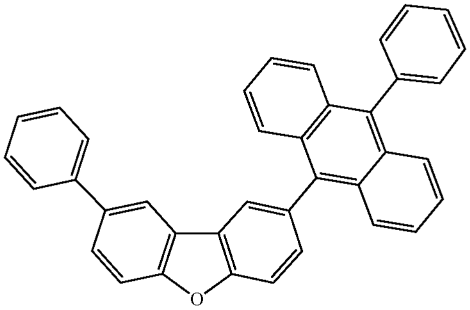 [SMILES: c1ccc(-c2ccc3oc4ccc(-c5c6ccccc6c(-c6ccccc6)c6ccccc56)cc4c3c2)cc1] | −5.13 | 216 |
| 7-(3-(10-phenylanthracen-9-yl)phenyl)dibenzo[c,h]acridine EMC-8 | 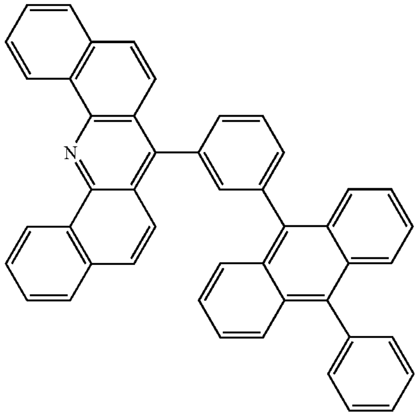 [SMILES: c1ccc(-c2c3ccccc3c(-c3cccc(-c4c5ccc6ccccc6c5nc5c4ccc4ccccc45)c3)c3ccccc23)cc1] | −5.17 | 282 |

TABLE 3-continued
Chemical formulas and physical properties of emitter matrix compounds
| Name | Chemical formula | HOMO level (eV) | $T_{RO}$ (° C.) |
|---|---|---|---|
| 7-(4-(3,6-diphenyl-9H-carbazol-9-yl)phenyl)dibenzo[c,h]acridine EMC-9 | 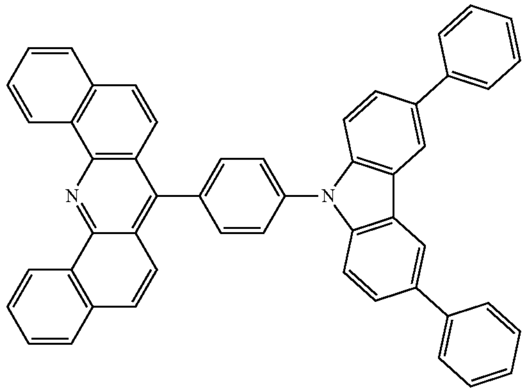 [SMILES: c1ccc(-c2ccc3c(c2)c2cc(-c4ccccc4)ccc2n3-c2ccc(-c3c4ccc5ccccc5c4nc4c3ccc3ccccc34)cc2)cc1] | −5.28 | 291 |
| 4,4'-Bis(carbazol-9-yl)-biphenyl EMC-10 | 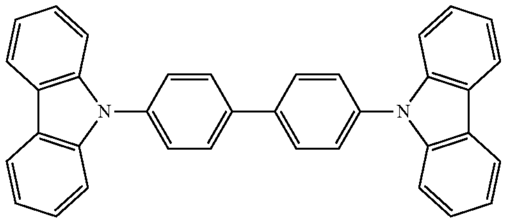 [SMILES: c1ccc2c(c1)c1ccccc1n2-c1ccc(-c2ccc(-n3c4ccccc4c4ccccc43)cc2)cc1] | −5.3 | approx. 240 |
| 2,7-di([1,1'-biphenyl]-4-yl)spiro[fluorene-9,9'-xanthene] EMC-11 | 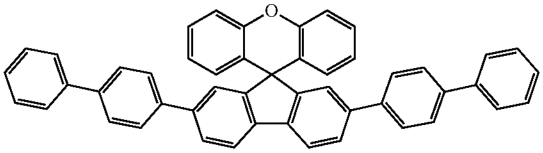 [SMILES: c1ccc(-c2ccc(-c3ccc4c(c3)C3(c5ccccc5Oc5ccccc53)c3cc(-c5ccc(-c6ccccc6)cc5)ccc3-4)cc2)cc1] | −5.38 | 242 |
| 7-(3-(9H-carbazol-9-yl)phenyl)dibenzo[c,h]acridine EMC-12 | 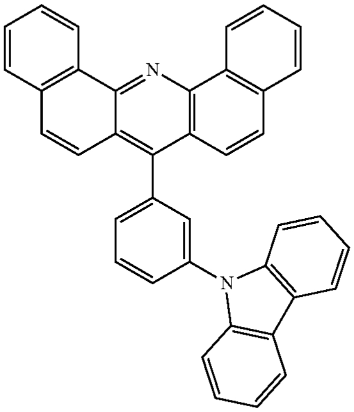 [SMILES: c1cc(-c2c3ccc4ccccc4c3nc3c2ccc2ccccc23)cc(-n2c3ccccc3c3ccccc32)c1] | −5.42 | 214 |

TABLE 3-continued

| Chemical formulas and physical properties of emitter matrix compounds | | | |
|---|---|---|---|
| Name | Chemical formula | HOMO level (eV) | $T_{RO}$ (° C.) |
| 4,4',4''-(1,3,5-Benzenetriyl)tris[dibenzothiophene] EMC-13 | 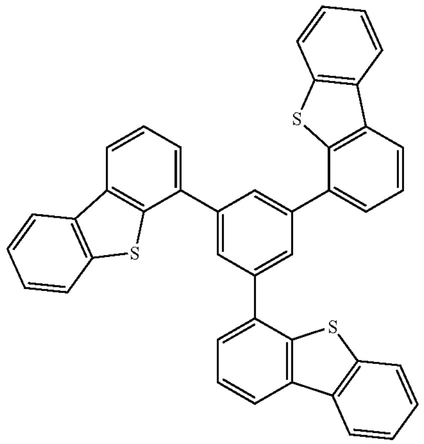 [SMILES: c1ccc2c(c1)sc1c(-c3cc(-c4cccc5c4sc4ccccc45)cc(-c4cccc5c4sc4ccccc45)c3)cccc12] | −5.67 | 272 |

As can be seen in Table 3, the emitter matrix compounds have rate onset temperatures suitable for mass production of organic electronic devices.

In Table 4 are shown operating voltages at 10 mA/cm$^2$ in OLEDs comprising a hole injection layer comprising 70 vol.-% organic matrix compound OMC-10 and 30 vol.-% metal complex of formula (II) and an emission layer comprising 97 vol.-% emitter matrix compound EMC-6 and 3 vol.-% fluorescent blue emitter dopant. OMC-10 has a HOMO level of −5.30 eV. The emitter matrix compound EMC-6 has a HOMO level of −5.13 eV.

The offset between HOMO level of the emitter matrix compound and the HOMO level of the organic matrix compound is 0.17 eV.

TABLE 4

Performance of OLEDs comprising a fluorescent blue emitter and emitter matrix compound EMC-6

| | Organic matrix compound (OMC) | HOMO level (EMC) − HOMO level (OMC) [eV] | Metal complex | U at 10 mA/cm$^2$ [V] |
|---|---|---|---|---|
| Comparative example 1 | OMC-10 | 0.17 | HAT-CN | >10 |
| Example 1 | OMC-10 | 0.17 | $Cu(TFSI)_2$ | 6.9 |
| Example 2 | OMC-10 | 0.17 | MC-24 | 6.3 |
| Example 3 | OMC-10 | 0.17 | MC-6 | 5.3 |
| Example 4 | OMC-10 | 0.17 | MC-27 | 5.4 |
| Example 5 | OMC-10 | 0.17 | MC-29 | 5.2 |

In comparative example 1, HAT-CN, a state of the art material, is used at a concentration of 30 vol.-%. HAT-CN has the formula shown below:

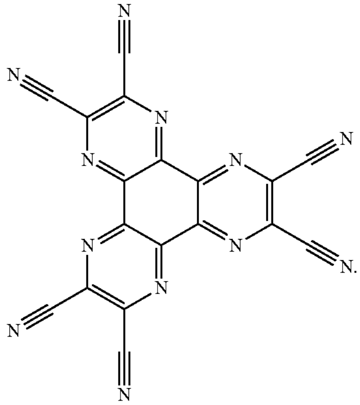

(HAT-CN)

HAT-CN has a HOMO of −8.83 eV. The operating voltage is over 10 V.

In example 1, the hole injection layer comprises $Cu(TFSI)_2$ as metal complex. The operating voltage is substantially improved to 6.9 V.

In example 2, the hole injection layer comprises a different Cu(II) complex, namely MC-24. Compared to example 1, the TFSI ligand has been replaced by an amide ligand comprising one trifluoro methyl and one substituted aryl group. The operating voltage is further improved to 6.3 V.

In example 3, the hole injection layer comprises MC-6. Compared to example 1, the Cu(II) cation has been replaced by a Mn(II) cation. The operating voltage compared to example 1 is improved from 6.9 to 5.3 V.

In example 4, the hole injection layer comprises a Mg complex. Compared to example 2, Cu(II) cation has been replaced by Mg(II) cation. The operating voltage is improved from 6.3 to 5.4 V.

In example 5, the hole injection layer comprises a Zn(II) complex. Compared to example 4, the Mg(II) cation has been replaced by a Zn(II) cation and the amide ligand has been replaced by a ligand comprising an N-aryl group. The operating voltage is still within the range acceptable for mass production.

In Table 5 are shown operating voltages at 10 mA/$cm^2$ in OLEDs comprising a fluorescent blue emitter and a hole injection layer comprising 70 vol.-% organic matrix compound and 30 vol.-% metal complex of formula (II) and an emission layer comprising 97 vol.-% emitter matrix compound EMC-6 and 3 vol.-% fluorescent blue emitter.

The emitter matrix compound EMC-6 has a HOMO level of −5.13 eV.

TABLE 5

Performance of OLEDs comprising a fluorescent blue emitter and emitter matrix compound EMC-6

| | Organic matrix compound (OMC) | HOMO level (OMC) [eV] | HOMO level (EMC) − HOMO level (OMC) [eV] | Metal complex | U at 10 mA/$cm^2$ [V] |
|---|---|---|---|---|---|
| Comparative example 2 | OMC-5 | −5.10 | −0.03 | HAT-CN | >10 |
| Comparative example 3 | OMC-13 | −5.67 | 0.54 | HAT-CN | >10 |
| Example 6 | OMC-5 | −5.10 | −0.03 | MC-29 | 4.1 |
| Example 7 | OMC-6 | −5.13 | 0 | MC-29 | 4.1 |
| Example 8 | OMC-7 | −5.13 | 0 | MC-29 | 5.1 |
| Example 9 | OMC-9 | −5.28 | 0.15 | MC-29 | 5.7 |
| Example 10 | OMC-10 | −5.30 | 0.17 | MC-29 | 5.9 |
| Example 11 | OMC-13 | −5.67 | 0.54 | MC-29 | 7.0 |

In comparative example 2, the hole injection layer comprises organic matrix compound OMC-5 and 30 vol.-% HAT-CN. HAT-CN is free of metal complex. OMC-5 comprises an anthracene group. The HOMO level of OMC-5 is −5.10 eV. The offset in HOMO level between the emitter matrix compound and the organic matrix compound is −0.03 eV. The operating voltage is over 10 V.

In comparative example 3, the hole injection layer comprises organic matrix compound OMC-13 and 30 vol.-% HAT-CN. OMC-13 comprises three dibenzofuranyl groups. The HOMO level is −5.67 eV. The offset in HOMO level between the emitter matrix compound and the organic matrix compound is 0.54 eV. The operating voltage is over 10 V.

In example 6, the hole injection layer comprises OMC-5 and metal complex MC-29. The operating voltage is reduced substantially to 4.1 V.

In example 7, the hole injection layer comprises OMC-6 and MC-29. OMC-6 comprises an anthracene and a dibenzofuranyl group. The same compound is used in the hole injection layer and in the emission layer. The offset in HOMO level between the emitter matrix compound and the organic matrix compound is 0 eV. The operating voltage is unchanged at 4.1 V.

In example 8, the hole injection layer comprises OMC-7 and MC-29. OMC-7 comprises an anthracene and a dibenzofuranyl group. The HOMO level is −5.13 eV. The offset in HOMO level between the emitter matrix compound and the organic matrix compound is 0 eV. The operating voltage is a little bit higher than in example 7. However, the operating voltage is substantially reduced compared to comparative examples 2 and 3.

In example 9, the hole injection layer comprises OMC-9 and MC-29. OMC-9 comprises a dibenzoacridine and a carbazole group. The HOMO level is −5.28 eV. The offset in HOMO level between the emitter matrix compound and the organic matrix compound is increased to 0.15 eV. The operating voltage is a little bit higher than in example 8. However, the operating voltage is substantially reduced compared to comparative examples 2 and 3.

In example 10, the hole injection layer comprises OMC-10 and MC-29. OMC-10 comprises a two carbazole groups. The HOMO level is −5.30 eV. The offset in HOMO level between the emitter matrix compound and the organic matrix compound is increased to 0.17 eV. The operating voltage is still substantially reduced compared to comparative examples 2 and 3.

In example 11, the hole injection layer comprises OMC-13 and MC-29. OMC-13 comprises three dibenzofuranyl groups. The HOMO level is −5.67 eV. The offset in HOMO level between the emitter matrix compound and the organic matrix compound is increased further to 0.54 eV. The operating voltage is a little bit higher than in example 10. However, the operating voltage is substantially reduced compared to comparative examples 2 and 3.

In Table 6 are shown operating voltages at 10 mA/$cm^2$ in OLEDs comprising a phosphorescent green emitter and a hole injection layer comprising an organic matrix compound and 30 vol.-% metal complex of formula (II) and an emission layer comprising 70 vol.-% of a composition comprising EMC-4 and GET-1 in a molar ratio of 1:1 and 30 vol.-% of phosphorescent green emitter GD-1. If the emission layer comprises a composition of two or more emitter matrix compounds, the emitter matrix compound with the HOMO level closer to vacuum level is considered.

The emitter matrix compound EMC-4 has a HOMO level of −5.09 eV. For comparison, GET-1 has a HOMO level of −5.69 eV.

TABLE 6

Performance of OLEDs comprising a phosphorescent green emitter

| | Organic matrix compound (OMC) | HOMO level (OMC) [eV] | HOMO level (EMC) − HOMO level (OMC) [eV] | Metal complex | U at 10 mA/$cm^2$ [V] |
|---|---|---|---|---|---|
| Comparative example 4 | OMC-5 | −5.10 | 0.01 | HAT-CN | >10 |
| Example 12 | OMC-5 | −5.10 | 0.01 | MC-29 | 4.5 |
| Comparative example 5 | OMC-10 | −5.30 | 0.21 | HAT-CN | >10 |
| Example 13 | OMC-10 | −5.30 | 0.21 | MC-29 | 6.3 |

In comparative example 4, the hole injection layer comprises organic matrix compound OMC-5 and 30 vol.-% HAT-CN. HAT-CN is free of metal complex. OMC-5 comprises an anthracene group. The HOMO level of OMC-5 is −5.10 eV. The offset in HOMO level between the emitter matrix compound and the organic matrix compound is 0.01 eV. The operating voltage is over 10 V.

In example 12, the hole injection layer comprises OMC-5 and metal complex MC-29. The operating voltage is reduced substantially to 4.1 V.

In comparative example 5, the hole injection layer comprises organic matrix compound OMC-10 and 30 vol.-% HAT-CN. OMC-10 comprises two carbazole groups. The HOMO level of OMC-10 is −5.30 eV. The offset in HOMO level between the emitter matrix compound and the organic matrix compound is 0.21 eV. The operating voltage is over 10 V.

In example 13, the hole injection layer comprises OMC-10 and metal complex MC-29. The operating voltage is reduced substantially to 6.3 V.

In Table 7 are shown operating voltages at 10 mA/$cm^2$ in OLEDs comprising a fluorescent blue emitter and a hole injection layer, wherein the hole injection layer comprises a first sub-layer consisting of metal complex of formula (II) and a second sub-layer consisting of organic matrix compound. The emission layer comprises 97 vol.-% emitter matrix compound EMC-6 and 3 vol.-% fluorescent blue emitter.

In comparative example 6, the first sub-layer comprises HAT-CN as a state-of-the-art hole injection material with a thickness of 3 nm. HAT-CN is free of metal complex. The second sub-layer comprises organic matrix compound OMC-6. The offset in HOMO level between the emitter matrix compound and the organic matrix compound is −0.03 eV. The operating voltage is over 10 V.

In comparative example 7, the first sub-layer comprises HAT-CN and the second sub-layer comprises organic matrix compound OMC-7. The offset in HOMO level between the emitter matrix compound and the organic matrix compound is 0.15 eV. The operating voltage is over 10 V.

In comparative example 8, the first sub-layer comprises HAT-CN and the second sub-layer comprises organic matrix compound OMC-10. The offset in HOMO level between the emitter matrix compound and the organic matrix compound is 0.17 eV. The operating voltage is over 10 V.

In Example 14, the first sub-layer comprises metal complex MC-29 with a thickness of 3 nm. The second sub-layer comprises organic matrix compound OMC-6. The offset in HOMO level between the emitter matrix compound and the organic matrix compound is −0.03 eV. The operating voltage is 4.0 V and thereby substantially improved over comparative example 6.

In Examples 15 to 17, the first sub-layer is the same as in Example 14. The second sub-layer comprises a range of organic matrix compounds with a HOMO level further away from vacuum level than OMC-6. The offset in HOMO level between the emitter matrix compound and the organic matrix compounds is in the range of 0 to 0.17 eV. In all examples, the operating voltage is substantially improved over comparative examples 6, 7 and 8.

In Examples 18 to 20, the first sub-layer comprises metal complex MC-27. MC-27 differs from MC-29 in the metal cation and ligand, see Table 2. The second sub-layer comprises a range of organic matrix compounds. The offset in HOMO level between the emitter matrix compound and the organic matrix compound is in the range of −0.03 to 0.15 eV. In all examples, the operating voltage is substantially improved over comparative examples 6, 7 and 8.

In Example 21, the first sub-layer comprises metal complex MC-30. MC-30 differs from MC-29 in the metal cation and ligand, see Table 2. The second sub-layer comprises OMC-7. The offset in HOMO level between the emitter matrix compound and the organic matrix compound is 0.15 eV. The operating voltage is 6.6 V and thereby improved over comparative example 7.

In comparative examples 9 to 11, the first sub-layer comprises HAT-CN as a state-of-the-art hole injection material with a thickness of 5 nm. The second sub-layer comprises a range of organic matrix compounds. The offset in HOMO level between the emitter matrix compound and the organic matrix compound is in the range of −0.03 to 0.17 eV. The operating voltage is over 10 V.

In Example 22, the first sub-layer comprises metal complex MC-29 with a thickness of 5 nm. The second sub-layer comprises organic matrix compound OMC-6. The offset in HOMO level between the emitter matrix compound and the organic matrix compound is −0.03 eV. The operating voltage is 4.0 V and thereby substantially improved over comparative example 9. The performance is comparable to Example 14.

In Examples 23 to 25, the first sub-layer is the same as in Example 22. The second sub-layer comprises various organic matrix compounds with a HOMO level further away from vacuum level than OMC-6. The offset in HOMO level between the emitter matrix compound and the organic matrix compound is in the range of 0 to 0.17 eV. In all examples, the operating voltage is substantially improved over comparative examples 9, 10 and 11.

In Examples 26 and 27, the first sub-layer comprises metal complex MC-27. MC-27 differs from MC-29 in the metal cation and ligand, see Table 2. The second sub-layer comprises various organic matrix compounds. The offset in HOMO level between the emitter matrix compound and the organic matrix compound is in the range of 0 to 0.15 eV. In all examples, the operating voltage is substantially improved over comparative examples 9, 10 and 11.

In Example 28, the first sub-layer comprises metal complex MC-30. MC-30 differs from MC-29 in the metal cation and ligand, see Table 2. The second sub-layer comprises OMC-7. The offset in HOMO level between the emitter matrix compound and the organic matrix compound is 0.15 eV. The operating voltage is 5.4 V and thereby improved over comparative example 10.

In summary, a substantial improvement in operating voltage has been obtained for OLEDs comprising a hole injection layer according to invention.

A reduction in operating voltage may be beneficial for reduced power consumption and improved battery life, in particular in mobile devices.

TABLE 7

Performance of OLEDs comprising a hole injection layer (HIL), wherein the hole injection layer comprises a first and a second sub-layer

| | Composition of first sub-layer | Thickness of first sub-layer [nm] | Composition of second sub-layer | HOMO level (OMC) in second sub-layer [eV] | Thickness of second sub-layer [nm] | Composition of HTL | HOMO level (EMC) − HOMO level (OMC) [eV] | U at 10 mA/$cm^2$ [V] |
|---|---|---|---|---|---|---|---|---|
| Comparative example 6 | HAT-CN | 3 | OMC-6 | −5.10 | 7 | OMC-6 | −0.03 | >10 |
| Comparative example 7 | HAT-CN | 3 | OMC-7 | −5.28 | 7 | OMC-7 | 0.15 | >10 |
| Comparative example 8 | HAT-CN | 3 | OMC-10 | −5.30 | 7 | OMC-10 | 0.17 | >10 |
| Example 14 | MC-29 | 3 | OMC-6 | −5.10 | 7 | OMC-6 | −0.03 | 4.0 |
| Example 15 | MC-29 | 3 | OMC-5 | −5.13 | 7 | OMC-5 | 0 | 4.4 |

TABLE 7-continued

Performance of OLEDs comprising a hole injection layer (HIL), wherein the hole injection layer comprises a first and a second sub-layer

| | Composition of first sub-layer | Thickness of first sub-layer [nm] | Composition of second sub-layer | HOMO level (OMC) in second sub-layer [eV] | Thickness of second sub-layer [nm] | Composition of HTL | HOMO level (EMC) − HOMO level (OMC) [eV] | U at 10 mA/cm$^2$ [V] |
|---|---|---|---|---|---|---|---|---|
| Example 16 | MC-29 | 3 | OMC-7 | −5.28 | 7 | OMC-7 | 0.15 | 4.5 |
| Example 17 | MC-29 | 3 | OMC-10 | −5.30 | 7 | OMC-10 | 0.17 | 4.6 |
| Example 18 | MC-27 | 3 | OMC-6 | −5.10 | 7 | OMC-6 | −0.03 | 4.1 |
| Example 19 | MC-27 | 3 | OMC-5 | −5.13 | 7 | OMC-5 | 0 | 4.7 |
| Example 20 | MC-27 | 3 | OMC-7 | −5.28 | 7 | OMC-7 | 0.15 | 4.4 |
| Example 21 | MC-30 | 3 | OMC-7 | −5.28 | 7 | OMC-7 | 0.15 | 6.6 |
| Comparative example 9 | HAT-CN | 5 | OMC-6 | −5.10 | 5 | OMC-6 | −0.03 | >10 |
| Comparative example 10 | HAT-CN | 5 | OMC-7 | −5.28 | 5 | OMC-7 | 0.15 | >10 |
| Comparative example 11 | HAT-CN | 5 | OMC-10 | −5.30 | 5 | OMC-10 | 0.17 | >10 |
| Example 22 | MC-29 | 5 | OMC-6 | −5.10 | 5 | OMC-6 | −0.03 | 4.0 |
| Example 23 | MC-29 | 5 | OMC-5 | −5.13 | 5 | OMC-5 | 0 | 4.2 |
| Example 24 | MC-29 | 5 | OMC-7 | −5.28 | 5 | OMC-7 | 0.15 | 4.4 |
| Example 25 | MC-29 | 5 | OMC-10 | −5.30 | 5 | OMC-10 | 0.17 | 4.4 |
| Example 26 | MC-27 | 5 | OMC-5 | −5.13 | 5 | OMC-5 | 0 | 4.9 |
| Example 27 | MC-27 | 5 | OMC-7 | −5.28 | 5 | OMC-7 | 0.15 | 4.6 |
| Example 28 | MC-30 | 5 | OMC-7 | −5.28 | 5 | OMC-7 | 0.15 | 5.4 |

It is apparent that the devices according to the invention show a much better performance than the comparative devices.

The particular combinations of elements and features in the above detailed embodiments are exemplary only; the interchanging and substitution of these teachings with other teachings in this and the patents/applications incorporated by reference are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. The invention's scope is defined in the following claims and the equivalents thereto. Furthermore, reference signs used in the description and claims do not limit the scope of the invention as claimed.

The invention claimed is:

1. An organic electronic device comprising an anode layer, a cathode layer, at least one emission layer (EML) and at least one hole injection layer (HIL), wherein the hole injection layer is arranged between the anode layer and the at least one emission layer; wherein the hole injection layer comprises an organic matrix compound (OMC) and a metal complex, wherein the metal complex has the formula (II):

$$M^{n\oplus}(L^{\ominus})_n \quad \text{(II)},$$

wherein

M is a metal ion, n is the valency of M, wherein n is an integer from 1 to 4

L is a ligand; and the at least one emission layer comprises at least one emitter matrix compound (EMC), wherein the HOMO level of the emitter matrix compound (EMC) and the HOMO level of the organic matrix compound (OMC) fulfills the following equation:

$$-0.24\text{ eV}<[\text{HOMO level (EMC)}-\text{HOMO level (OMC)}]\leq 0.8\text{ eV};$$

wherein the organic matrix compound (OMC) of the hole injection layer and/or the emitter matrix compound (EMC) has a molecular weight Mw of ≥400 and ≤2000 g/mol.

2. The organic electronic device of claim 1, wherein the organic matrix compound (OMC) and the emitter matrix compound (EMC) have the formula (I):

$$(Ar^1)_k\text{-}(Ar^2)_m\text{-}Ar^3\text{-}(Ar^4)_p\text{-}(Ar^5)_q\text{-}(Ar^6)_r \quad \text{(I)},$$

wherein k, m, q, r are independently from each other 0, 1 or 2, p is 1, 2 or 3, wherein $2\leq k+m+q+r+p\leq 11$, $Ar^1$ to $Ar^6$ are independently selected from a substituted or unsubstituted unsaturated 5- to 7-member ring of a heterocycle, a substituted or unsubstituted $C_6$ to $C_{30}$ aryl or a substituted or unsubstituted $C_3$ to $C_{30}$ heteroaryl, a substituted or unsubstituted fluorene, or a fused ring system comprising 2 to 6 substituted or unsubstituted 5- to 7-member rings and the rings are selected from the group comprising (i) unsaturated 5- to 7-member ring of a heterocycle, (ii) 5- to 6-member of an aromatic heterocycle, (iii) unsaturated 5- to 7-member ring of a non-heterocycle, (iv) 6-member ring of an aromatic non-heterocycle;

wherein the substituents are selected from the group H, D, $C_1$ to $C_{12}$ alkyl, unsubstituted $C_6$ to $C_{18}$ aryl, unsubstituted $C_3$ to $C_{18}$ heteroaryl, a fused ring system comprising 2 to 6 unsubstituted 5- to 7-member rings and the rings are selected from the group comprising unsaturated 5- to 7-member ring of a heterocycle, 5- to 6-member of an aromatic heterocycle, unsaturated 5- to 7-member ring of a non-heterocycle, and 6-member ring of an aromatic non-heterocycle;

and wherein the organic matrix compound (OMC) and the emitter matrix compound (EMC) are selected the same or selected different.

3. The organic electronic device according to claim 1, wherein the hole injection layer is non-emissive.

4. The organic electronic device according to claim 1, wherein the hole injection layer is arranged adjacent to the anode layer, alternatively in direct contact with the anode layer.

5. The organic electronic device according to claim 1, wherein the HOMO level of the organic matrix compound (OMC) is further away from vacuum level than the HOMO level of N4,N4'''-di(naphthalen-1-yl)-N4,N4'''-diphenyl-[1, 1':4',1'': 4'',1'''-quaterphenyl]-4,4'''-diamine when determined under the same conditions.

6. The organic electronic device according to claim 1, wherein the organic matrix compound (OMC) fulfills the following equation:

$$-7\ eV < HOMO\ level\ (OMC) < -4.85\ eV;$$ wherein the HOMO level is calculated with the program package TURBOMOLE V6.5.

7. The organic electronic device according to claim 1, wherein the organic matrix compound (OMC) and the emitter matrix compound (EMC) have the formula (I):

$$(Ar^1)_k-(Ar^2)_m-Ar^3-(Ar^4)_p-(Ar^5)_q-(Ar^6)_r \quad (I),$$

wherein k, m, q, r are independently from each other 0, 1 or 2, p is 1, 2 or 3, wherein $2 \leq k+m+q+r+p \leq 11$, $Ar^1$ to $Ar^6$ are independently selected from substituted or unsubstituted biphenylene, substituted or unsubstituted fluorene, substituted or unsubstituted naphthalene, substituted or unsubstituted anthracene, substituted or unsubstituted phenanthrene, substituted or unsubstituted pyrene, substituted or unsubstituted perylene, substituted or unsubstituted triphenylene, substituted or unsubstituted tetracene, substituted or unsubstituted tetraphene, substituted or unsubstituted dibenzofurane, substituted or unsubstituted dibenzothiophene, substituted or unsubstituted xanthene, substituted or unsubstituted carbazole, substituted or unsubstituted azepine, substituted or unsubstituted dibenzo[b,f]azepine, 9,9'-spirobi[fluorene], substituted or unsubstituted spiro [fluorene-9,9'-xanthene], substituted or unsubstituted 9,14-dihydrodibenzo[2,3:6,7]azepino[4,5-b]indole, or a substituted or unsubstituted aromatic fused ring system comprising at least three substituted or unsubstituted aromatic rings selected from the group comprising substituted or unsubstituted non-hetero, substituted or unsubstituted hetero 5-member rings, substituted or unsubstituted 6-member rings or substituted or unsubstituted 7-member rings, substituted or unsubstituted fluorene, or a fused ring system comprising 2 to 6 substituted or unsubstituted 5- to 7-member rings and the rings are selected from the group comprising (i) unsaturated 5- to 7-member ring of a heterocycle, (ii) 5- to 6-member of an aromatic heterocycle, (iii) unsaturated 5- to 7-member ring of a non-heterocycle, (iv) 6-member ring of an aromatic non-heterocycle, wherein the substituents are selected from the group H, D, $C_1$ to $C_{12}$ alkyl, unsubstituted $C_6$ to $C_{18}$ aryl, unsubstituted $C_3$ to $C_{18}$ heteroaryl, a fused ring system comprising 2 to 6 unsubstituted 5- to 7-member rings and the rings are selected from the group comprising unsaturated 5- to 7-member ring of a heterocycle, 5- to 6-member of an aromatic heterocycle, unsaturated 5- to 7-member ring of a non-heterocycle, and 6-member ring of an aromatic non-heterocycle;

and wherein the organic matrix compound (OMC) and the emitter matrix compound (EMC) are selected the same or selected different.

8. The organic electronic device according to claim 1, wherein M is selected from the group comprising a metal ion wherein the corresponding metal has an electronegativity value according to Allen of less than 2.4, an alkali, alkaline earth, rare earth or transition metal, a metal with an atomic mass$\geq$24 Da, or a metal with an atomic mass$\geq$24 Da and M has an oxidation number$\geq$2.

9. The organic electronic device according to claim 1, wherein the metal complex has a molecular weight Mw of $\geq$287 and $\leq$2000 g/mol.

10. The organic electronic device according to claim 1, wherein L is selected from a group comprising at least three carbon atoms, alternatively at least four carbon atoms, or at least two oxygen atoms or one oxygen and one nitrogen atom, two to four oxygen atoms, two to four oxygen atoms and zero to two nitrogen atoms, or at least one or more groups selected from halogen, F, CN, substituted or unsubstituted $C_1$ to $C_6$ alkyl, substituted or unsubstituted $C_1$ to $C_6$ alkoxy, alternatively two or more groups selected from halogen, F, CN, substituted or unsubstituted $C_1$ to $C_6$ alkyl, substituted or unsubstituted $C_1$ to $C_6$ alkoxy, at least one or more groups selected from halogen, F, CN, substituted $C_1$ to $C_6$ alkyl, substituted $C_1$ to $C_6$ alkoxy, alternatively two or more groups selected from halogen, F, CN, perfluorinated $C_1$ to $C_6$ alkyl, perfluorinated $C_1$ to $C_6$ alkoxy, one or more groups selected from substituted or unsubstituted $C_1$ to $C_6$ alkyl, substituted or unsubstituted $C_6$ to $C_{12}$ aryl, or substituted or unsubstituted $C_3$ to $C_{12}$ heteroaryl, wherein the substituents are selected from D, $C_6$ aryl, $C_3$ to $C_9$ heteroaryl, $C_1$ to $C_6$ alkyl, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkyl, partially or perdeuterated $C_1$ to $C_6$ alkoxy, $COR^6$, $COOR^6$, halogen, F or CN;

wherein $R^6$ is selected from $C_6$ aryl, $C_3$ to $C_9$ heteroaryl, $C_1$ to $C_6$ alkyl, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkyl, partially or perdeuterated $C_1$ to $C_6$ alkoxy.

11. The organic electronic device according to claim 1, wherein the metal complex according to formula (II) is non-emissive.

12. The organic electronic device according to claim 1, wherein the organic matrix compound (OMC) and the emitter matrix compound (EMC) have the formula (I):

$$(Ar^1)_k-(Ar^2)_m-Ar^3-(Ar^4)_p-(Ar^5)_q-(Ar^6)_r \quad (1),$$

wherein k, m, q, r are independently from each other 0, 1 or 2, p is 1, 2 or 3, wherein $2 \leq k+m+q+r+p \leq 11$, $Ar^1$ to $Ar^6$ are independently selected from substituted or unsubstituted unsaturated 5- to 7-member ring of a heterocycle, substituted or unsubstituted $C_6$ to $C_{30}$ aryl, substituted or unsubstituted $C_3$ to $C_{30}$ heteroaryl, a substituted or unsubstituted fluorene, or a fused ring system comprising 2 to 6 substituted or unsubstituted 5- to 7-member rings and the rings are selected from the group comprising (i) unsaturated 5- to 7-member ring of a heterocycle, (ii) 5- to 6-member of an aromatic heterocycle, (iii) unsaturated 5- to 7-member ring of a non-heterocycle, (iv) 6-member ring of an aromatic non-heterocycle;

$Ar^2$ if k=1, $Ar^3$, $Ar^4$ if q=1, $Ar^5$ if r=1:

are independently selected from substituted or unsubstituted unsaturated 5- to 7-member ring of a heterocycle, substituted or unsubstituted $C_6$ to $C_{30}$ arylene, substituted or unsubstituted $C_3$ to $C_{30}$ heteroarylene, substituted or unsubstituted biphenylene, substituted or unsubstituted fluorene, substituted or unsubstituted naphthalene, substituted or unsubstituted anthracene, substituted or unsubstituted phenanthrene, substituted or unsubstituted pyrene, substituted or unsubstituted perylene, substituted or unsubstituted triphenylene, substituted or unsubstituted tetracene, substituted or unsubstituted tetraphene, substituted or unsubstituted dibenzofurane, substituted or unsubstituted dibenzothiophene, substituted or unsubstituted xanthene, substituted or unsubstituted carbazole, substituted or unsubstituted azepine, substituted or unsubstituted dibenzo[b,f]azepine, 9,9'-spirobi[fluorene], substituted or unsubstituted spiro[fluorene-9,9'-xanthene], substituted or unsubstituted 9,14-dihydrodibenzo[2,3:6,7]azepino[4,5-b]indole, or a substituted or unsubstituted aromatic fused ring system comprising at least three substituted or unsubstituted aromatic rings selected from the group comprising substituted or unsubstituted non-hetero, substituted or unsubstituted hetero 5-member rings, substituted or unsubstituted 6-member rings or substituted or unsubstituted 7-member rings;

$Ar^2$ if k=0, $Ar^3$ if m=0 and k=0, $Ar^4$ if q and r=0, $Ar^5$ if r=0:

are independently selected from substituted or unsubstituted unsaturated 5- to 7-member ring of a heterocycle, substituted or unsubstituted $C_6$ to $C_{30}$ aryl, substituted or unsubstituted $C_3$ to $C_{30}$ heteroaryl, substituted or unsubstituted biphenyl, substituted or unsubstituted fluorenyl, substituted or unsubstituted naphthalenyl, substituted or unsubstituted anthracenyl, substituted or unsubstituted phenanthrenyl, substituted or unsubstituted pyrenyl, substituted or unsubstituted perylenyl, substituted or unsubstituted triphenylenyl, substituted or unsubstituted tetracenyl, substituted or unsubstituted tetraphenyl, substituted or unsubstituted dibenzofuranyl, substituted or unsubstituted dibenzothiophenyl, substituted or unsubstituted xanthenyl, substituted or unsubstituted carbazole, substituted or unsubstituted azepine, substituted or unsubstituted dibenzo[b,f]azepine, 9,9'-spirobi[fluorenyl], substituted or unsubstituted spiro[fluorenyl-9,9'-xanthene], substituted or unsubstituted 9,14-dihydrodibenzo[2,3:6,7]azepino[4,5-b]indole, or a substituted or unsubstituted aromatic fused ring system comprising at least three substituted or unsubstituted aromatic rings selected from the group comprising substituted or unsubstituted non-hetero, substituted or unsubstituted hetero 5-member rings, substituted or unsubstituted 6-member rings or substituted or unsubstituted 7-member rings;

wherein the substituents are selected from the group H, D, $C_1$ to $C_{12}$ alkyl, unsubstituted $C_6$ to $C_{18}$ aryl, unsubstituted $C_3$ to $C_{18}$ heteroaryl, a fused ring system comprising 2 to 6 unsubstituted 5- to 7-member rings and the rings are selected from the group comprising unsaturated 5- to 7-member ring of a heterocycle, 5- to 6-member of an aromatic heterocycle, unsaturated 5- to 7-member ring of a non-heterocycle, and 6-member ring of an aromatic non-heterocycle;

and wherein the organic matrix compound (OMC) and the emitter matrix compound (EMC) are selected the same or selected different, and wherein the metal complex has the formula (II).

13. The organic electronic device according to claim 1, wherein the organic matrix compound (OMC) and the emitter matrix compound (EMC) are selected from the group of compounds comprising at least ≥1 to ≤6 substituted or unsubstituted aromatic fused ring systems comprising heteroaromatic rings, at least ≥1 to ≤3 substituted or unsubstituted unsaturated 5- to 7-member ring of a heterocycle, at least ≥2 to ≤5 substituted or unsubstituted aromatic fused ring systems comprising heteroaromatic rings, at least ≥1 to ≤3 substituted or unsubstituted unsaturated 5- to 7-member ring of a heterocycle, at least 3 or 4 substituted or unsubstituted aromatic fused ring systems comprising heteroaromatic rings, at least ≥1 to ≤3 substituted or unsubstituted unsaturated 5- to 7-member ring of a heterocycle, at least an aromatic fused ring systems comprising heteroaromatic rings are unsubstituted, or at least ≥1 to ≤3 unsubstituted unsaturated 5- to 7-member ring of a heterocycle.

14. The organic electronic device according to claim 1, wherein the organic matrix compound (OMC) and the emitter matrix compound (EMC) are selected from the group of compounds comprising a substituted or unsubstituted aromatic fused ring systems with at least ≥2 to ≤6-fused aromatic rings selected from the group comprising substituted or unsubstituted non-hetero aromatic rings, substituted or unsubstituted hetero 5-member rings, substituted or unsubstituted 6-member rings, substituted or unsubstituted unsaturated 5- to 7-member ring of a heterocycle, an unsubstituted aromatic fused ring systems with at least ≥2 to ≤6 fused aromatic rings selected from the group comprising unsubstituted non-hetero aromatic rings, unsubstituted hetero 5-member rings, unsubstituted 6-member rings, or unsubstituted unsaturated 5- to 7-member ring of a heterocycle.

15. The organic electronic device according to claim 1, wherein the organic matrix compound (OMC) and the emitter matrix compound (EMC) are selected from the group of compounds comprising at least ≥1 to ≤6 substituted or unsubstituted aromatic fused ring systems with at least one unsaturated 5-member ring, at least ≥1 to ≤6 substituted or unsubstituted aromatic fused ring systems with at least one unsaturated 6-member ring, at least ≥1 to ≤6 substituted or unsubstituted aromatic fused ring systems with at least one unsaturated 7-member ring, at least ≥1 to ≤6 substituted or unsubstituted aromatic fused ring systems with at least one unsaturated 5-member ring comprises at least 1 to 3 hetero-atoms or at least ≥1 to ≤6 substituted or unsubstituted aromatic fused ring systems with at least one unsaturated 7-member ring comprises at least 1 to 3 hetero-atoms.

16. The organic electronic device according to claim 1, wherein for the organic matrix compound (OMC) and the emitter matrix compound (EMC) comprise the hetero-atom is selected from the group comprising O, S, N, B, P or Si.

17. The organic electronic device according to claim 1, wherein the organic matrix compound (OMC) and the emitter matrix compound (EMC) is free of hetero-atoms which are not part of an aromatic ring or part of an unsaturated 7-member-ring.

18. The organic electronic device according to claim 1, wherein the organic matrix compound (OMC) and the emitter matrix compound (EMC) are selected from compounds comprising at least ≥6 to ≤12 aromatic rings;

at least ≥4 to ≤11 non-hetero aromatic rings;

at least ≥1 to ≤4 hetero aromatic 5-member-rings;

at least 1 or 2 unsaturated 5- to 7-member-ring of a heterocycle, at least ≥6 to ≤12 aromatic rings, wherein therefrom at least ≥4 to ≤11 are non-hetero aromatic rings and at least ≥1 to ≤4 aromatic rings are hetero aromatic rings, wherein the total number of non-hetero aromatic rings and hetero aromatic rings in total does not exceed 12 aromatic rings, at least ≥6 to ≤12 aromatic rings, wherein therefrom at least ≥4 to ≤11 are non-hetero aromatic rings, and at least ≥1 to ≤4 aromatic rings are hetero aromatic rings, wherein the total number of non-hetero aromatic rings and hetero aromatic rings in total does not exceed 12 aromatic rings; and the hole transport compound or the hole transport compound according to formula I is selected from the group of compounds comprising at least ≥1 to ≤4 hetero aromatic 5-member-rings, or at least 1 or 2 unsaturated 5- to 7-member-ring of a heterocycle.

19. The organic electronic device according to claim 1, wherein for formula (I):

$Ar^3$ is selected from D1 to D17:

(D1)

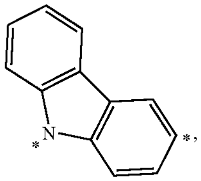

(D2)

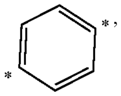

-continued (D3)

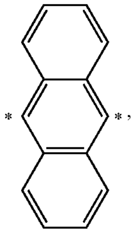

(D4)

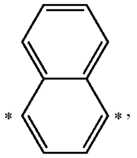

(D5)

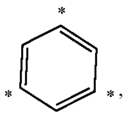

(D6)

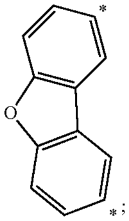

(D7)

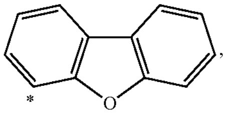

(D8)

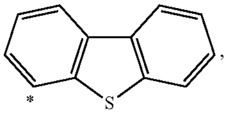

(D9)

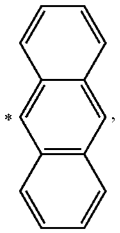

(D10)

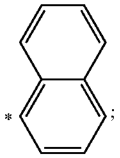

-continued (D11)

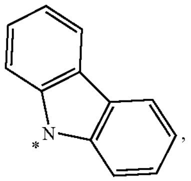

(D12)

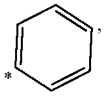

(D13)

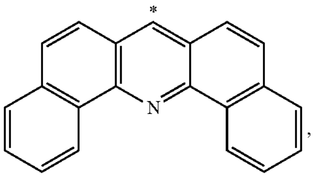

(D14)

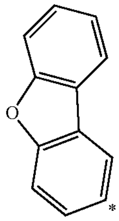

(D15)

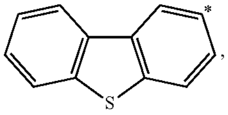

(D16)

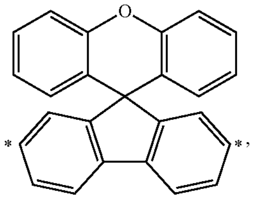

(D17)

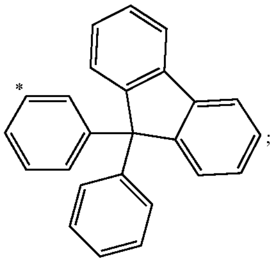

$Ar^1$ is selected from D7 to D15 and D17, if m>0 and k>0, or is selected from D7 to D15 and D17, if k>0 and m=0, or is selected from D1 to D6, if k>1;

$Ar^2$ is selected from D1 to D6, if m>0 and k>0; or is selected from D7 to D15 and D17, if m>0 and k=0;

$Ar^4$ is selected from D1 to D6, if q>0, or is selected from D1 to D6, if q=0 and r>0; or is selected from D7 to D15 and D17, if q and r=0;

$Ar^5$ is selected from D1 to D6, if q>0 and r>0, or is selected from D7 to D15 and D17, if q>0 and r=0;

$Ar^6$ is selected from D7 to D15 and D17, if r>0, q>0, or is selected from D7 to D15 and D17, if r>0, q=0, or is selected from D1 to D6, if r>1.

20. The organic electronic device according to claim 1, wherein the organic matrix compound (OMC) or the emitter matrix compound (EMC) according to formula (I) is selected from F1 to F13:

(F1)

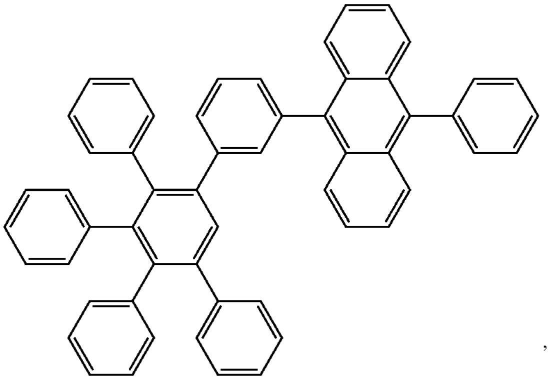

, (F2)

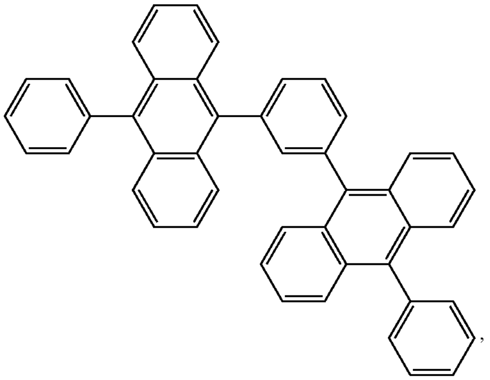

(F3)

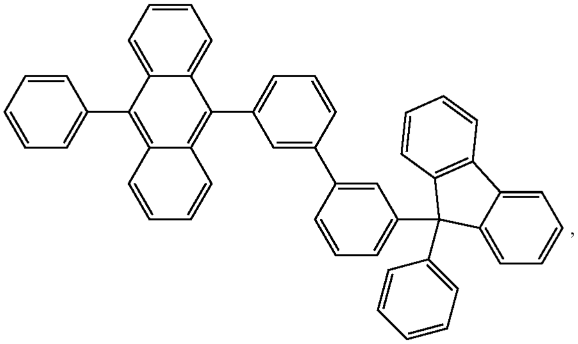

(F4)

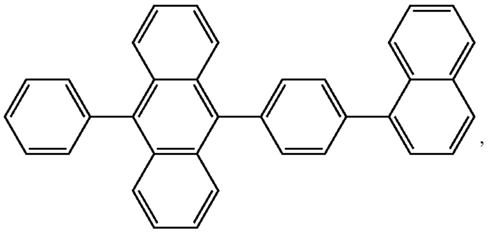

-continued
(F5)
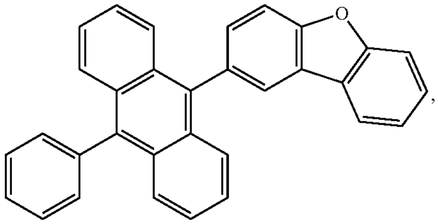
,
(F6)
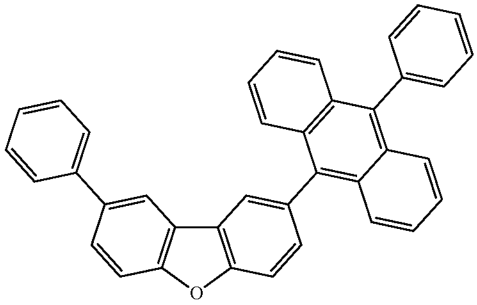
,
(F7)
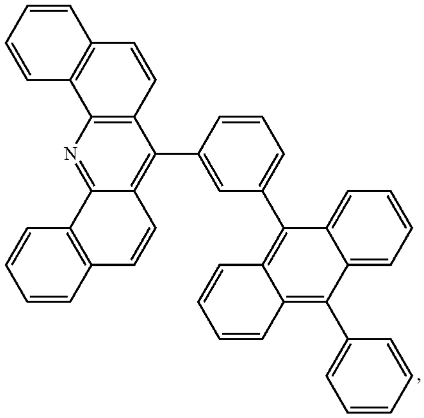
,
(F8)
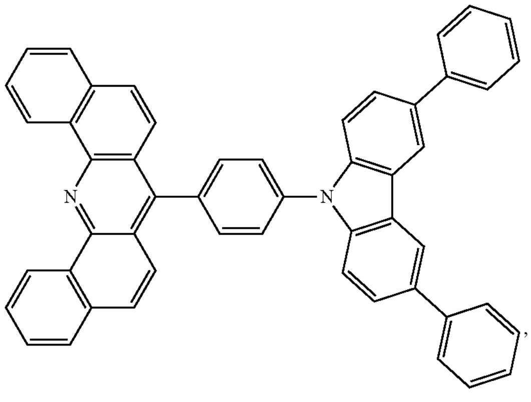
,
(F9)
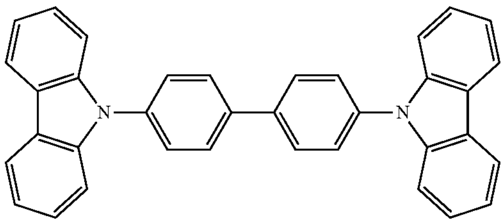
,
-continued
(F10)
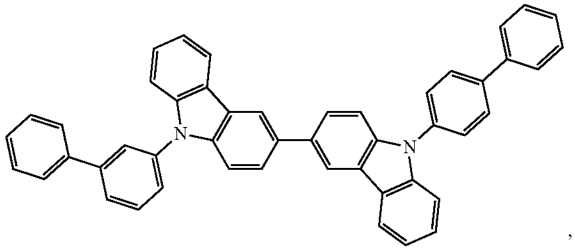
,
(F11)
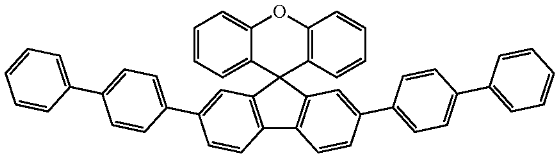
,
(F12)
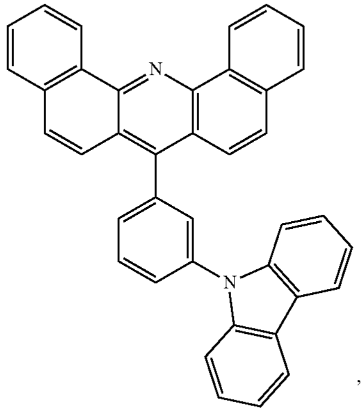
,
(F13)
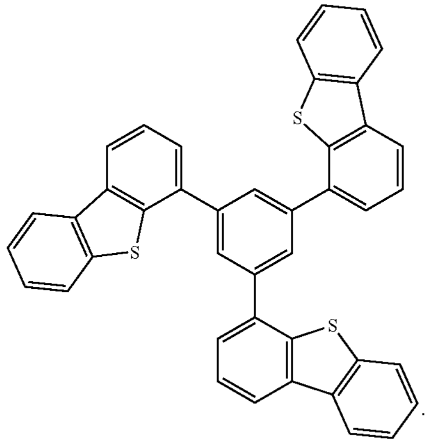
.
21. The organic electronic device according to claim 1, wherein n is an integer from 1 to 4.

22. The organic electronic device according to claim 1, wherein the metal complex is selected from the following formulas (IIa) to (IIe):

(IIa)

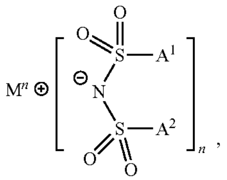

(IIb)

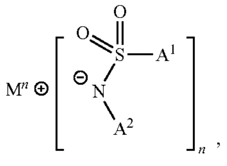

(IIc)

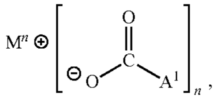

(IId)

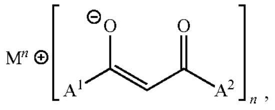

(IIe)

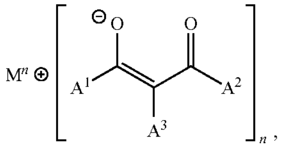

wherein

M is a metal ion;

n is the valency of M, wherein n is an integer from 1 to 4;

$A^1$ and $A^2$ are independently selected from substituted or unsubstituted $C_1$ to $C_{12}$ alkyl, substituted or unsubstituted $C_6$ to $C_{12}$ aryl, substituted or unsubstituted $C_3$ to $C_{12}$ heteroaryl;

A is selected from H, D, substituted or unsubstituted $C_1$ to $C_{12}$ alkyl, substituted or unsubstituted $C_6$ to $C_{12}$ aryl, substituted or unsubstituted $C_3$ to $C_{12}$ heteroaryl;

wherein the substituents of $A^1$, $A^2$ or $A^3$ are independently selected from D, $C_6$ aryl, $C_3$ to $C_9$ heteroaryl, $C_1$ to $C_6$ alkyl, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkyl, partially or perdeuterated $C_1$ to $C_6$ alkoxy, $COR^1$, $COOR^1$, halogen, F or CN, wherein $R^1$ is selected from $C_6$ aryl, $C_3$ to $C_9$ heteroaryl, $C_1$ to $C_6$ alkyl, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkyl, partially or perdeuterated $C_1$ to $C_6$ alkoxy.

23. The organic electronic device according to claim 22, wherein at least one of $A^1$, $A^2$ and $A^3$ comprises a substituent, wherein at least one of the substituents of $A^1$, $A^2$ and $A^3$ is independently selected from $C_3$ to $C_9$ heteroaryl, $C_1$ to $C_6$ alkoxy, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkoxy, $COR^1$, $COOR^1$, halogen, F or CN.

24. The organic electronic device according to claim 1, wherein L is independently selected from G1 to G64:

(G1)

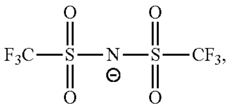

(G2)

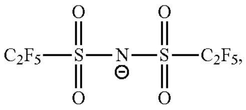

(G3)

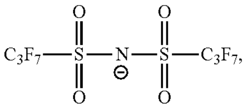

(G4)

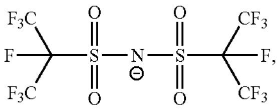

(G5)

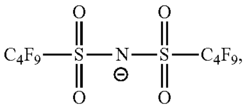

(G6)

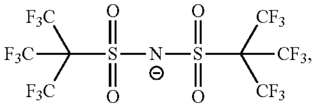

(G7)

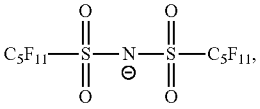

(G8)

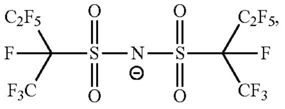

(G9)

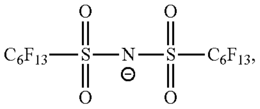

(G10)

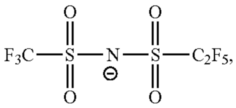

(G11)

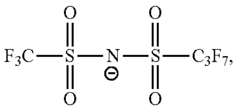

-continued
(G12)
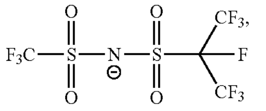
(G13)
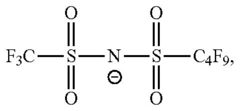
(G14)
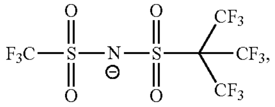
(G15)
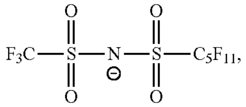
(G16)
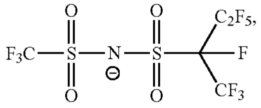
(G17)
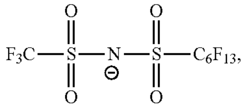
(G18)
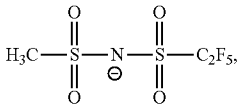
(G19)
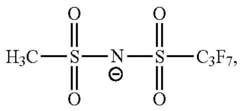
(G20)
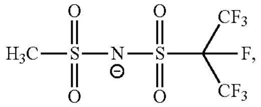
(G21)
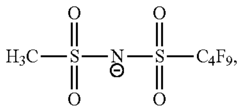
(G22)
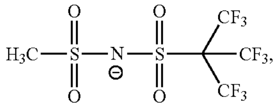
(G23)
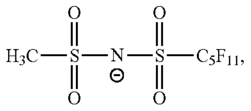
(G24)
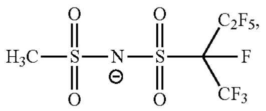
-continued
(G25)
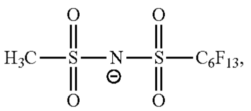
(G26)
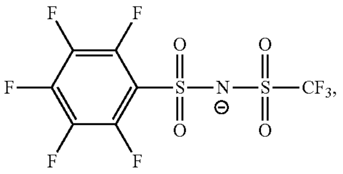
(G27)
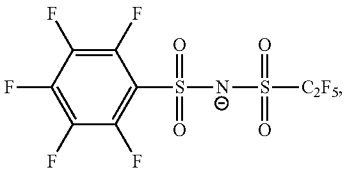
(G28)
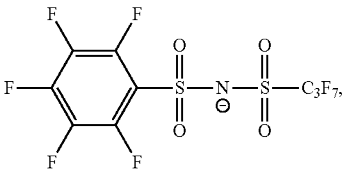
(G29)
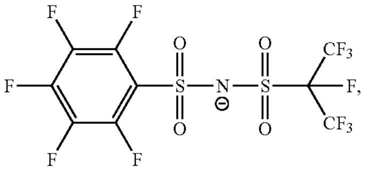
(G30)
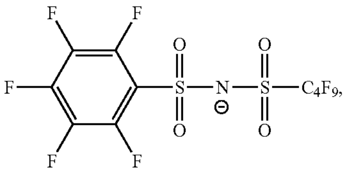
(G31)
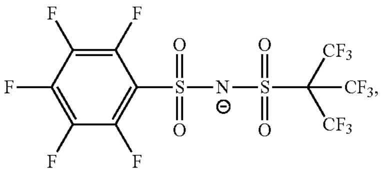
(G32)
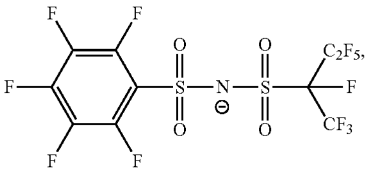
(G33)
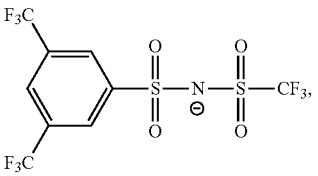

-continued
(G34)
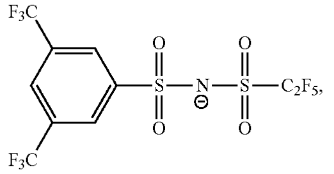
(G35)
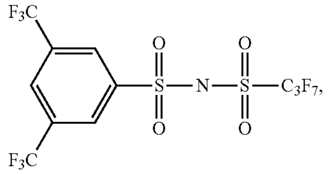
(G36)
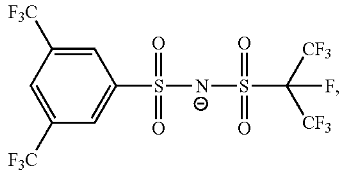
(G37)
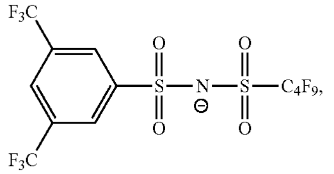
(G38)
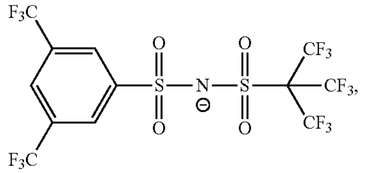
(G39)
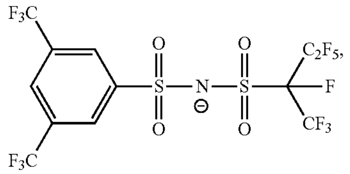
(G40)
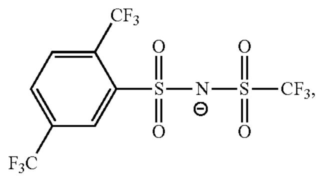
(G41)
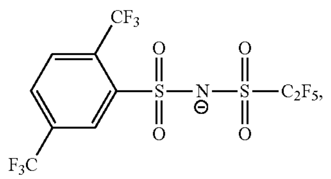
-continued
(G42)
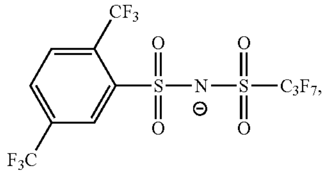
(G43)
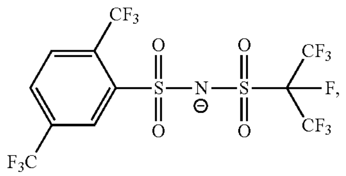
(G44)
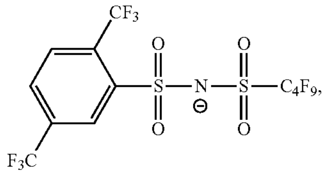
(G45)
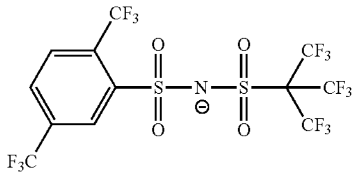
(G46)
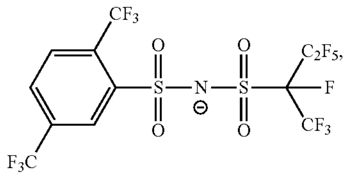
(G47)
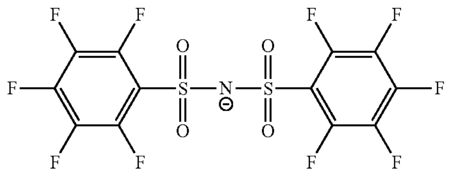
(G48)
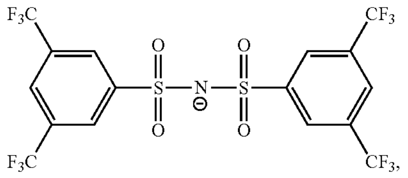
(G49)
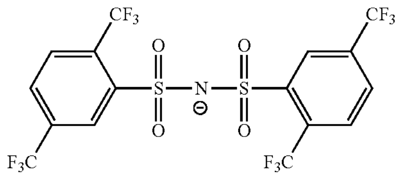

-continued (G50)

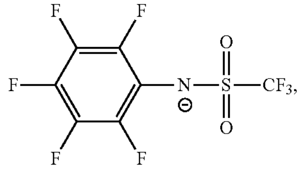

(G51)

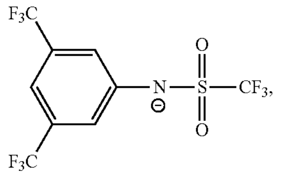

(G52)

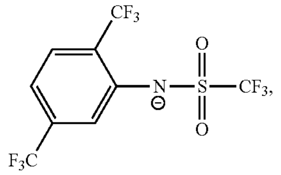

(G53)

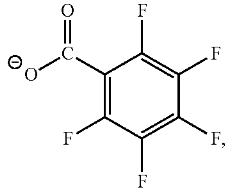

(G54)

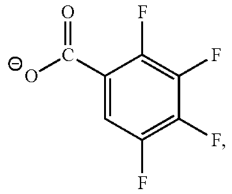

(G55)

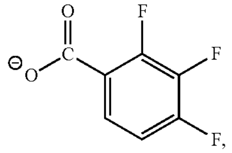

(G56)

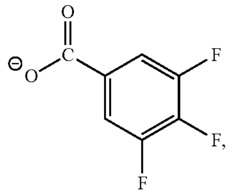

(G57)

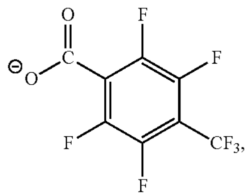

-continued (G58)

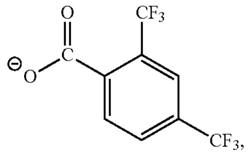

(G59)

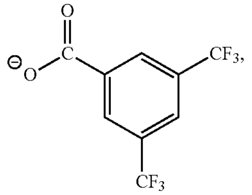

(G60)

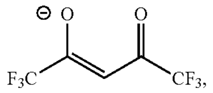

(G61)

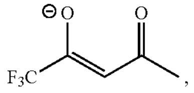

(G62)

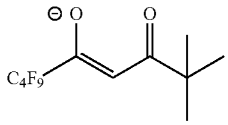

(G63)

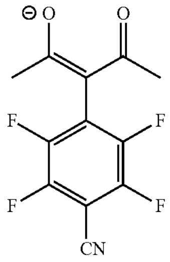

(G64)

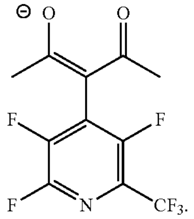

25. The organic electronic device according to claim 1, wherein the hole injection layer comprises a first sub-layer comprising the metal complex of formula (II) and a second sub-layer comprising the organic matrix compound (OMC), wherein the first sub-layer is arranged closer to the anode layer and the second sub-layer is arranged closer to the at least one emission layer.

26. The organic electronic device according to claim 1, wherein the hole injection layer comprises a first sub-layer comprising the metal complex of formula (II) and a second sub-layer comprising the organic matrix compound (OMC) and the metal complex, wherein the first sub-layer is arranged closer to the anode layer and the second sub-layer is arranged closer to the at least one emission layer.

27. The organic electronic device according to claim 25, wherein the organic electronic device further comprises a hole transport layer, wherein the hole transport layer is arranged between the hole injection layer and the at least one emission layer.

28. The organic electronic device according to claim 1, wherein the hole transport layer comprises an organic matrix compound (OMC), wherein the organic matrix compound (OMC) in the hole injection layer and hole transport layer is selected different or selected the same.

29. The organic electronic device according to claim 1, wherein the hole injection layer and hole transport layer comprise an organic matrix compound (OMC) and the at least one emission layer comprises an emitter matrix compound (EMC) of formula (I), wherein in formula (I) the $Ar^3$ group is selected the same.

30. The organic electronic device according to claim 1, wherein the organic electronic device is a light emitting device or a display device.

* * * * *